United States Patent
Takaishi

(10) Patent No.: US 8,415,741 B2
(45) Date of Patent: Apr. 9, 2013

(54) HIGH VOLTAGE VERTICAL CHANNEL TRANSISTORS

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/253,408

(22) Filed: Oct. 5, 2011

(65) Prior Publication Data

US 2012/0025324 A1    Feb. 2, 2012

Related U.S. Application Data

(62) Division of application No. 12/238,593, filed on Sep. 26, 2008, now Pat. No. 8,154,076.

(30) Foreign Application Priority Data

Sep. 28, 2007 (JP) ................. 2007-254172

(51) Int. Cl.
 H01L 29/66 (2006.01)
 H01L 23/48 (2006.01)
 H01L 23/52 (2006.01)
 H01L 29/40 (2006.01)

(52) U.S. Cl.
 USPC .................... 257/331; 257/779; 257/E29.275

(58) Field of Classification Search .................. 257/331, 257/776, E29.274, E29.275
 See application file for complete search history.

(56) References Cited

U.S. PATENT DOCUMENTS

| 5,466,961 | A | 11/1995 | Kikuchi et al. |
| 6,373,099 | B1* | 4/2002 | Kikuchi et al. ............... 257/331 |
| 6,433,382 | B1* | 8/2002 | Orlowski et al. ............ 257/315 |
| 2005/0116265 | A1 | 6/2005 | Inoue et al. |
| 2006/0043455 | A1* | 3/2006 | Batra et al. .................... 257/314 |
| 2009/0209092 | A1 | 8/2009 | Sonsky et al. |

FOREIGN PATENT DOCUMENTS

JP    05-136374 A    6/1993

* cited by examiner

*Primary Examiner* — Daniel Luke
(74) *Attorney, Agent, or Firm* — Sughrue Mion, PLLC

(57) ABSTRACT

A semiconductor device includes low voltage and high voltage transistors over a substrate. The low voltage transistor is configured by at least one unit transistor. The high voltage transistor is configured by a greater number of the unit transistors than the at least one unit transistor that configures the low voltage transistor. Each of the unit transistors may include a vertically extending portion of semiconductor providing a channel region and having a uniform height, a gate insulating film extending along a side surface of the vertically extending portion of semiconductor, a gate electrode separated by the gate insulating film from the vertically extending portion of semiconductor, and upper and lower diffusion regions being respectively disposed near the top and bottom of the vertically extending portion of semiconductor. The greater number of the unit transistors are connected in series to each other and have gate electrodes eclectically connected to each other.

16 Claims, 31 Drawing Sheets

RELATED ART

HIGH VOLTAGE VERTICAL CHANNEL TRANSISTORS

CROSS REFERENCE TO RELATED APPLICATIONS

This application is a divisional of U.S. patent application Ser. No. 12/238,593, filed Sep. 26, 2008, which claims priority to Japanese Patent Application No. 2007-254172, filed Sep. 28, 2007, the contents of all of which are incorporated herein by reference.

BACKGROUND OF THE INVENTION

1. Field of the Invention

The present invention generally relates to a semiconductor device and a method of forming the same. More specifically, the present invention relates to a semiconductor device including a vertical surround gate transistor structure and a method of forming the same as well as a data processing system including the semiconductor device.

Priority is claimed on Japanese Patent Application No. 2007-254172, filed Sep. 28, 2007, the content of which is incorporated herein by reference.

2. Description of the Related Art

In recent years, there has been progressed high density integration and high performance of a semiconductor device with shrinkage of transistors that are integrated therein. Further shrinkage of a transistor is difficult. Shrinkage of a transistor may needs for further reduction in the gate length L of the transistor, thereby causing remarkable shot channel effects, and making it difficult to control the threshold voltage of the transistor. This may also cause the increase of S-value of the transistor, which needs higher threshold voltage in view of suppressing OFF-current of the transistor. Increase of the threshold voltage of the transistor due to the increase of S-value makes it difficult to realize or implement a semiconductor device that needs to operate at lower voltage. Shallower diffusion regions performing as source and drain may be effective to reduce the short channel effects, but will increase the resistance of the source and drain, thereby decreasing current through the transistor. When the transistor with shallower source and drain diffusion regions is applied to the cell transistor in DRAM, such shallower diffusion regions allows the increase of junction leakage, thereby deteriorating refresh performance of DRAM. Further shrinkage of two-dimensional structure of MOS transistors would be difficult in order to realize further improvement of the performance of the semiconductor device that includes the MOS transistors.

Adoption of the three-dimensional structure for a transistor may be effective to countermeasure the difficulty of furthermore shrinkage of the transistor. Japanese Unexamined Patent Application, First Publication, No. 5-136374 discloses an example of a three dimensional transistor having a vertical surround gate transistor structure. This three dimensional transistor includes a pillar of semiconductor which extends in a direction vertical to the main surface of a semiconductor substrate. The semiconductor pillar provides a channel. In recent years, study for such three dimensional transistors has been progressed for further shrinkage of the transistor.

SUMMARY

In one embodiment, a semiconductor device may include, but is not limited to, a substrate, a low voltage transistor over the substrate, and a high voltage transistor over the substrate. The low voltage transistor may be configured by at least one unit transistor. The high voltage transistor may be high in driving voltage than the low voltage transistor. The high voltage transistor may be configured by a greater number of the unit transistors than the at least one unit transistor that configures the low voltage transistor. Each of the unit transistors may include, but is not limited to, a vertically extending portion of semiconductor over the substrate, a gate insulating film extending along a side surface of the vertically extending portion of semiconductor, a gate electrode separated by the gate insulating film from the vertically extending portion of semiconductor, and upper and lower diffusion regions being respectively disposed near the top and bottom of the vertically extending portion of semiconductor. The vertically extending portion of semiconductor provides a channel region. The unit transistors may have substantially the same height of the vertically extending portions of semiconductor thereof. The greater number of the unit transistors for the high voltage transistor may be electrically connected in series to each other. The greater number of the unit transistors for the high voltage transistor may have gate electrodes that are eclectically connected to each other.

In another embodiment, a semiconductor device may include, but is not limited to, a substrate having first and second active regions that are isolated by a device isolation, a first unit transistor being disposed in the first active region, and a second unit transistor being disposed in the second active region. Each of the first and second unit transistors may include, but is not limited to, a first vertically extending portion of semiconductor over the substrate. The first vertically extending portion of semiconductor provides a channel region. The first vertically extending portion of semiconductor may have the same height between the first and second unit transistors. Each of the first and second unit transistors may include, but is not limited to, a vertically projecting spacer of semiconductor over the substrate. The vertically projecting spacer of semiconductor may be distanced from the first vertically extending portion of semiconductor. The gate electrode may cover a pair of the first vertically extending portion of semiconductor and the vertically projecting spacer of semiconductor. Each of the first and second unit transistors may include, but is not limited to, upper and lower diffusion regions respectively disposed near the top and bottom of the first vertically extending portion of semiconductor. The gate electrodes of the first and second unit transistors may be electrically connected to each other. The first and second unit transistors may be electrically connected in series to each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, some embodiments of the related art will be described in detail with reference to FIG. 9, in order to facilitate the understanding of the present invention.

Figure 9:
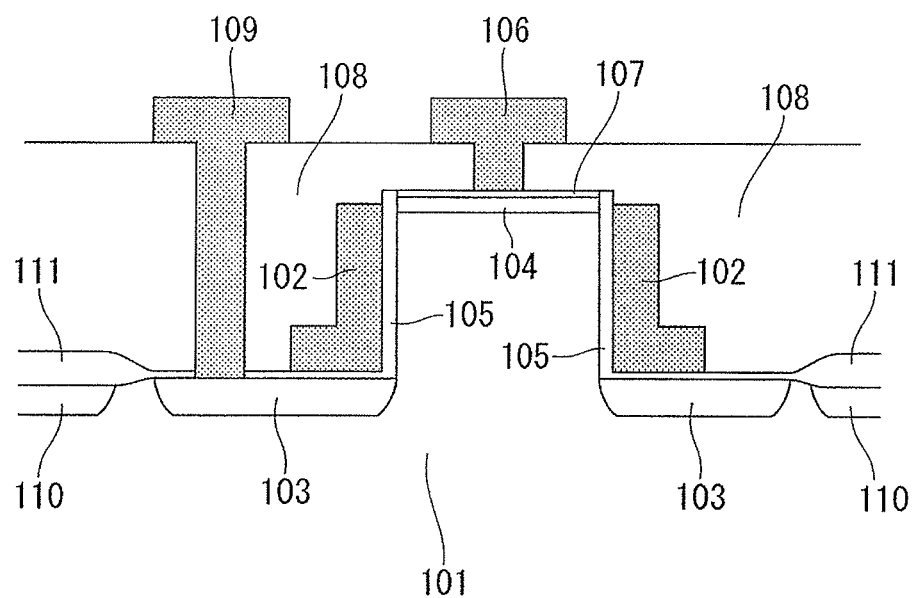
FIG. 9 is a fragmentary cross sectional elevation view illustrating a three dimensional transistor having a vertical surround gate transistor structure in accordance with the related art.

With reference to FIG. 9, a three dimensional transistor has a vertical surround gate transistor structure. The three dimensional transistor includes a pillar of silicon which vertically extends from the main surface of a semiconductor substrate 101. The pillar has a side wall that is covered by a gate insulating film 105. A gate electrode 102 is disposed on the gate insulating film 105 so that the gate electrode 102 is separated by the gate insulating film 105 from the silicon pillar. The silicon pillar has a top portion that is bounded with a source region 104. The source region 104 is disposed over the silicon pillar. The silicon pillar has a bottom portion that is adjacent to the semiconductor substrate. Drain regions 103 are disposed in a shallow region of the semiconductor substrate 101. The drain regions 103 are positioned near the bottom of the silicon pillar. Channel stoppers 110 are selectively provided in a shallow region of the semiconductor substrate 101. Channel stoppers 110 are positioned outside the active region of the semiconductor substrate 101. The active region is defined or surrounded by a field oxide film 111. An insulating film 107 is disposed on the source region 104. An inter-layer insulator 108 is provided which covers the field oxide film 111, the gate electrode 102, the drain regions 103, the source region 104, the gate insulating film 105, and the insulating film 107. A drain electrode 109 is disposed, which penetrates the inter-layer insulator 108 and reaches the drain regions 103. The drain electrode 109 is connected to the drain regions 103. The drain electrode 109 is made of a metal. A source electrode 106 penetrates the inter-layer insulator 108 and reaches the insulating film 107 that is disposed over the source region 104. The source electrode 106 may be made of a metal. The source electrode 106, the insulating film 107 and the source region 104 constitute a metal-insulator-semiconductor capacitor.

This structure has relatively small occupied area of the transistor. The channel length and the gate length are defined in the direction that is vertical to the surface of the semiconductor substrate 101. Increasing the channel length and the gate length causes no increase of the occupied area of the transistor. This means that the short channel effect can effectively be suppressed by increasing the channel length and the gate length, without increasing the occupied area of the transistor. This structure allows perfect depletion of the channel region. This structure is also advantageous in getting good S-value and large drain current. The gate electrode 102 horizontally surrounds the semiconductor pillar covered with the gate insulating film 105. The potential of the channel region can be effectively controllable by the gate electrode, free from any substantive or remarkable external effects other than the source and drain.

The semiconductor device may need a plurality of different voltage levels. In case of the DRAM, other transistors than cell transistors are disposed in a peripheral area, while the cell transistors are disposed in the memory cell array. The other transistors may be designed to operate with the power voltage. In general, DRAM uses a power voltage of 1.8V. The cell transistors in the memory cell array may be designed to operate with lower voltage level than the power voltage level, taking into account the leakage of current from the cell transistor and the current consumed by operations of the cell transistor. When the power voltage is 1.8V, the cell transistors or additional transistors, which may be included in sense amplifiers or be connected to digit lines or bit lines may be designed to operate with a range of voltage from about 1.0V to about 1.2V.

A gate control voltage that is applied to the gate of the cell transistor needs to be sufficiently high to store charge in the cell capacitor, while the source potential is unfixed. A threshold voltage will be about +1.5V, which may depends upon the characteristics of a transistor. In general, the DRAM needs the gate voltage of about 3.0V. Thus, the transistors, which are used to control the potential of the word lines that are connected to the gate electrodes of the cell transistors, are designed to operate with about 3.0V.

Anti-fuses are disposed in the product. Use of anti-fuses may greatly improve the yield of the product. In general, the anti-fuses are designed to be controlled with breaking electrical insulativity. Breaking electrical insulativity needs high voltage application to the anti-fuses. The insulating film of the anti-fuse may typically be broken at 5V to 6V. The transistor that is used to control the anti-fuse in order to break the insulating film has to be designed to be operatively stable under such high voltage. The transistor needs to have a withstand voltage of at least about 6V. The DRAM has to be designed to operate with a variety of voltage in the range of about 1V to about 6V.

When planer transistors are used for the DRAM, those planer transistors are adjusted and different in gate insulating film and impurity profile of source and drain as well as in gate length. When a high voltage as such as in the range of 3V to 6V is applied to the transistor, the transistor needs to have sufficient withstand voltage. Increasing the gate length of the transistor may be effective to increase the withstand voltage of the transistor. The height of the silicon pillar defines the gate length or channel length that between the source and drain. Increasing the height of the silicon pillar may be effective to increase the withstand voltage of the transistor for the high voltage. When the heights of the silicon pillars of all transistors are increased for the countermeasure to the high voltage, the transistors that operate with low voltage will be greatly deteriorated in characteristics or performances. It is desired to adjust the height of the pillar in accordance with the applied voltage level in view of ensuring good performance and sufficient withstand voltage. Forming transistors with different heights of pillars needs more complicated processes and increasing the cost.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 1:
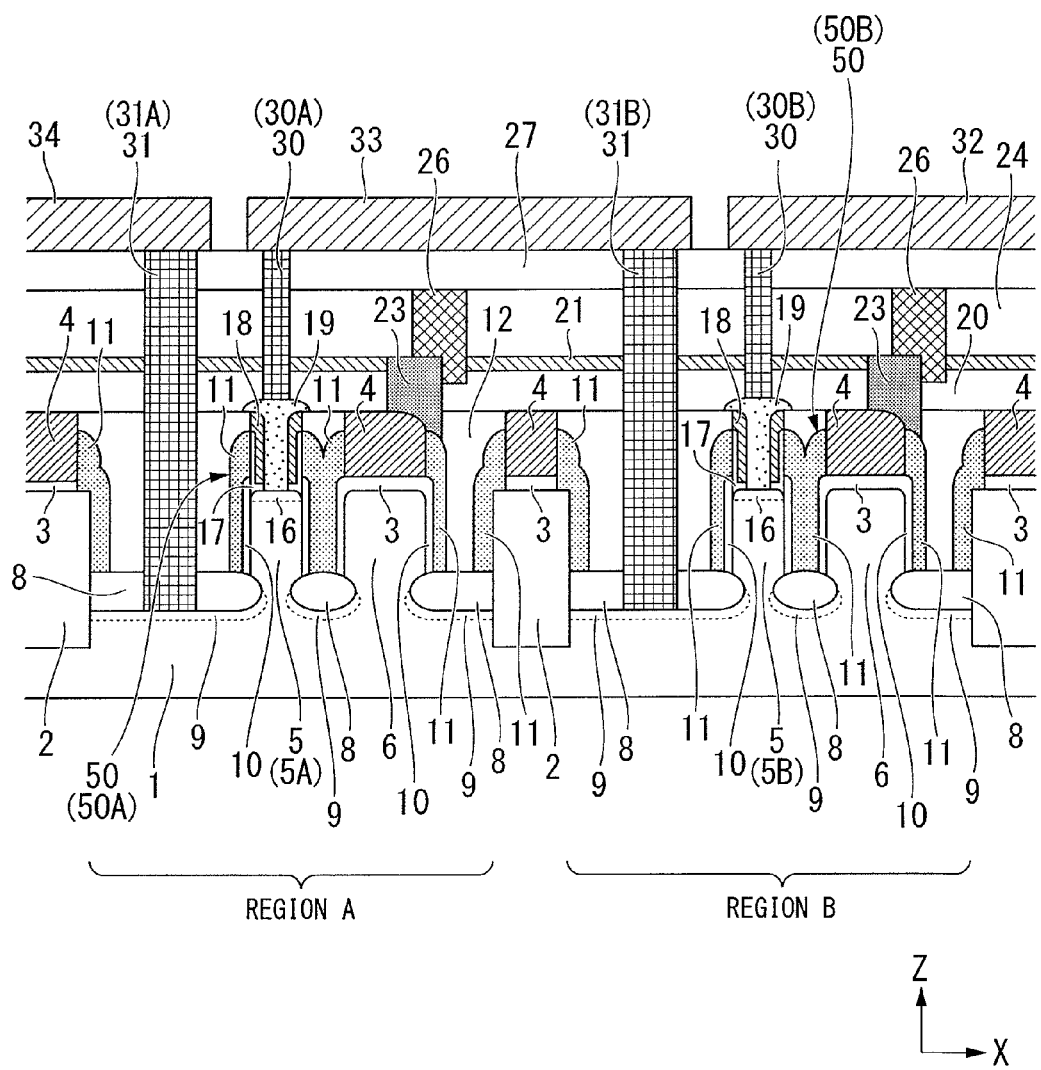
FIG. 1 is a fragmentary cross sectional elevation view illustrating a semiconductor device in accordance with a first preferred embodiment of the present invention.

A semiconductor device will be described in accordance with a first preferred embodiment of the present invention. The semiconductor device includes an integration of high voltage transistors and low voltage transistors. The high voltage transistors are designed to operate with higher driving voltage than driving voltage for driving the low voltage transistors. FIG. 1 shows only the high voltage transistors but does not illustrate the low voltage transistors.

Figure 2:
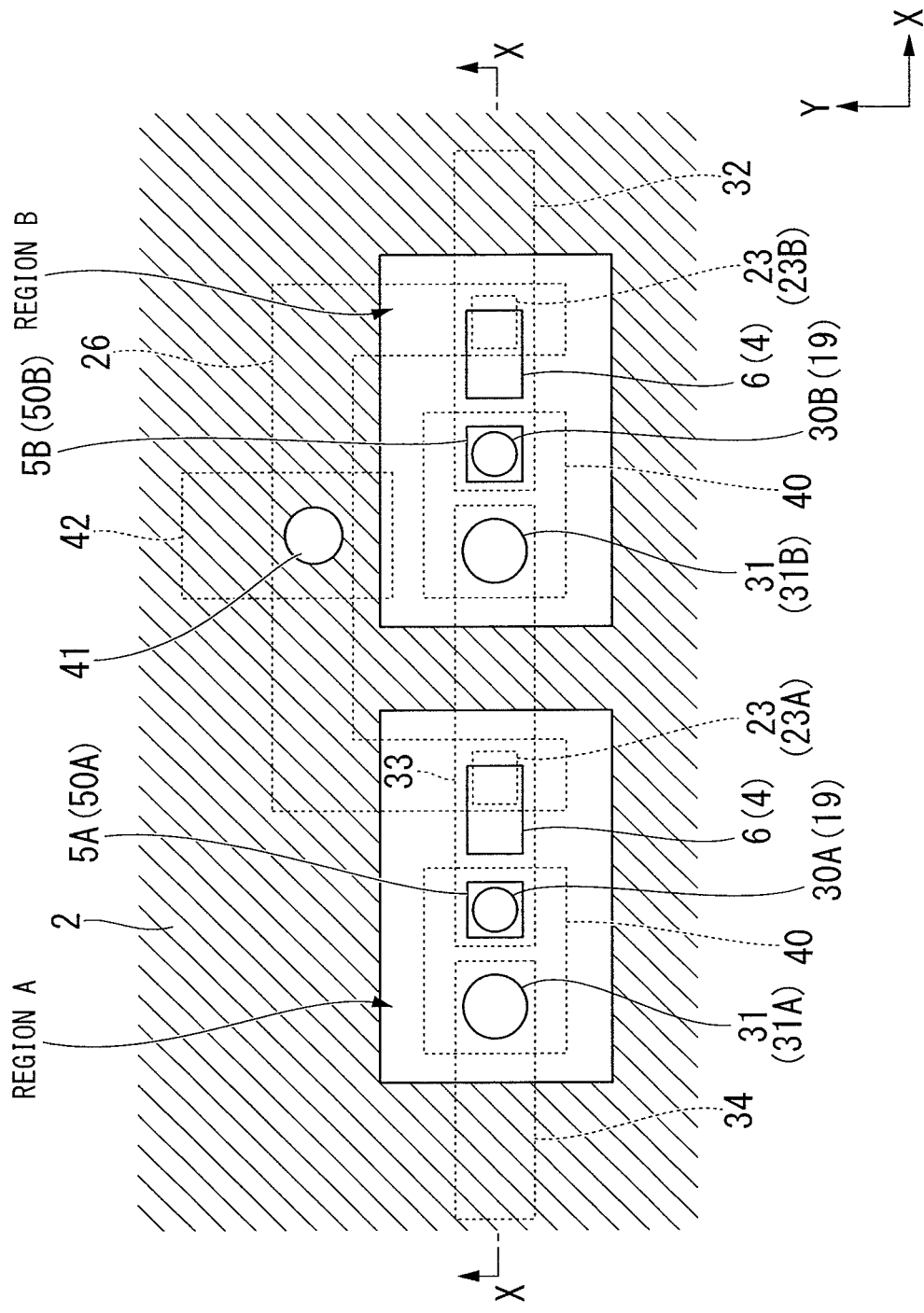
FIG. 2 is a fragmentary plan view illustrating the semiconductor device shown in FIG. 1 that is the fragmentary cross sectional elevation view, taken along an X-X line of FIG. 1.

With reference to FIGS. 1 and 2, a shallow trench isolation 2 is selectively provided in an upper region of a silicon substrate 1. The shallow trench isolation 2 defines first and second active regions A and B. The first active region A includes a first unit transistor 50A. The first unit transistor 50A has a first silicon pillar 5A. The first silicon pillar 5A may be positioned at the center of the first active region A. The second active region B includes a second unit transistor 50B. The second unit transistor 50B has a second silicon pillar 5B. The second silicon pillar 5B may be positioned at the center of the second active region B. The first and second silicon pillars 5A and 5B provide channel regions that vertically extend from the surface of the silicon substrate 1. The first and second silicon pillars 5A and 5B in the first and second active regions A and B have substantially the same height. The first and second silicon pillars 5A and 5B have horizontal dimensions which allow complete depletion.

The first and second silicon pillars 5A and 5B each have top and bottom portions. A first diffusion region 9 may be disposed in a shallower region of each of the silicon substrate 1. The first diffusion region 9 may be positioned near the bottom portion of each of the first and second silicon pillars 5A and 5B. A second diffusion region 16 may be disposed over the top portion of each of the first and second pillars 5A and 5B. The first diffusion region 9 may perform as a drain region. The second diffusion region 16 may perform as a source region. Each of the first and second silicon pillars 5A and 5B has a body that is positioned above the first diffusion region 9 and below the second diffusion region 16. The body of each of the first and second pillars 5A and 5B has side walls which are covered with a gate insulating film 10. The body of each of the first and second pillars 5A and 5B provides a channel between the first and second diffusion regions 9 and 16 that perform as the drain and source, respectively. A gate electrode 11 is disposed on the gate insulating film 10. The gate electrode 11 horizontally surrounds the body of each of the first and second pillars 5A and 5B. Each of the first and second pillars 5A and 5B has the channel that vertically extends along the gate insulating film 10.

Third and fourth silicon pillars 6 may be disposed in the first and second active regions A and B. The third silicon pillar 6 may be positioned near the first silicon pillar 5A. The third silicon pillar 6 may be separated from the first silicon pillar 5A. The first, second, third and fourth silicon pillars 5A, 5B and 6 can be formed by selectively etching the silicon substrate 1. The first and second silicon pillars 5A and 5B provide channels of the first and second unit transistors 50A and 50B in the first and second active regions A and B. The third and fourth silicon pillars 6 fail to provide any channel. The third and fourth silicon pillars 6 provide projecting spacers that allow increasing the height of the gate electrode 11. Increasing the height of the gate electrode 11 reduces the distance between the gate electrode 11 and first level interconnections 26. The third and fourth silicon pillars 6 may be regarded as lifting up the top portion of the gate electrode 11 so as to reduce the distance between the gate electrode 11 and the first level interconnection 26. As described above the first and third silicon pillars 5A and 6 are separated from each other. The second and fourth silicon pillars 5B and 6 are separated from each other. The gap between the first and third silicon pillars 5A and 6 may be approximately equal to or smaller than two times the thickness of the gate electrode 11. The gap between the second and third silicon pillars 5B and 6 may be smaller than the thickness of the gate electrode 11.

Each of the first, second, third and fourth silicon pillars 5A, 5B and 6 may be constituted by any types of a portion of silicon which generally extends in the direction that is vertical to the surface of the silicon substrate 1, but is not limited to the shape thereof as defined in mathematics.

The pillars 5A and 5B are typical examples, but not limited thereto, which can implement a vertically extending portion of semiconductor over the substrate. The vertically extending portion of semiconductor provides a channel for the unit transistor. The pillars 6 are typical examples, but not limited thereto, which can implement a vertically projecting spacer of semiconductor over the substrate. The vertically projecting spacer of semiconductor allows increasing the height of the gate electrode to reduce the distance between the gate electrode and the first-level interconnection.

An insulating film 8 extends over the surface of the silicon substrate 1. The insulating film 8 surrounds the bottom portion of each of the first, second, third and fourth silicon pillars 5A, 5B and 6. The insulating film 8 reaches the shallow trench isolation 2. The insulating film 8 may be made of silicon oxide. The first diffusion region 9 extends under the insulating film 8, so that the first diffusion region 9 vertically overlaps the insulating film 8. The first diffusion region 9 is electrically separated by the insulating film 8 from the gate electrode 11. The first diffusion region 9 performs as the drain of each of the first and second unit transistors 50A and 50B. The bottom of the shallow trench isolation 2 is deeper than the first diffusion region 9. The shallow trench isolation 2 electrically separates the first diffusion regions 9 from each other in the first and second active regions A and B.

The gate insulating film 10 covers the side walls of the first, second, third and fourth silicon pillars 5A, 5B and 6. An insulating film 3 extends over the top portions of the third and fourth silicon pillars 6. A hard mask film 4 also extends over the insulating film 3 that extends over the top portions of the third and fourth silicon pillars 6. The gate electrodes 11 extend along the gate insulating film 10, so that the gate electrodes 11 horizontally surround the first, second, third and fourth silicon pillars 5A, 5B and 6. The gate electrodes 11 further extend along the side walls of the insulating film 3 and the hard mask film 4, both of which are stacked over the top portions of the third and fourth silicon pillars 6. The gate electrodes 11 are electrically separated by the gate insulating film 10 from the first, second, third and fourth silicon pillars 5A, 5B and 6. The hard mask film 4 performs an additional spacer in addition to the third or fourth silicon pillars 6.

The insulating film 3 also extends over the shallow trench isolation 2. The insulating film 3 may be made of silicon oxide. The hard mask film 4 also extends over the insulating film 3. The hard mask film 4 may be made of silicon nitride. The gate electrode 11 also extends along the inside walls of the shallow trench isolation 2, the inside walls of the insulating film 3 over the shallow trench isolation 2, and the inside walls of the hard mask film 4 over the insulating film 3. The gate insulating film 10 covers the top surface and side walls of the first and second silicon pillars 5A and 5B. The gate insulating film 10 reaches the insulating film 8. The channel regions of the first and second silicon pillars 5A and 5B, and the first and second diffusion regions 9 and 16 are electrically separated from the gate electrodes 11 by the gate insulating film 10 and the insulating film 8.

The gate electrode 11 fills up the gap between the first and third silicon pillars 5A and 6. The gate electrode 11 fills up the gap between the second and fourth silicon pillars 5B and 6. The gate electrode 11 covers a set of the first and third silicon pillars 5A and 6. The gate electrode 11 covers a set of the second and fourth silicon pillars 5A and 6. As described above, the gap between the first and third silicon pillars 5A and 6 may be approximately equal to or smaller than two times the thickness of the gate electrode 11 so that the gap between the first and third silicon pillars 5A and 6 is filled up with the gate electrode 11. Namely, the gate electrode 11 has a gap-filling portion that fills up the gap between the first and third silicon pillars 5A and 6. The gap-filling portion of the gate electrode 11 performs as a common gate electrode to the first and third silicon pillars 5A and 6. Similarly, the gap between the second and fourth silicon pillars 5B and 6 may be approximately equal to or smaller than two times the thickness of the gate electrode 11 so that the gap between the second and fourth silicon pillars 5B and 6 is filled up with the gate electrode 11. Namely, the gate electrode 11 has a gap-filling portion that fills up the gap between the second and fourth silicon pillars 5B and 6. The gap-filling portion of the gate electrode 11 performs as a common gate electrode to the second and fourth silicon pillars 5B and 6.

The insulating film 3 extends over the shallow trench isolation 2, and the first, second, third and fourth silicon pillars 5A, 5B and 6. The hard mask film 4 extends over the insulating film 3 that extends over the shallow trench isolation 2, and the third and fourth silicon pillars 6. A first inter-layer insulator 12 covers the gate electrodes 11 and the insulating film 8. The first inter-layer insulator 12 also extends on the side walls of the shallow trench isolation 2, the insulating film 3 and the hard mask film 4. The top portions of the hard mask films 4 are leveled to the top surface of the first inter-layer insulator 12. A second inter-layer insulator 20 extends over the first inter-layer insulator 12 and the hard mask films 4. A stopper nitride film 21 extends over the second inter-layer insulator 20. A third inter-layer insulator 24 extends over the stopper nitride film 21.

The first-level interconnection 26 extends over the second inter-layer insulator 20 in each of the first and second active regions A and B. The first-level interconnection 26 runs through a groove which penetrates the third inter-layer insulator 24 and the stopper nitride film 21. A contact plug 23 is disposed in each of the first and second active regions A and B. The contact plug 23 may be made of a metal. The contact plug 23 penetrates the stopper nitride film 21, the second inter-layer insulator 20 and the first inter-layer insulator 12. The contact plug 23 reaches the gate electrode 11. The contact plug 23 also reaches the first-level interconnection 26. The first-level interconnection 26 is electrically connected through the contact plug 23 to the gate electrode 11 in each of the first and second active regions A and B. The contact plug 23 partially overlaps the first-level interconnection 26.

The insulating film 3 extends over the top portion of each of the first and second silicon pillars 5A and 5B. The nitride hard mask 4 extends over the insulating film 3. The contact plug 23 is connected to the top portion of the gate electrode 11 that is adjacent to the side wall of the hard mask film 4. The hard mask films 4 perform as additional spacers to the third and fourth silicon pillars 6. The hard mask films 4 in combination with the third and fourth silicon pillars 6 provide projecting spacers that allow increasing the height of the gate electrode 11. Increasing the height of the gate electrode 11 reduces the distance between the gate electrode 11 and the first level interconnections 26.

The first level interconnections 26 partially and vertically overlap the contact plug 23. The first level interconnections 26 have bottom portions which are buried in shallower portions of the second inter-layer insulator 20. The bottom portion of the first level interconnection 26 covers the side wall of the top portion of the contact plug 23. The first level interconnection 26 extends across over the shallow trench isolation 2. The first level interconnection 26 extends between the contact plugs 23. Adjacent gate electrodes 11 that are separated by the shallow trench isolation 2 are also electrically connected to each other through the first level interconnection 26.

A fourth inter-layer insulator 27 extends over the third inter-layer insulator 24 and the first level interconnections 26. Second-level interconnections 32, 33 and 34 extend over the fourth inter-layer insulator 27. The second-level interconnections 32, 33 and 34 may be made of a metal. The second-level interconnection 33 has the first end which is connected to a contact plug 31B in the second active region B. The contact plug 31B may be made of a metal. The contact plug 31B penetrates the fourth inter-layer insulator 27, the third inter-layer insulator 24, the stopper nitride film 21, the second inter-layer insulator 20, the first inter-layer insulator 12, and the insulating film 8. The contact plug 31 reaches the first diffusion region 9. The second-level interconnection 33 is electrically connected to the first diffusion region 9 through the contact plug 31B.

A contact plug 19 is disposed in each of the first and second active regions A and B. The contact plug 19 penetrates the first inter-layer insulator 12 and reaches the second diffusion region 16. The contact plug 19 contacts with the second diffusion region 16. The second-level interconnection 33 has the second end which is connected to a contact plug 30A in the first active region A. The contact plug 30A may be made of a metal. The contact plug 30A penetrates the fourth inter-layer insulator 27, the third inter-layer insulator 24, the stopper nitride film 21, and the second inter-layer insulator 20. The contact plug 30A reaches the contact plug 19 in the first active region A. The contact plug 30A contacts with the contact plug 19. The second-level interconnection 33 is electrically connected to the second diffusion region 16 through the contact plug 30A and the contact plug 19 that is positioned over the first silicon pillar 5A in the first active region A.

The contact plug 19 may be made of impurity-doped silicon such as As-doped silicon. The contact plug 19 in combination with the second diffusion region 16 constitutes the source of each of the first and second unit transistor 50A and 50B. The contact plug 19 has a side wall which is covered with a side wall nitride film 18. The side wall nitride film 18 extends along the side wall of the contact plug 19. An oxide film 17 extends along the side wall nitride film 18. The side wall nitride film 18 combined with the oxide film 17 electrically separate the contact plug 19 from the gate electrode 11.

The second-level interconnection 34 has the first end which is connected to a contact plug 31A in the first active region A. The contact plug 31A may be made of a metal. The contact plug 31A penetrates the fourth inter-layer insulator 27, the third inter-layer insulator 24, the stopper nitride film 21, the second inter-layer insulator 20, the first inter-layer insulator 12, and the insulating film 8. The contact plug 31A reaches the first diffusion region 9. The second-level interconnection 33 is electrically connected to the first diffusion region 9 through the contact plug 31A.

The second-level interconnection 32 has the second end which is connected to a contact plug 30B in the second active region B. The contact plug 30B may be made of a metal. The contact plug 30B penetrates the fourth inter-layer insulator 27, the third inter-layer insulator 24, the stopper nitride film 21, and the second inter-layer insulator 20. The contact plug 30B reaches the contact plug 19 in the second active region B. The contact plug 30B contacts with the contact plug 19. The second-level interconnection 32 is electrically connected to the second diffusion region 16 through the contact plug 30B and the contact plug 19 that is positioned over the second silicon pillar 5B in the second active region B.

As shown in FIG. 2, the shallow trench isolation 2 defines the first and second active regions A and B. In some cases, the first and second active regions A and B may be rectangle in plan view. In some cases, the first and second silicon pillars 5A and 5B may be positioned at the centers of the first and second active regions A and B. The first and second silicon pillars 5A and 5B may be, but are not limited to, rectangle in plan view. The first and second silicon pillars 5A and 5B provide channels for the first and second unit transistors 50A and 50B which are disposed in the first and second active regions A and B. Each high voltage transistor included in the semiconductor device can be implemented by the first and second unit transistors 50A and 50B in the first and second active regions A and B.

The contact plug 19 is positioned over the first silicon pillar 5A. The contact plug 19 vertically overlaps the first silicon pillar 5A. The contact plug 30A is positioned over the contact plug 19. The contact plug 30A vertically overlaps the contact plug 19. The second-level interconnection 33 extends between the first and second active regions A and B and also extends across over the shallow trench isolation 2 between the first and second active regions A and B. The second-level interconnection 33 extends in X-direction in which the first and second active regions A and B are aligned and distanced from each other. The second-level interconnection 33 has the first end which is electrically connected through the contact plug 31B to the first diffusion region 9 that extends near the bottom portion of the second silicon pillar 5B of the second unit transistor 50B. The second-level interconnection 33 has the second end which is electrically connected through the contact plug 30A and the contact plug 19 to the second diffusion region 16 that is positioned over the first silicon pillar 5A of the first unit transistor 50A. The second-level interconnection 33 electrically connects the source of the first unit transistor 50A in the first active region A and the drain of the second unit transistor 50B in the second active region B.

The third silicon pillar 6 is disposed in the first active region A. The third silicon pillar 6 is adjacent to the first silicon pillar 5A in X-direction. The third silicon pillar 6 may be rectangle in plan view. The contact plug 23 is positioned over the third silicon pillar 6. The contact plug 23 vertically and at least partially overlaps the third silicon pillar 6 as well as vertically and at least partially overlaps a portion of the gate electrode 11, which extends along the side wall of the gate insulating film 10 and the side wall of the hard mask film 4, wherein the gate insulating film 10 extends along the side wall of the third silicon pillar 6. The contact plug 23 may be rectangle in plan view.

The first-level interconnection 26 has a portion that vertically and at least partially overlaps the contact plug 23. The first-level interconnection 26 runs in inverse-U shape. Namely, the first-level interconnection 26 has first and second portions which extend in Y-direction and a third portion which extends in X-direction, wherein the third portion communicates between the first and second portions. The first portion of the first-level interconnection 26 partially extends over the first active region A. The second portion of the first-level interconnection 26 partially extends over the second active region B. The third portion of the first-level interconnection 26 extends over the shallow trench isolation 2. The first portion of the first-level interconnection 26 is electrically connected through the contact plug 23A to the gate electrode 11 which surrounds both the first and third silicon pillars 5A and 6 in the first active region A. Namely, the first portion of the first-level interconnection 26 is electrically connected through the contact plug 23A to the gate electrode 11 of the first unit transistor 50A in the first active region A. The second portion of the first-level interconnection 26 is electrically connected through the contact plug 23B to the gate electrode 11 which surrounds both the second and fourth silicon pillars 5B and 6 in the second active region B. Namely, the second portion of the first-level interconnection 26 is electrically connected through the contact plug 23B to the gate electrode 11 of the second unit transistor 50B in the second active region B. The first-level interconnection 26 electrically interconnects the gate electrodes 11 of the first and second unit transistors 50A and 50B in the first and second active regions A and B.

The third portion of the first-level interconnection 26 partially overlaps a common gate line 42 that extends in Y-direction. The third portion of the first-level interconnection 26 may be also electrically connected through a contact plug 41 to the common gate line 42. The common gate line 42 is eclectically connected through the contact plug 41 and the first-level interconnection 26 to the gate electrodes 11 of the first and second unit transistors 50A and 50B in the first and second active regions A and B. The common gate line 42 is used commonly to both the gate electrodes 11 of the first and second unit transistors 50A and 50B in the first and second active regions A and B.

The contact plug 31A is disposed in the first active region A. The contact plug 31A is more distal from the third silicon pillar 6 than the contact plug 30A. The contact plug 30A is interposed between the contact plug 31A and the contact plug 23A. The second-level interconnection 34 has a portion that vertically and at least partially overlaps the contact plug 31A. The second-level interconnection 34 runs in X-direction. The second-level interconnection 34 has a first portion that is electrically connected through the contact plug 31A to the first diffusion region 9 that is positioned near the bottom of the first silicon pillar 5A. The first diffusion region 9 performs as a drain. The second-level interconnection 34 has a second portion that is electrically connected through the contact plug to the first diffusion region 9 in the second active region B. The second-level interconnection 34 electrically interconnects the first diffusion regions 9 performing as drains in the first and second active regions A and B. The second-level interconnection 34 is electrically connected through the contact plugs 31A and 31B to the first diffusion regions 9 performing as drain regions of the first and second unit transistors 50A and 50B in the first and second active regions A and B.

The contact plug 19 is positioned over the second silicon pillar 5B. The contact plug 19 vertically overlaps the second silicon pillar 5B. The contact plug 30B is positioned over the contact plug 19. The contact plug 30B vertically overlaps the contact plug 19. The second-level interconnection 33 is electrically connected to the contact plug 30B to the second diffusion region 16B performing as a source over the second silicon pillar 5B of the second unit transistor 50B. The second-level interconnection 33 performs as a common source line for the first and second unit transistors 50A and 50B.

The contact plugs 31A and 31B, the first and second silicon pillars 5A and 5B, and the third and fourth silicon pillars 6 are aligned in X-direction. The second-level interconnections 32, 33 and 34 are aligned also in X-direction so that the second-level interconnections 32, 33 and 34 vertically overlap the contact plugs 31A and 31B, the first and second silicon pillars 5A and 5B, and the third and fourth silicon pillars 6. These positional relationships between those elements should not be limited to the above.

The shapes in plan view of each element included in the semiconductor device can be modified in accordance with the design requests. The shape in plan view of the first and second silicon pillars 5A and 5B may be, but not limited to, a circle, rectangles or other polygon. The third and fourth silicon pillars 6 are disposed in order to provide the projections which allow the height of the gate electrode to be increased, thereby reducing the distance between the top portion of the gate electrode 11 and the first-level interconnection 26. There is no limitation to the dimension or shape of the third and fourth silicon pillars 6.

Even illustration of low voltage transistors is omitted in FIGS. 1 and 2, each low voltage transistor is implemented by a single unit transistor that has the same structure as the unit transistors that configure each high voltage transistor. The low voltage transistor is configured by the single unit transistor only. There is no interconnection that interconnects the unit transistors. An etching process can be used to form the silicon pillars for the high voltage and low voltage transistors. All the silicon pillars for the high voltage and low voltage transistors have substantially the same height. Since the low voltage transistor is configured by the single unit transistor only, the channel length of the low voltage transistor corresponds to the height of the body of the silicon pillar, wherein the body of the silicon pillar is defined between the first and second diffusion regions 9 and 16. The high voltage transistor is configured by a series connection of two unit transistors having the first diffusion regions 9 which are separated by the shallow trench isolation 2. The channel length of the high voltage transistor generally corresponds to two times the height of the body of the silicon pillar, wherein the body of the silicon pillar is defined between the first and second diffusion regions 9 and 16. The high voltage transistors have higher withstand voltages than the low voltage transistors, even the silicon pillar height is uniform between the high voltage and low voltage transistors.

A typical example of a method of forming the semiconductor device that is shown in FIGS. 1 and 2 will be described with reference to FIGS. 3A through 3X, which are fragmentary cross sectional elevation views, taken along X-X line.

Figure 3A:
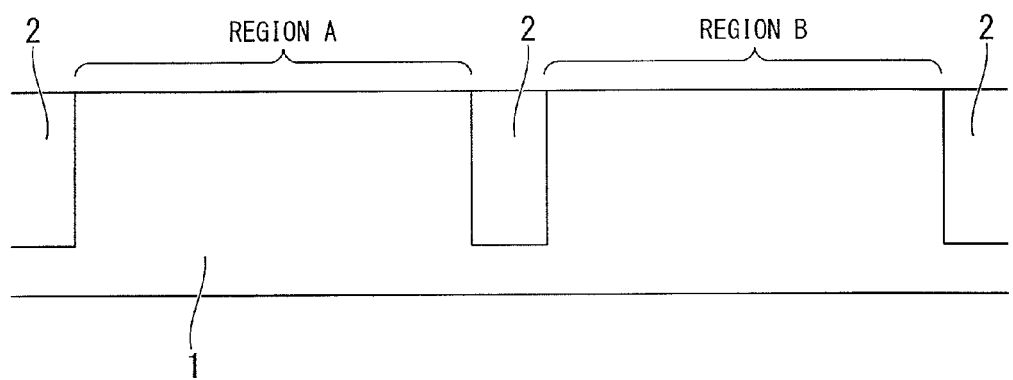
FIGS. 3A through 3X are fragmentary cross sectional elevation views illustrating sequential steps involved in a method of forming the semiconductor device shown in FIG. 1.

With reference to FIG. 3A, a shallow trench isolation 2 is selectively formed in an upper region of a silicon substrate 1. The shallow trench isolation 2 defines first and second active regions A and B. The first and second active regions A and B are separated by the shallow trench isolation 2.

Figure 3B:
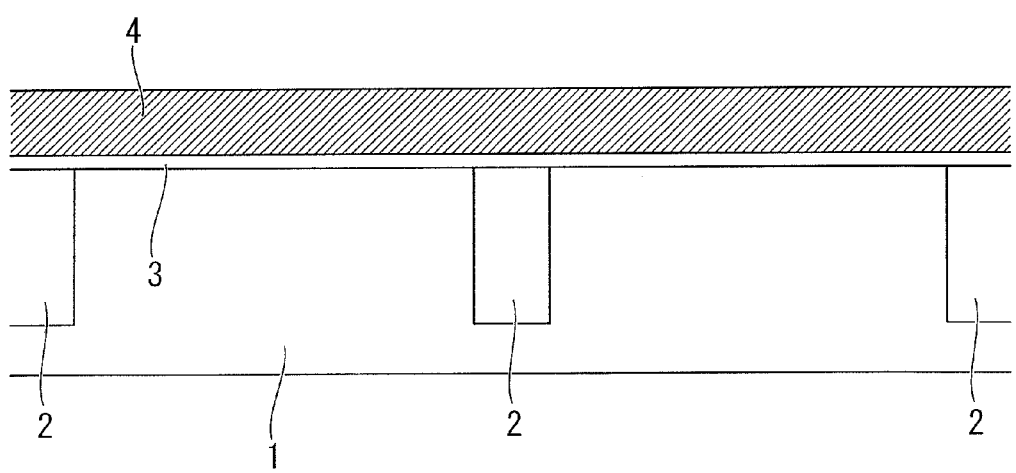

With reference to FIG. 3B, a silicon oxide film 3 is formed over the shallow trench isolation 2, and the first and second active regions A and B. In some cases, the silicon oxide film 3 may have a thickness of 10 nm. A mask nitride film 4 is formed over the silicon oxide film 3. In some cases, the mask nitride film 4 may have a thickness of 120 nm.

Figure 3C:
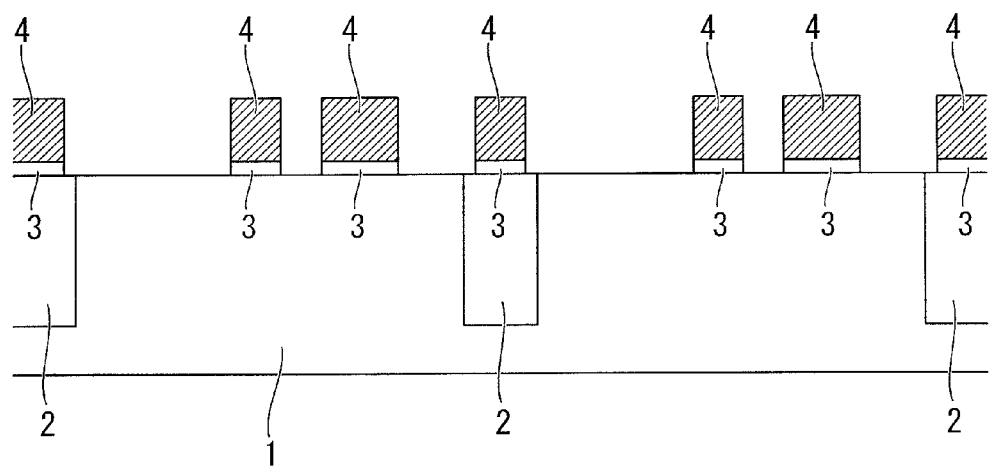

With reference to FIG. 3C, a resist film is applied on the nitride film 4. A lithography process is carried out to form a resist pattern. An anisotropic etching is carried out using the resist pattern as a mask, to selectively etch the nitride film 4 and the oxide film 3, thereby forming the nitride masks 4 and the oxide films 3.

Figure 3D:
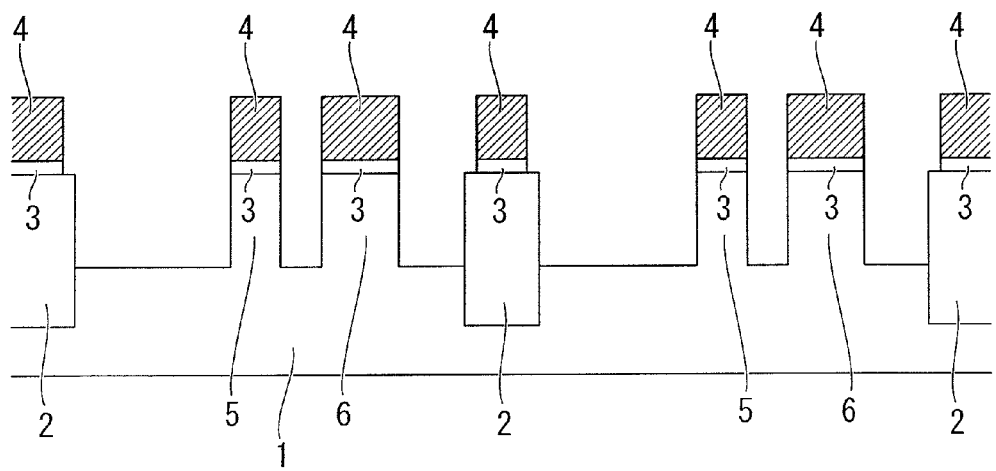

With reference to FIG. 3D, an anisotropic etching process is carried out by using the nitride masks 4 to selectively etch the silicon substrate 1, thereby forming silicon pillars 5 and 6. In some cases, the etching depth may be, but is not limited to, 150 nm. A pair of the silicon pillars 5 and 6 is formed in the first active region A. Another pair of the silicon pillars 5 and 6 is formed in the second active region B. The silicon pillar 5 provides the channel for the unit transistor. The silicon pillar 6 provides a projecting spacer that increases the height of the gate electrode 11. The layout of the silicon pillars 5 and 6 are as shown in FIG. 2. In each of the first and second active regions A and B, a single pair of silicon pillars 5 and 6 is formed, wherein the silicon pillars 5 and 6 are distanced from each other by a gap which is approximately equal to or narrower than two times the thickness of a gate electrode that will be formed in later process. The horizontal dimension of the silicon pillar 5 is as large as allowing for complete depletion. The dimension of the silicon pillar 6 may be optional, but is not limited to the same dimension as the silicon pillar 5.

Figure 3E:
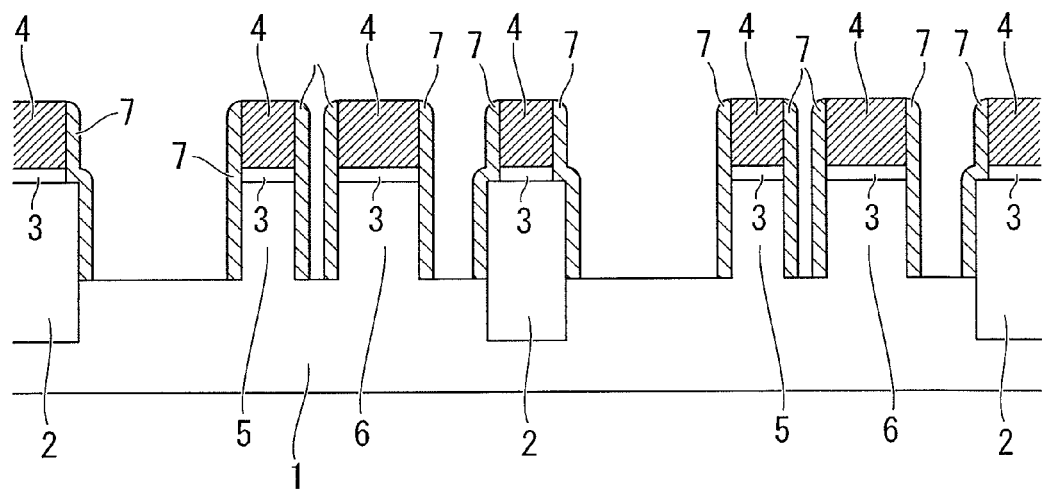

With reference to FIG. 3E, an oxidizing process is carried out to oxidize the surface region of the side wall of each of the silicon pillars 5 and 6, thereby forming an oxide film on the side wall of each of the silicon pillars 5 and 6. The oxide film is not illustrated. The oxidation depth may be, but is not limited to, about 5 nm. A nitride film is entirely formed by a thickness of about 20 nm and then the nitride film is etched back, thereby forming side wall nitride films 7 that extend along the side walls of the silicon pillars 5 and 6, the oxide films 3 and the nitride masks 4 as well as extend along the side walls of the shallow trench isolations 2, the oxide films 3 and the nitride masks 4.

Figure 3F:
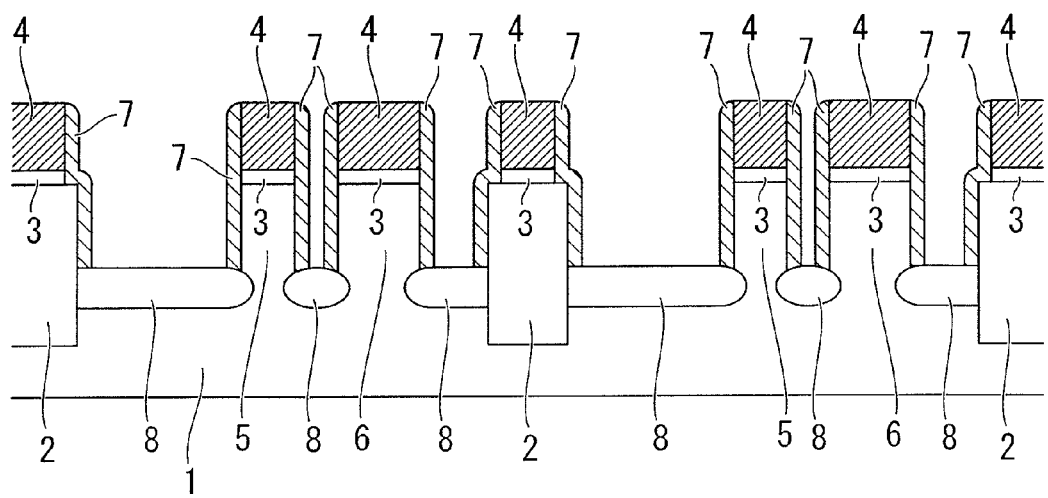

With reference to FIG. 3F, an oxidation process is carried out to oxidize the exposed surfaces of the silicon substrate 1, thereby forming oxide films 8 on the exposed surfaces of the silicon substrate 1. In some cases, the oxide films 8 have a thickness of 30 nm. The silicon pillars 5 and 6 are not oxidized as being covered by the nitride masks 4 and the side wall nitride films 7.

Figure 3G:
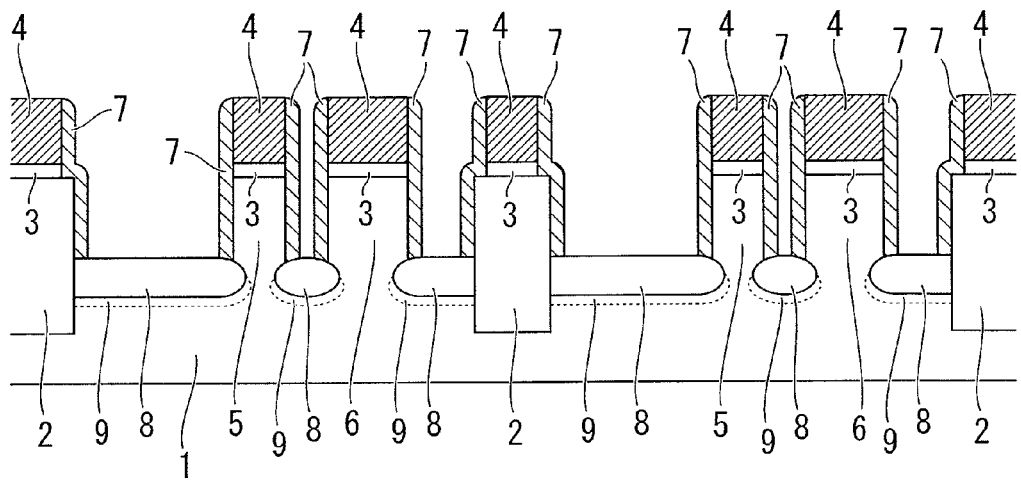

With reference to FIG. 3G, an ion-implantation process is carried out to introduce an impurity into the silicon substrate 1, thereby forming first diffusion regions 9 under the oxide films 8. For forming an n-type transistor, n-type ions such as As-ions are introduced. The nitride masks 4 prevent the ions from being introduced into the silicon pillars 5 and 6 because the nitride masks 4 have a thickness of about 100 nm which is sufficiently thicker than the oxide films 8 having the thickness of 30 nm. No diffusion region is formed in the silicon pillars 5 and 6.

Figure 3H:
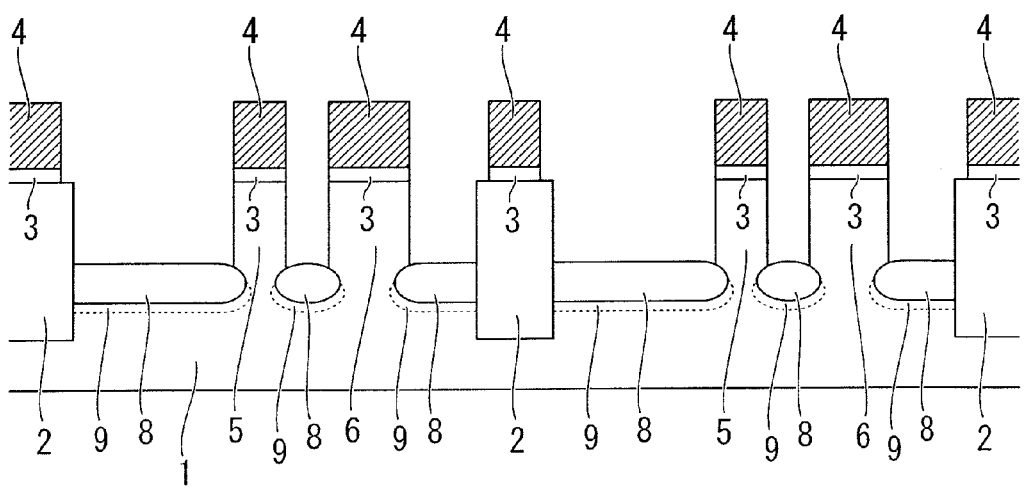

With reference to FIG. 3H, the side wall nitride films 7 and the oxide films are removed from the side walls of the silicon pillars 5 and 6, the oxide films 3 and the nitride masks 4 as well as from the side walls of the shallow trench isolations 2, the oxide films 3 and the nitride masks 4. As a result, there are exposed the side walls of the silicon pillars 5 and 6, the oxide films 3 and the nitride masks 4 as well as there are exposed the side walls of the shallow trench isolations 2, the oxide films 3 and the nitride masks 4.

Figure 3I:
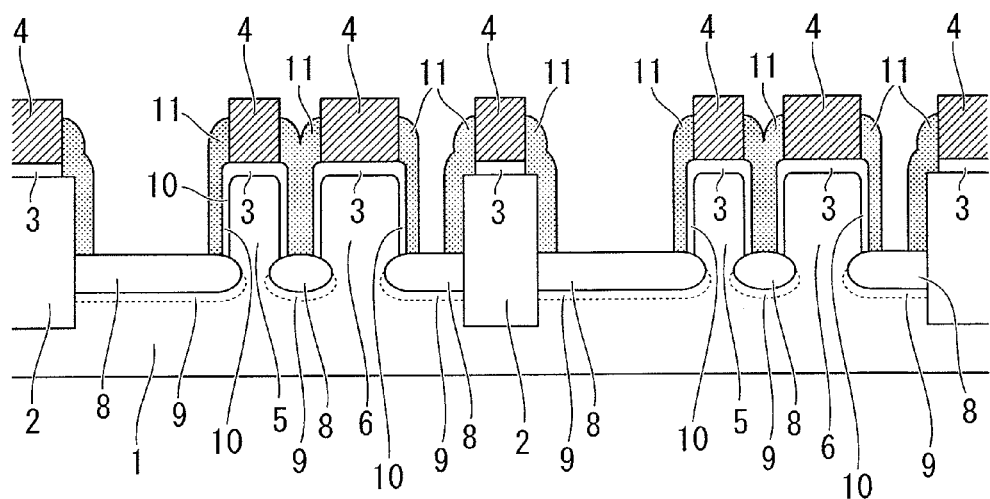

With reference to FIG. 3I, a gate insulating film 10 is formed on the side walls of the silicon pillars 5 and 6. The gate insulating film 10 may be made of silicon oxide. In this case, the gate insulating film 10 may have a thickness of about 3 nm. A polysilicon film having a thickness of about 20 nm is entirely formed over the silicon substrate 1 and then etched back, thereby forming gate electrodes 11. The gate electrodes 11 extend along the gate insulating films on the side walls of the silicon pillars 5 and 6 as well as along the side walls of the oxide film and the nitride masks 4. The gate electrodes 11 also extend along the side walls of the shallow trench isolation 2, the oxide film 3 and the nitride masks 4. Since the gap between the silicon pillars 5 and 6 is approximately equal to or narrower than two times the thickness of the gate electrode 11, the gap between the silicon pillars 5 and 6 is buried up by the gate electrode 11.

Figure 3J:
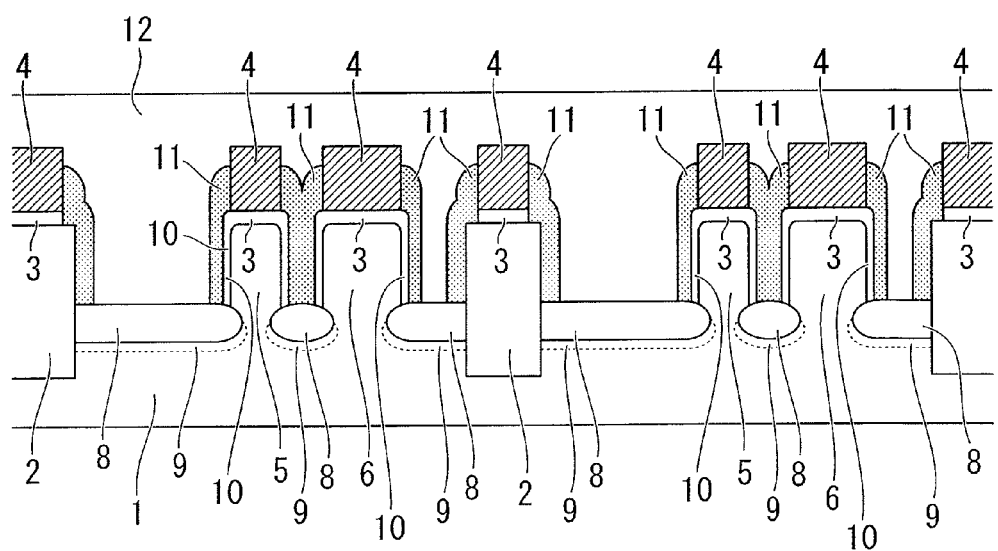

With reference to FIG. 3J, a first inter-layer insulator 12 is formed to bury the gate electrodes 11, the nitride masks 4, the oxide films 8.

Figure 3K:
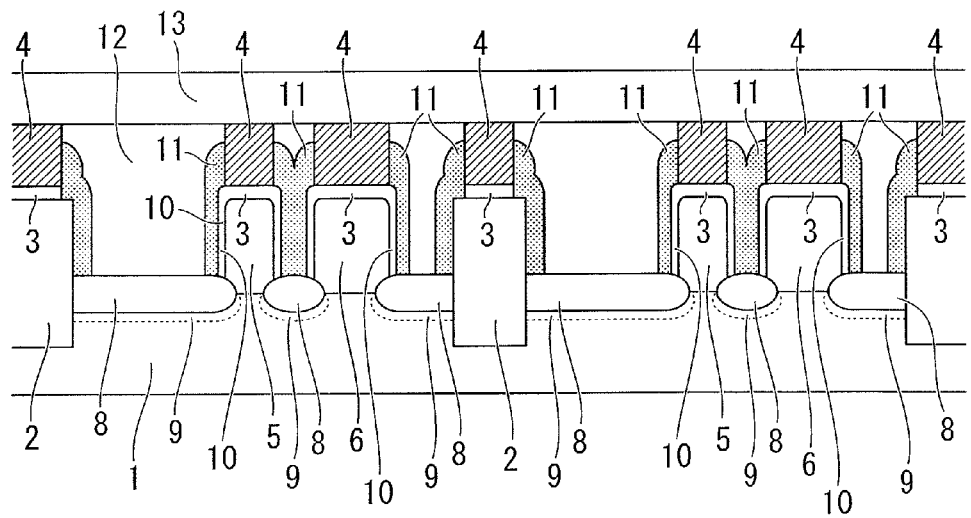

With reference to FIG. 3K, a chemical mechanical polishing process is carried out to planarize the first inter-layer insulator 12, so that the nitride masks 4 are exposed. An oxide film 13 is formed over the first inter-layer insulator 12 and the nitride masks 4. In some cases, the oxide film 13 may have a thickness of about 50 nm.

Figure 3L:
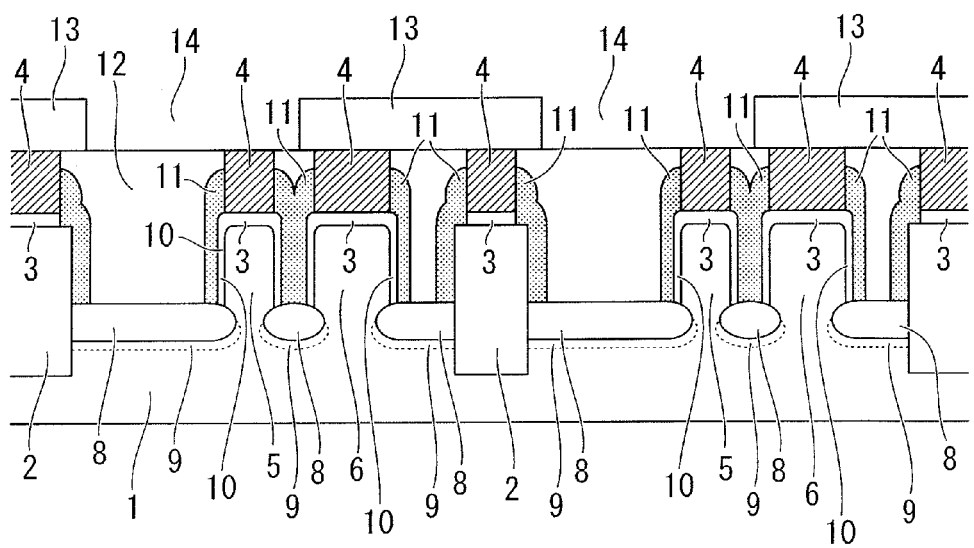

With reference to FIG. 3L, a resist film is applied on the oxide film 13. A lithography process is carried out to form a resist pattern over the oxide film 13. An anisotropic etching process is carried out to selectively remove the oxide film 13, thereby forming oxide mask 13 having patterns 40 as shown in FIG. 2. Empty spaces 14 surround and define the patterns 40 of the oxide masks 13. Under the empty spaces 14, the first inter-layer insulator 12 and the nitride masks 4 over the silicon pillars 5 are exposed.

Figure 3M:
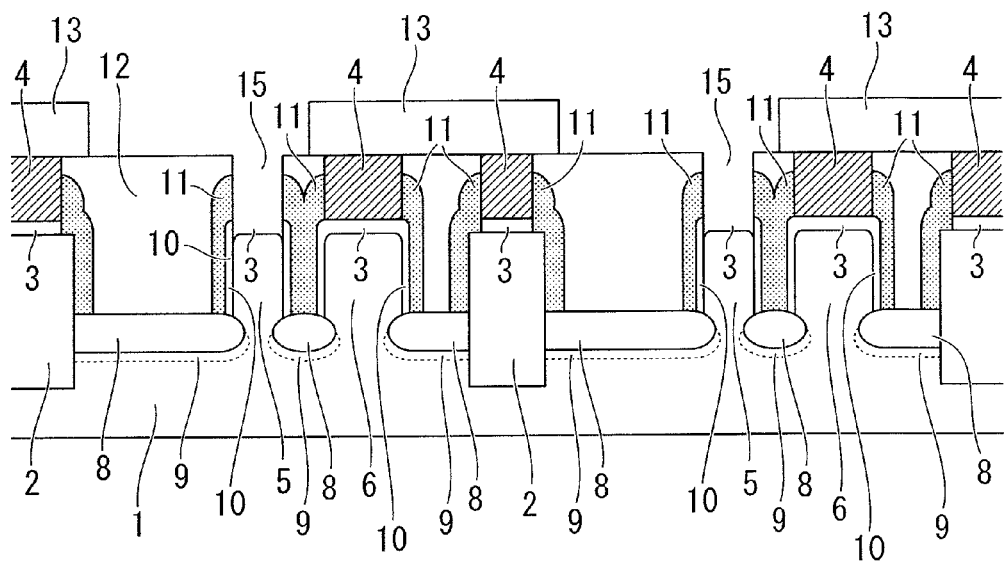

With reference to FIG. 3M, the nitride masks 4 under the empty spaces 14 are removed to form openings 15 over the top portions of the silicon pillars 5, whereby the top portions of the silicon pillars 5 are exposed.

Figure 3N:
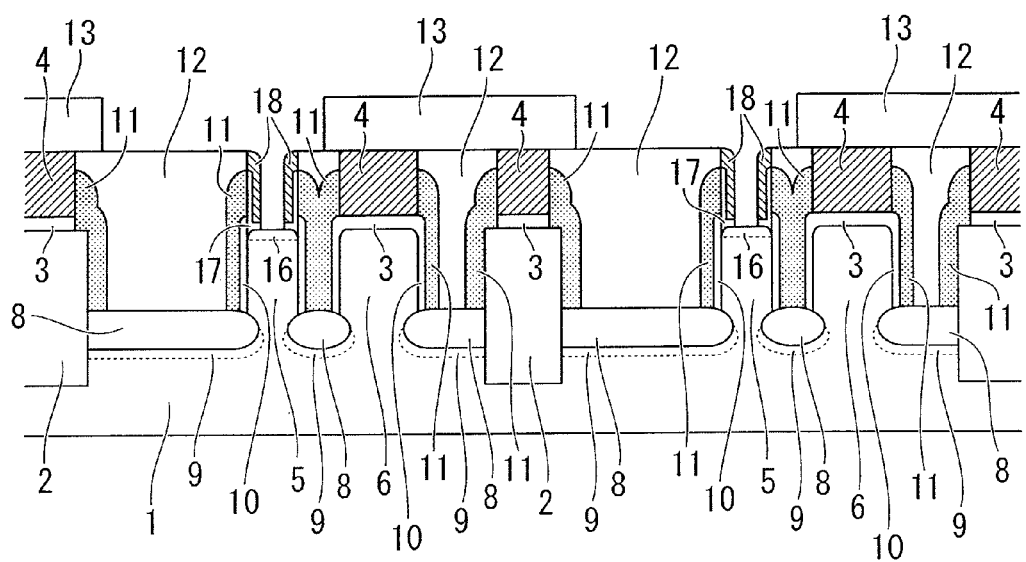

With reference to FIG. 3N, an oxidation process is carried out to form an oxide film 17 in the openings 15. An ion-implantation process is carried out to introduce ions through the openings 15 into the upper portions of the silicon pillars 5, thereby forming second diffusion regions 16 in the upper regions of the silicon pillars 5, thereby redefining the silicon pillars 5. The second diffusion regions 16 are positioned over the top portions of the silicon pillars 5. The ions to be introduced may be an n-type impurity such as phosphorus or arsenic. A nitride film is entirely formed by about 10 nm and etched back, thereby forming side wall nitride films 18 on the side walls of the openings 15. In the etch-back process, the oxide film 17 is removed from the top surfaces of the second diffusion regions 16 over the silicon pillars 5, thereby exposing the top surfaces of the second diffusion regions 16 over the silicon pillars 5. The oxide film 17 is leaved under the side wall nitride films 18 and also on the side walls of the gate electrodes 11. The side wall nitride films 18 are effective to form lightly-doped drain structure in the second diffusion regions 16. The side wall nitride films 18 are effective to isolate plugs from the gate electrodes 11, wherein the plugs will be formed.

Figure 3O:
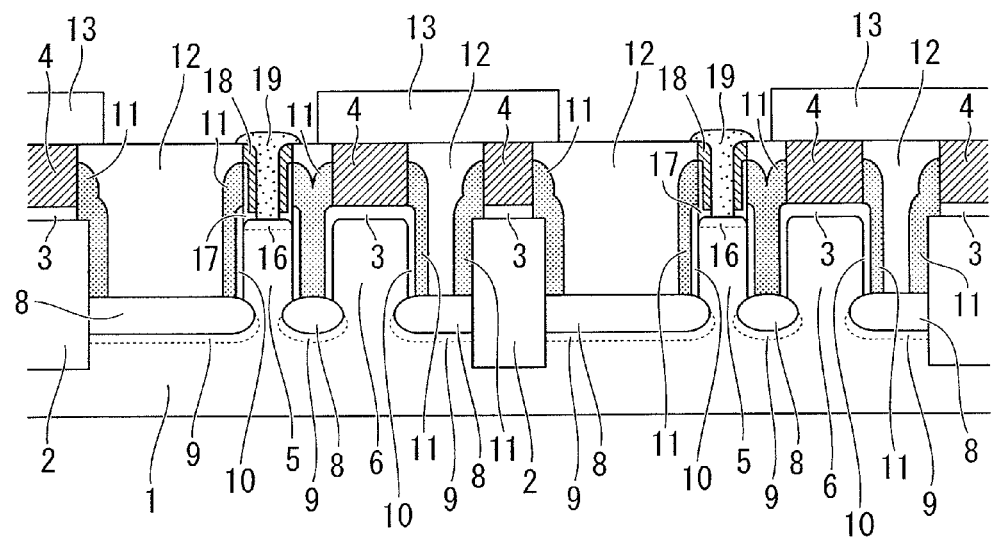

With reference to FIG. 3O, silicon plugs 19 are selectively grown on the exposed surfaces of the silicon pillars 5 by using a selective epitaxial growth. An ion-implantation is carried out to introduce ions into the silicon plugs 19, thereby allowing the silicon plugs 19 to perform as additional diffusion regions combined with the second diffusion regions 16. When the transistor is an n-type transistor, n-type ions such as arsenic are introduced into the silicon plugs 19, so that the silicon plugs 19 perform as additional n-doped diffusion regions combined with the second diffusion regions 16.

Figure 3P:
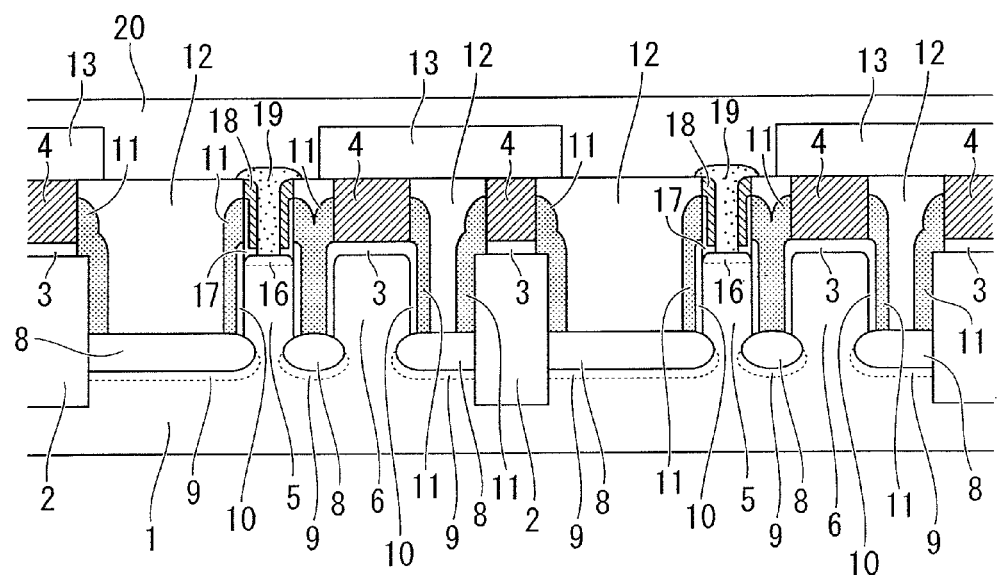

With reference to FIG. 3P, a second inter-layer insulator 20 is formed which extends over the first inter-layer insulator 12, the silicon plugs 19, and the oxide masks 13.

Figure 3Q:
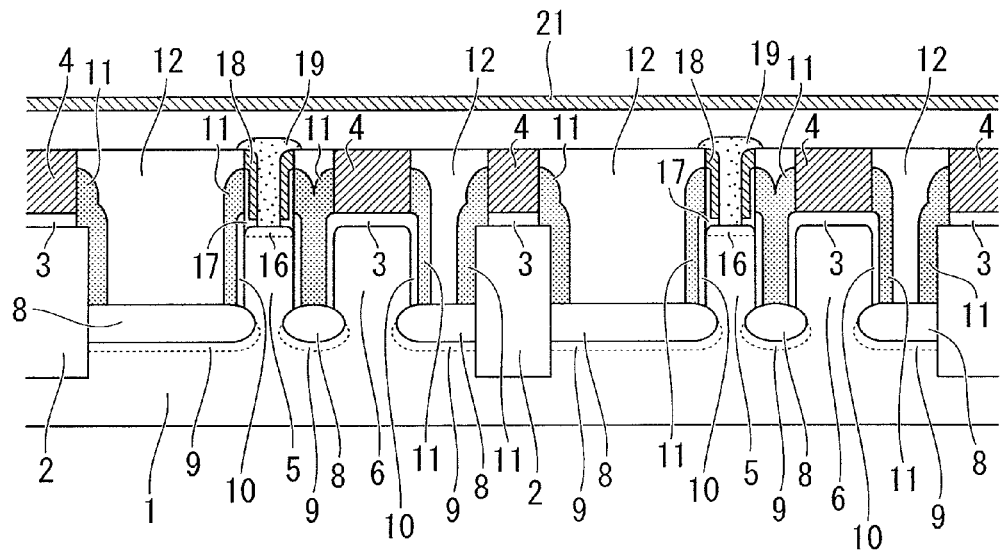

With reference to FIG. 3Q, a stopper nitride film 21 is formed over the second inter-layer insulator 20. In some cases, the stopper nitride film 21 may have a thickness of about 20 nm.

Figure 3R:
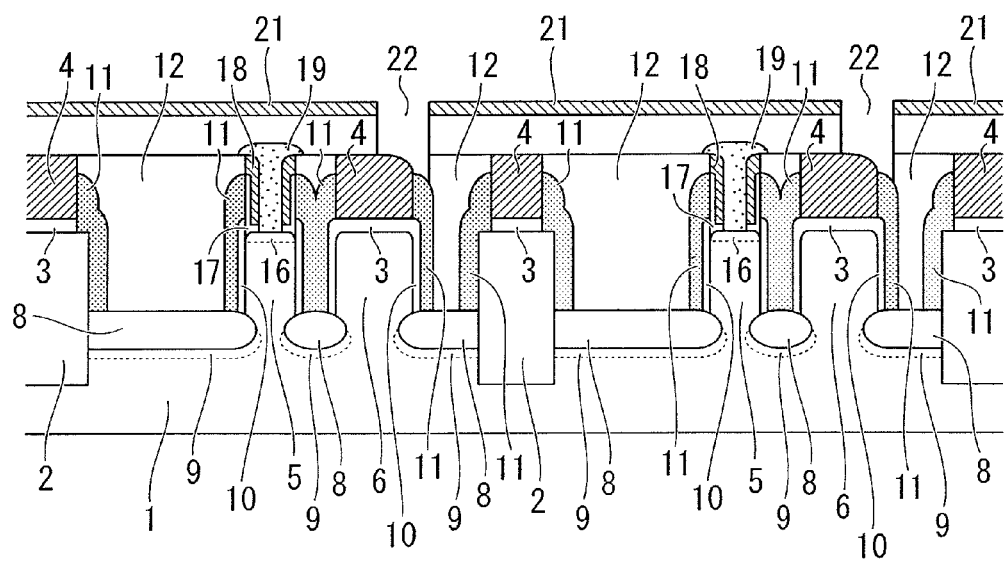

With reference to FIG. 3R, a resist film is applied on the stopper nitride film 21. A lithography process is carried out to form a resist pattern over the stopper nitride film 21. An anisotropic etching process is carried out to selectively remove the stopper nitride film 21, the second inter-layer insulator 20, and the first inter-layer insulator 12, thereby forming contact holes 22 which reach the top portions of the nitride masks 4 and the top portions of the gate electrodes 11, wherein the nitride masks 4 and the gate electrodes 11 are disposed near the silicon pillars 6. The contact holes 22 are positioned over the silicon pillars 6 in the first and second active regions A and B. The contact holes 22 are slightly displaced from the silicon pillars 6, but the contact holes 22 vertically and partially overlap the silicon pillars 6. The process for forming the contact holes 22 also etch slightly the nitride masks 4 and the gate electrodes 11, but does not etch the silicon pillars 6.

Figure 3S:
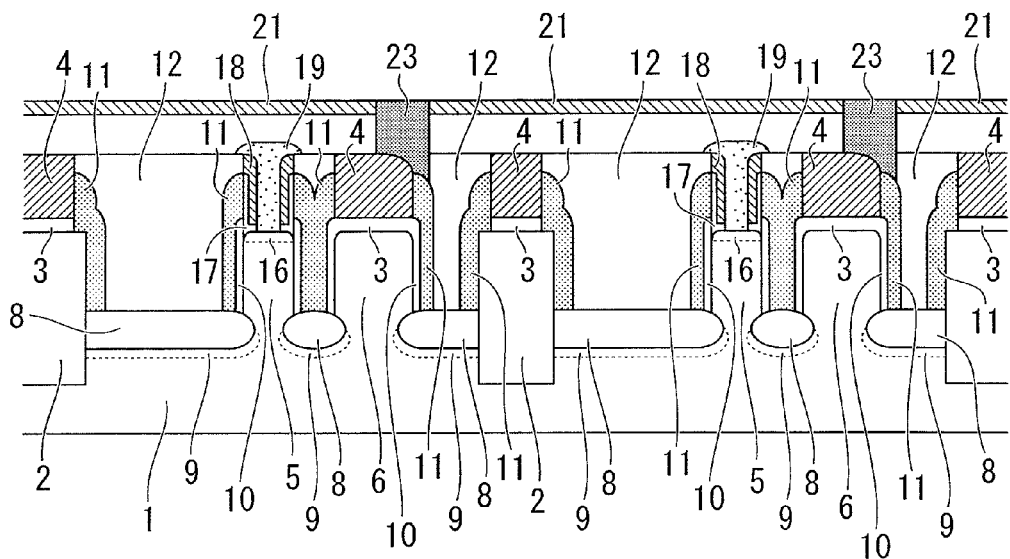

With reference to FIG. 3S, metal contact plugs 23 are formed in the contact holes 22. The metal contact plugs 23 contact the nitride masks 4 and the gate electrodes 11. The metal contact plugs 23 are electrically connected to the gate electrodes 11. In some cases, the metal contact plugs 23 may be implemented by a multi-layered metal structure, for example, a stack of a tungsten film (W), a titanium nitride film (TiN), and a titanium film (Ti).

Figure 3T:
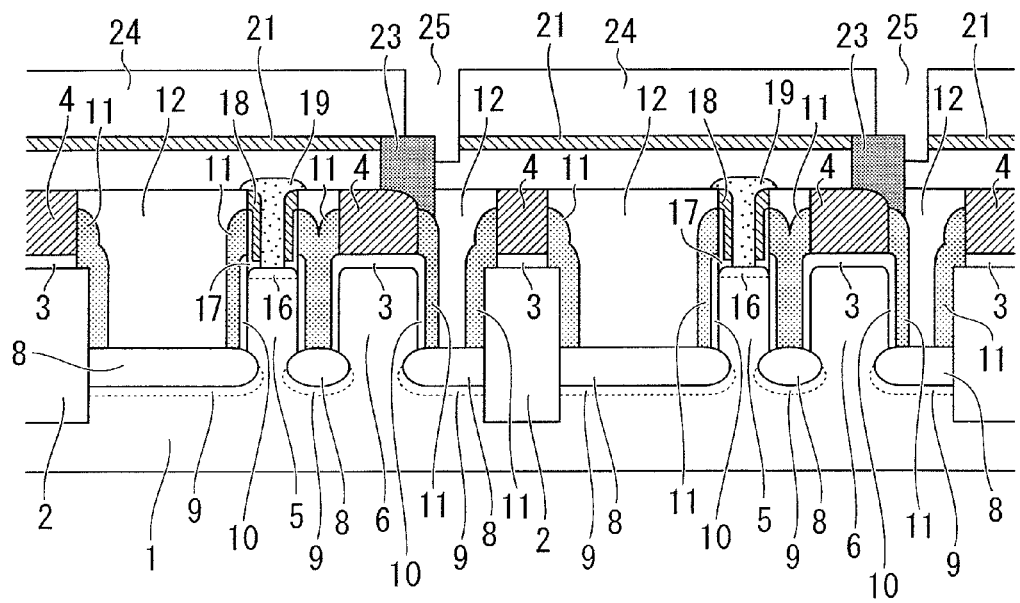

With reference to FIG. 3T, a third inter-layer insulator 24 is formed over the metal contact plugs 23 and the stopper nitride film 21. In some cases, the third inter-layer insulator 24 may have a thickness of about 150 nm. A resist film is applied on the third inter-layer insulator 24. A lithography process is carried out to form a resist pattern over the third inter-layer insulator 24. An anisotropic etching process is carried out to selectively etch the third inter-layer insulator 24, and the stopper nitride film 21, and slightly etch the second inter-layer insulator 20, thereby forming a gate groove 25. The gate groove 25 reaches the top portions of the metal contact plugs 23 that are positioned over the silicon pillars 6. The top portions of the metal contact plugs 23 are exposed. As shown in FIG. 2, the gate groove 25 runs in inverse-U shape. Namely, the gate groove 25 has first and second portions which extend in Y-direction and a third portion which extends in X-direction, wherein the third portion communicates between the first and second portions. The first portion of the gate groove 25 partially extends over the first active region A. The second portion of the gate groove 25 partially extends over the second active region B. The third portion of the gate groove 25 extends over the shallow trench isolation 2. The first portion of the gate groove 25 extends across over the contact plug 23 in the first active region A. The second portion of the gate groove 25 extends across over the contact plug 23 in the second active region B.

Figure 3U:
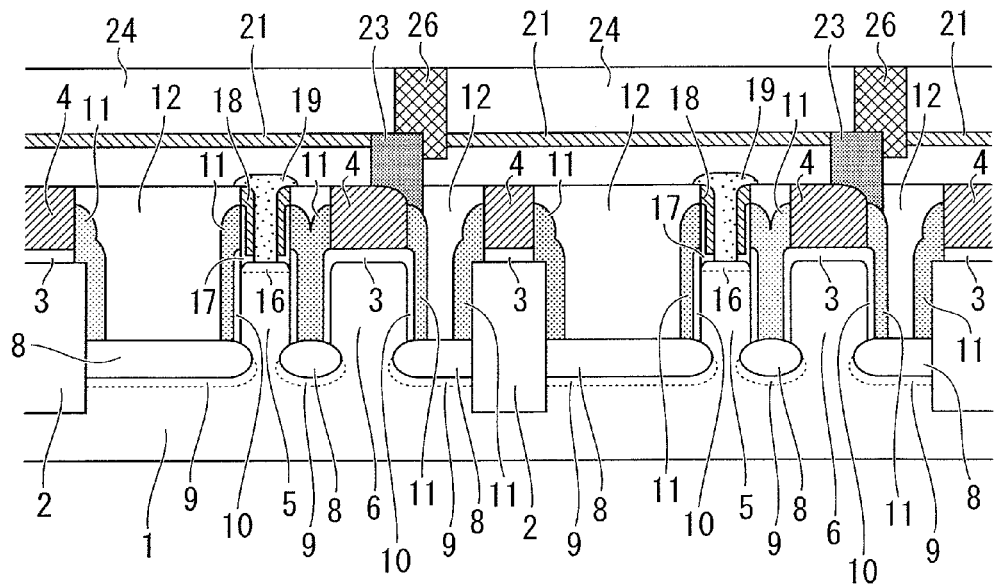

With reference to FIG. 3U, a first-level interconnection 26 is formed in the gate groove 25. The first-level interconnection 26 runs in inverse-U shape. Namely, the first-level interconnection 26 has first and second portions which extend in Y-direction and a third portion which extends in X-direction, wherein the third portion communicates between the first and second portions. The first portion of the first-level interconnection 26 partially extends over the first active region A. The second portion of the first-level interconnection 26 partially extends over the second active region B. The third portion of the first-level interconnection 26 extends over the shallow trench isolation 2. The first portion of the first-level interconnection 26 is electrically connected through the contact plug 23 to the gate electrode 11 which surrounds both the first and third silicon pillars 5 and 6 in the first active region A. Namely, the first portion of the first-level interconnection 26 is electrically connected through the contact plug 23 to the gate electrode 11 of the first unit transistor 50 in the first active region A. The second portion of the first-level interconnection 26 is electrically connected through the contact plug 23 to the gate electrode 11 which surrounds both the second and fourth silicon pillars 5 and 6 in the second active region B. Namely, the second portion of the first-level interconnection 26 is electrically connected through the contact plug 23B to the gate electrode 11 of the second unit transistor 50B in the second active region B. The first-level interconnection 26 electrically interconnects the gate electrodes 11 of the first and second unit transistors 50A and 50B in the first and second active regions A and B.

Figure 3V:
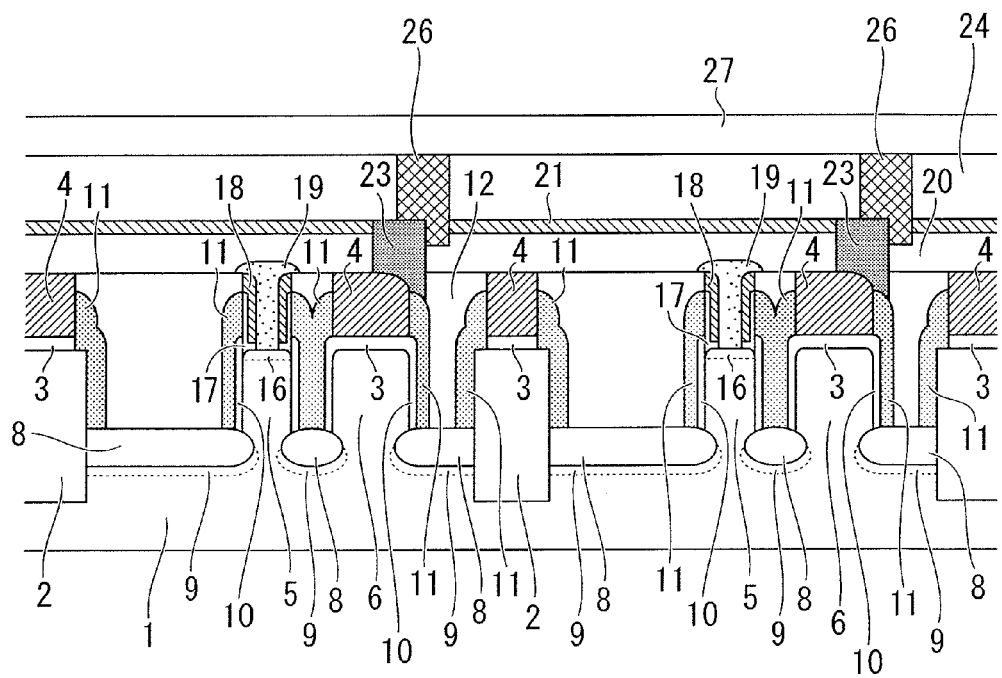

With reference to FIG. 3V, a fourth inter-layer insulator 27 is formed over the first-level interconnection 26 and the third inter-layer insulator 24.

Figure 3W:
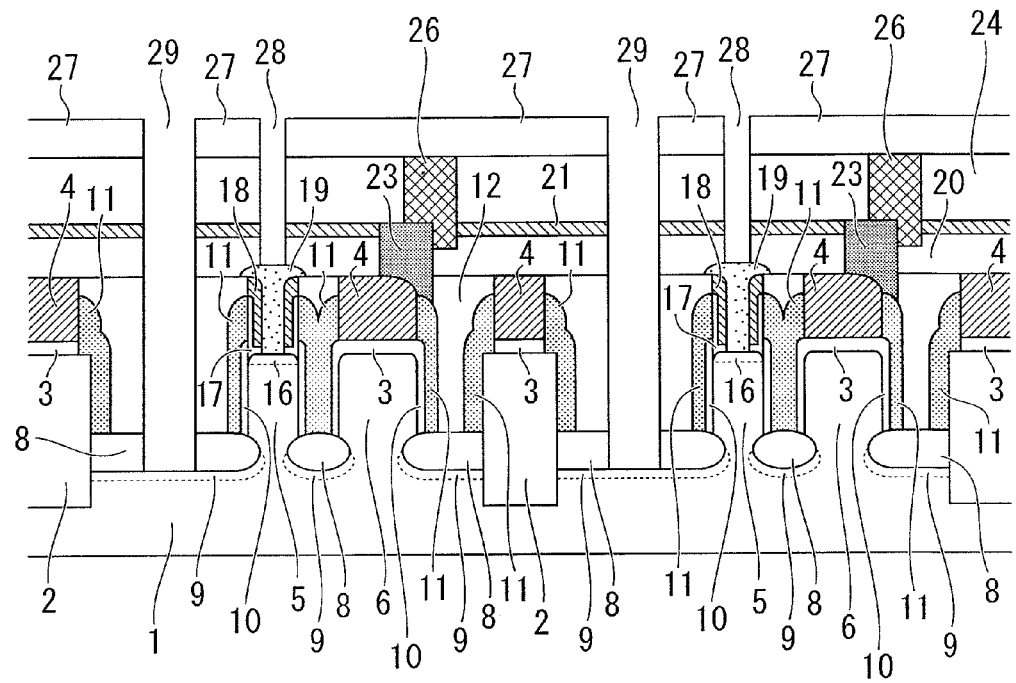

With reference to FIG. 3W, a resist film is applied on the fourth inter-layer insulator 27. A lithography process is carried out to form a resist pattern over the fourth inter-layer insulator 27. An anisotropic etching process is carried out to selectively etch the fourth inter-layer insulator 27, the third inter-layer insulator 24, the stopper nitride film 21, and the second inter-layer insulator 20, thereby forming contact holes 28. The contact holes 28 reach the top portions of the silicon plugs 19 that are positioned over the silicon pillars 5. The top portions of the silicon plugs 19 are exposed. Contact holes 29 are formed, which reach the first diffusion regions 9 under the insulating films 8. The first diffusion regions 9 are partially exposed. As shown in FIG. 2, but not illustrated in FIG. 3W, a contact hole 41 is formed which reaches the first-level interconnection 26. In some cases, the contact holes 28, 29, and 41 may be formed by the same lithography process and subsequent anisotropic etching process. In other cases, the contact holes 28, the contact holes 29, and the contact hole 41 may be formed by different lithography processes and subsequent anisotropic etching processes.

Figure 3X:
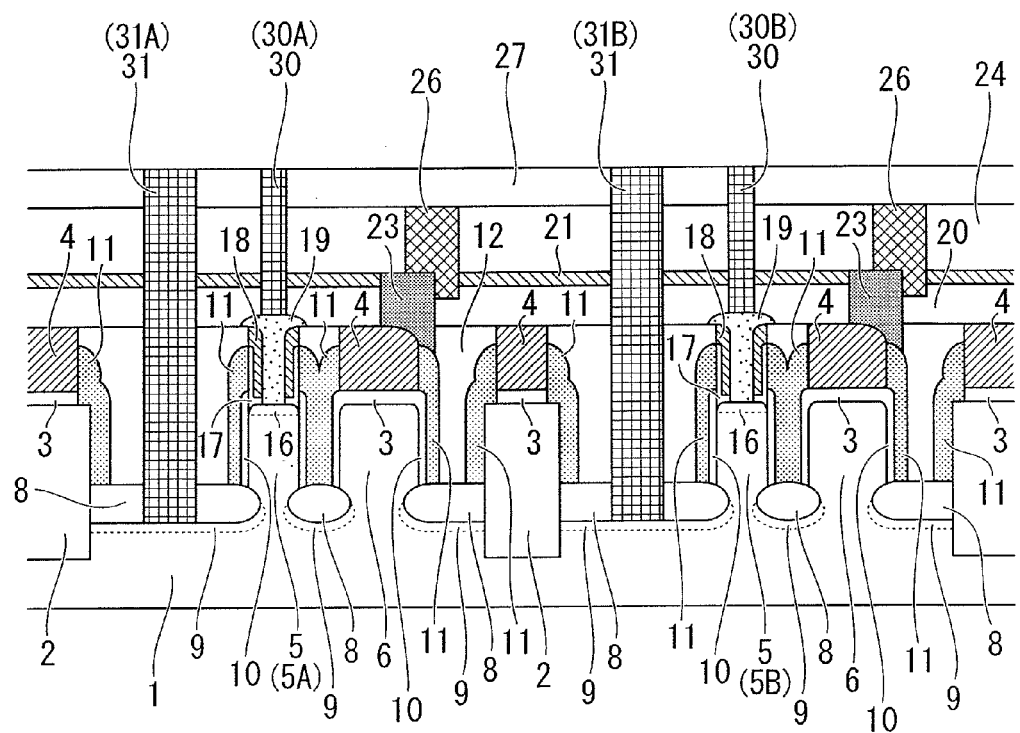

With reference to FIG. 3X, metal contact plugs 30 and 31 are formed in the contact holes 28, 29, and 41. The metal contact plug 30A is formed in the contact hole 28 that reaches the top portion of the silicon plug 19 that is positioned over the silicon pillar 5A in the first active region A. The metal contact plug 30B is formed in the contact hole 28 that reaches the top portion of the silicon plug 19 that is positioned over the silicon pillar 5B in the second active region B. The metal contact plug 31A is formed in the contact hole 29 that reaches the first diffusion region 9 in the first active region A. The metal contact plug 31B is formed in the contact hole 29 that reaches the first diffusion region 9 in the second active region B. The metal contact plug that is not illustrated is formed in the contact hole 41 that reaches the first-level interconnection 26. In some cases, the metal contact plugs 30 and 31 may be implemented by a multi-layered metal structure, for example, a stack of a tungsten film (W), a titanium nitride film (TiN), and a titanium film (Ti).

With reference again to FIGS. 1 and 2, second-level interconnections 32, 33, 34 and 42 are formed over the fourth inter-layer insulator 27. The second-level interconnections 32, 33, 34 and 42 may be made of a multi-layered metal structure, for example, a stack of a tungsten film (W) and a tungsten nitride film (WN). The metal contact plug 31A connects the first diffusion region 9 in the first active region A and the second-level interconnection 34. The metal contact plug 30B connects the contact plug 19 in the second active region B and the second-level interconnection 32. The second-level interconnection 33 connects the metal contact plug 30A in the first active region A and the metal contact plug 31b in the second active region B. The first and second unit transistors 50A and 50B are positioned in the first and second active regions A and B respectively. The first and second unit transistors 50A and 50B are laid out in series.

The semiconductor device described above will provide the following effects.

First, the channel region of the high voltage transistor is implemented by the twin silicon pillars 5 and 6 that are connected in series to each other. The channel length between the source and drain regions of the high voltage transistor substantially corresponds to two times the height of the silicon pillars 5. The low voltage transistor that is not illustrated has the channel region that is implemented by the single pillar. The channel length between the source and drain regions of the high voltage transistor substantially corresponds to the height of the single pillar. Thus, the high voltage transistor is longer in channel length than the low voltage transistor. The high voltage transistor has the high voltage performances, while the low voltage transistor has the low voltage performances, even both the high and low voltage transistors are implemented by the uniform height silicon pillars with relatively simple manufacturing processes.

Second, the gap between the silicon pillars 5 and 6 is approximately equal to or less than two times the thickness of the gate electrode 11 so that the gap is completely filled up with the gate electrode 11. Filling the gap completely with the gate electrode film causes no disconnection of the gate electrode 11 at the gap when the gate electrode 11 is patterned by an etch-back process. The single gate electrode 11 extends over the twined silicon pillars 5 and 6. Reduction to the gap between the silicon pillars 5 and 6 might contribute scaling down in the semiconductor device.

Third, the silicon pillar 6 and the mask nitride film 4 form a projecting spacer that increases the height of the gate electrode 11. Increasing the height of the gate electrode 11 decreases the aspect ratio of the contact plug 23 which connects the gate electrode 11 and the first-level interconnection 26. Decreasing the aspect ratio of the contact plug 23 is suitable for further shrinkage of the semiconductor device.

In this embodiment, the high voltage transistor is implemented by the twined unit transistors 50. There is no limitation to the number of unit transistors that configure the single high voltage transistor. It is possible as a modification that three or more unit transistors are electrically connected to each other, in order to form a single high voltage transistor that is implemented by the three or more unit transistors. The source and drain of the unit transistors are connected through the second-level interconnection, while the gate electrodes of the unit transistors are connected through the first-level interconnection. When each high voltage transistor is implemented by the three or more unit transistors, it is possible that the low voltage transistor is implemented by a less number of the unit transistor or transistors than the number of the high voltage transistors that configure each high voltage transistor. The numbers of the unit transistors that configure each high voltage transistor is greater than the number of the unit transistors that configure each low voltage transistor. Namely, each high voltage transistor is longer in channel length than each low voltage transistor. If each low voltage transistor is implemented by two or more unit transistors but less than the number of unit transistors that configured each high voltage transistor, the two or more unit transistors constituting each low voltage transistor can be eclectically connected in the same manner as those that configure each high voltage transistor.

In this embodiment, the source of the first unit transistor 50A in the first active region A is electrically connected through the second-level interconnection 33 to the drain of the second unit transistor 50B in the second active region B. There is no limitation to this connection between the source of the first unit transistor 50A and the drain of the second unit transistor 50B. It is possible as a modification that the drain of the first unit transistor 50A in the first active region A is electrically connected through any interconnection to the source of the second unit transistor 50B in the second active region B.

Second Embodiment

Figure 4:
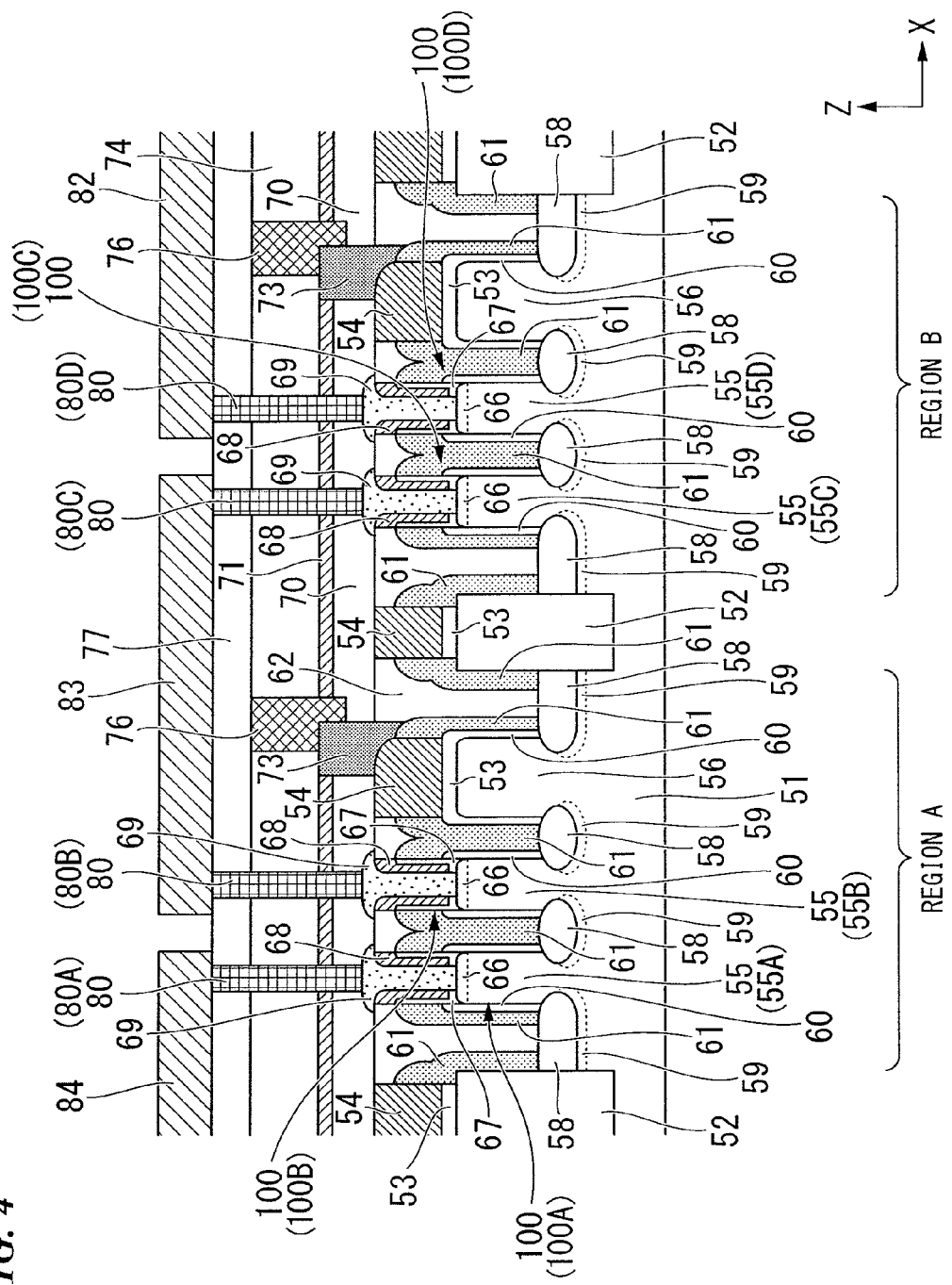
FIG. 4 is a fragmentary cross sectional elevation view illustrating a semiconductor device in accordance with a second preferred embodiment of the present invention.

A semiconductor device will be described in accordance with a second preferred embodiment of the present invention. The semiconductor device includes an integration of high voltage transistors and low voltage transistors. The high voltage transistors are designed to operate with higher driving voltage than driving voltage for driving the low voltage transistors. FIG. 4 shows only the high voltage transistors but does not illustrate the low voltage transistors.

Figure 5:
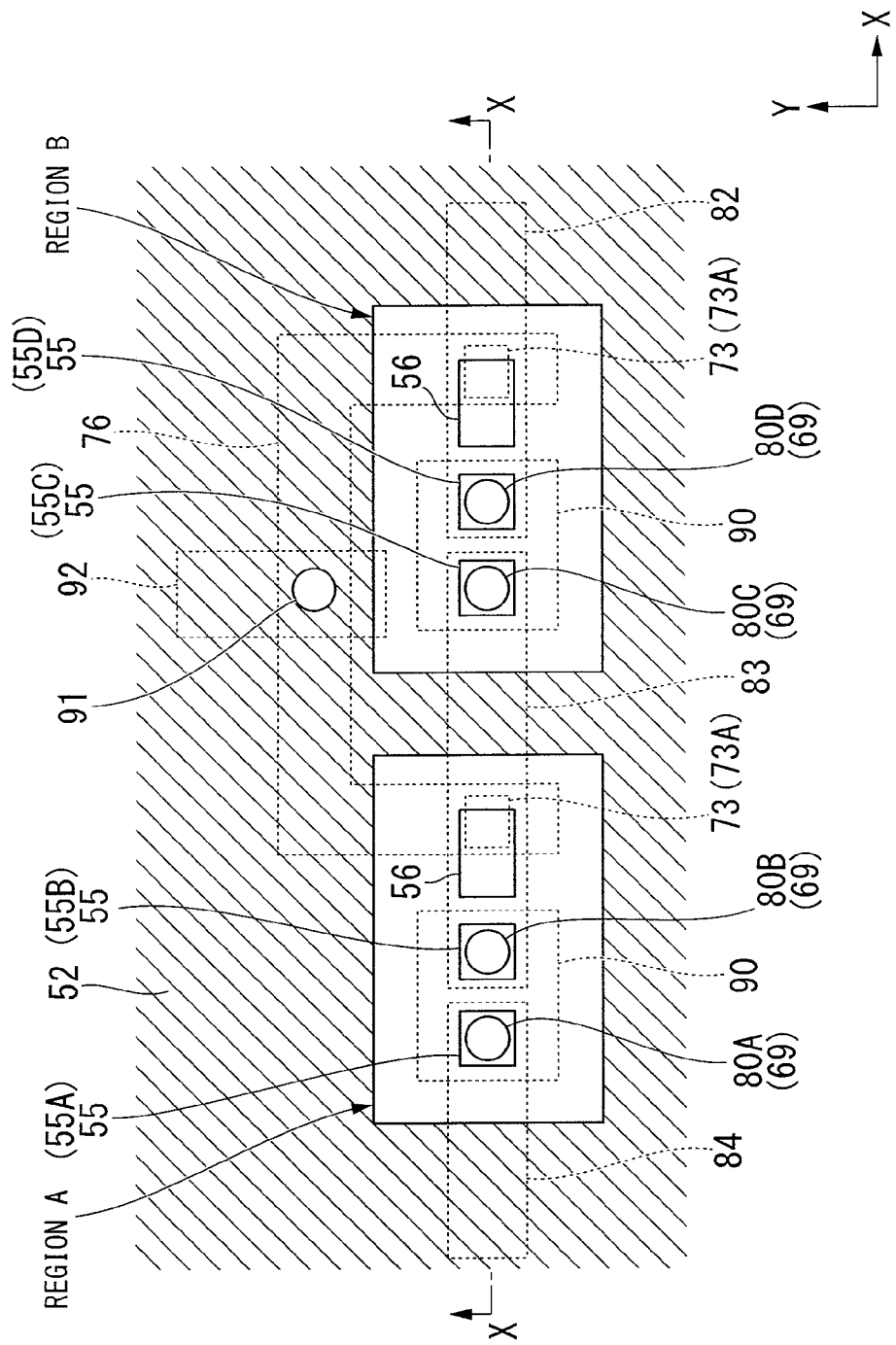
FIG. 5 is a fragmentary plan view illustrating the semiconductor device shown in FIG. 4 that is the fragmentary cross sectional elevation view, taken along an X-X line of FIG. 4.

With reference to FIGS. 4 and 5, a shallow trench isolation 52 is selectively provided in an upper region of a silicon substrate 51. The shallow trench isolation 52 defines first and second active regions A and B. The first active region A includes first and second unit transistors 100A and 100B. The first unit transistor 100A has a first silicon pillar 55A. The second unit transistor 100B has a second silicon pillar 55B. The second silicon pillar 55B may be positioned at the center of the first active region A. The second active region B includes third and fourth unit transistors 100C and 100D. The third unit transistor 100C has a third silicon pillar 55C. The fourth unit transistor 100D has a fourth silicon pillar 55D. The fourth silicon pillar 55D may be positioned at the center of the second active region B. The first, second, third and fourth silicon pillars 55A, 55B, 55C and 55D provide channel regions that vertically extend from the surface of the silicon substrate 51. The first, second, third and fourth silicon pillars 55A, 55B, 55C and 55D in the first and second active regions A and B have substantially the same height. The first, second, third and fourth silicon pillars 55A, 55B, 55C and 55D have horizontal dimensions which allow complete depletion.

The first, second, third and fourth silicon pillars 55A, 55B, 55C and 55D each have top and bottom portions. A first diffusion region 59 may be disposed in a shallower region of each of the silicon substrate 51. The first diffusion region 59 may be positioned near the bottom portion of each of the first, second, third and fourth silicon pillars 55A, 55B, 55C and 55D. A second diffusion region 66 may be disposed over the top portion of each of the first, second, third and fourth silicon pillars 55A, 55B, 55C and 55D. The first diffusion region 59 may perform as a drain region. The second diffusion region 66 may perform as a source region. Each of the first, second, third and fourth silicon pillars 55A, 55B, 55C and 55D has a body that is positioned above the first diffusion region 59 and below the second diffusion region 66. The body of each of the first, second, third and fourth silicon pillars 55A, 55B, 55C and 55D has side walls which are covered with a gate insulating film 60. The body of each of the first, second, third and fourth silicon pillars 55A, 55B, 55C and 55D provides a channel between the first and second diffusion regions 59 and 66 that perform as the drain and source, respectively. A gate electrode 61 is disposed on the gate insulating film 60. The gate electrode 61 horizontally surrounds the body of each of the first, second, third and fourth silicon pillars 55A, 55B, 55C and 55D. Each of the first, second, third and fourth silicon pillars 55A, 55B, 55C and 55D has the channel that vertically extends along the gate insulating film 60.

Fifth and sixth silicon pillars 56 may be disposed in the first and second active regions A and B. The fifth silicon pillar 56 may be positioned near the second silicon pillar 55B. The fifth silicon pillar 56 may be separated from the second silicon pillar 55B. The sixth silicon pillar 56 may be positioned near the fourth silicon pillar 55D. The sixth silicon pillar 56 may be separated from the fourth silicon pillar 55D. The first, second, third, fourth fifth and sixth silicon pillars 55A, 55B, 55C, 55D, and 56 can be formed by selectively etching the silicon substrate 51. The first, second, third and fourth silicon pillars 55A, 55B, 55C and 55D provide channels of the first and second unit transistors 50A and 50B in the first and second active regions A and B. The fifth and sixth silicon pillars 56 fail to provide any channel. The fifth and sixth silicon pillars 56 provide projecting spacers that allow increasing the height of the gate electrode 61. Increasing the height of the gate electrode 61 reduces the distance between the gate electrode 61 and first level interconnections 76. The fifth and sixth silicon pillars 56 may be regarded as lifting up the top portion of the gate electrode 61 so as to reduce the distance between the gate electrode 61 and the first level interconnection 76. As described above the first, second and fifth silicon pillars 55A, 55B and 56 are separated from each other. The third, fourth and sixth silicon pillars 55C, 55D and 56 are separated from each other. The gap between the first and second silicon pillars 55A and 55B may be approximately equal to or smaller than two times the thickness of the gate electrode 61. The gap between the second and fifth silicon pillars 55B and 56 may be approximately equal to or smaller than two times the thickness of the gate electrode 61. The gap between the third and fourth silicon pillars 55C and 55D may be approximately equal to or smaller than two times the thickness of the gate electrode 61. The gap between the second and fifth silicon pillars 55D and 56 may be approximately equal to or smaller than two times the thickness of the gate electrode 61.

Each of the first, second, third, fourth, fifth and sixth silicon pillars 55A, 55B, 55C, 55D and 56 may be constituted by any types of a portion of silicon which generally extends in the direction that is vertical to the surface of the silicon substrate 51, but is not limited to the shape thereof as defined in mathematics.

The pillars 55A, 55B, 55C, and 55D are typical examples, but not limited thereto, which can implement a vertically extending portion of semiconductor over the substrate. The vertically extending portion of semiconductor provides a channel for the unit transistor. The pillars 56 are typical examples, but not limited thereto, which can implement a vertically projecting spacer of semiconductor over the substrate. The vertically projecting spacer of semiconductor allows increasing the height of the gate electrode to reduce the distance between the gate electrode and the first-level interconnection.

An insulating film 58 extends over the surface of the silicon substrate 51. The insulating film 58 surrounds the bottom portion of each of the first, second, third, fourth, fifth and sixth silicon pillars 55A, 55B, 55C, 55D and 56. The insulating film 58 reaches the shallow trench isolation 52. The insulating film 58 may be made of silicon oxide. The first diffusion region 59 extends under the insulating film 58, so that the first diffusion region 59 vertically overlaps the insulating film 58. The first diffusion region 59 is electrically separated by the insulating film 58 from the gate electrode 61. The first diffusion region 59 performs as the drain of each of the first, second, third and fourth unit transistors 100A, 100B, 100C and 100D. The bottom of the shallow trench isolation 52 is deeper than the first diffusion region 59. The shallow trench isolation 52 electrically separates the first diffusion regions 59 from each other in the first and second active regions A and B. In the first active region A, the first diffusion region 59 performs as a common drain region for the first and second unit transistors 100A and 100B. In the second active region B, the first diffusion region 59 performs as another common drain region for the third and fourth unit transistors 100C and 100D.

The gate insulating film 60 covers the side walls of the first, second, third, fourth, fifth and sixth silicon pillars 55A, 55B, 55C, 55D and 56. An insulating film 53 extends over the top portions of the fifth and sixth silicon pillars 56. A hard mask film 54 also extends over the insulating film 53 that extends over the top portions of the fifth and sixth silicon pillars 56. The gate electrodes 61 extend along the gate insulating film 60, so that the gate electrodes 61 horizontally surround the first, second, third, fourth, fifth and sixth silicon pillars 55A, 55B, 55C, 55D and 56. The gate electrodes 61 further extend along the side walls of the insulating film 53 and the hard mask film 54, both of which are stacked over the top portions of the fifth and sixth silicon pillars 56. The gate electrodes 61 are electrically separated by the gate insulating film 60 from the first, second, third, fourth, fifth and sixth silicon pillars 55A, 55B, 55C, 55D and 56.

The insulating film 53 also extends over the shallow trench isolation 52. The insulating film 53 may be made of silicon oxide. The hard mask film 54 also extends over the insulating film 53. The hard mask film 54 may be made of silicon nitride. The gate electrode 61 also extends along the inside walls of the shallow trench isolation 52, the inside walls of the insulating film 53 over the shallow trench isolation 52, and the inside walls of the hard mask film 54 over the insulating film 53. The gate insulating film 60 covers the top surface and side walls of the first, second, third and fourth silicon pillars 55A, 55B, 55C and 55D. The gate insulating film 60 reaches the insulating film 58. The channel regions of the first, second, third and fourth silicon pillars 55A, 55B, 55C and 55D, and the first and second diffusion regions 59 and 66 are electrically separated from the gate electrodes 61 by the gate insulating film 60 and the insulating film 58.

In the first active region A, the gate electrode 61 fills up the gap between the first and second silicon pillars 55A and 55B as well as fills up the other gap between the second and fifth silicon pillars 55B and 56. In the second active region B, the gate electrode 61 fills up the gap between the third and fourth silicon pillars 55C and 55D as well as fills up the other gap between the fourth and sixth silicon pillars 55D and 56. In the first active region A, the gate electrode 61 covers a set of the first, second and fifth silicon pillars 55A, 55B and 56. In the second active region B, the gate electrode 61 covers another set of the third, fourth and sixth silicon pillars 55C, 55D and 56.

In the first active region A, the gap between the first and second silicon pillars 55A and 55B may be approximately equal to or smaller than two times the thickness of the gate electrode 61 so that the gap between the gap between the first and second silicon pillars 55A and 55B is filled up with the gate electrode 61. The other gap between the second and fifth silicon pillars 55B and 56 may be approximately equal to or smaller than two times the thickness of the gate electrode 61 so that the other gap between the second and fifth silicon pillars 55B and 56 is filled up with the gate electrode 61. Namely, the gate electrode 61 has a gap-filling portion that fills up the gap between the first and second silicon pillars 55A and 55B as well as the other gap between the second and fifth silicon pillars 55B and 56. The gap-filling portion of the gate electrode 61 performs as a common gate electrode to the first, second and fifth silicon pillars 55A, 55B and 56.

In the second active region B, the gap between the third and fourth silicon pillars 55C and 55D may be approximately equal to or smaller than two times the thickness of the gate electrode 61 so that the gap between the gap between the third and fourth silicon pillars 55C and 55D is filled up with the gate electrode 61. The other gap between the fourth and sixth silicon pillars 55D and 56 may be approximately equal to or smaller than two times the thickness of the gate electrode 61 so that the other gap between the fourth and sixth silicon pillars 55D and 56 is filled up with the gate electrode 61. Namely, the gate electrode 61 has a gap-filling portion that fills up the gap between the third and fourth silicon pillars 55C and 55D as well as the other gap between the fourth and sixth silicon pillars 55D and 56. The gap-filling portion of the gate electrode 61 performs as a common gate electrode to the third, fourth and sixth silicon pillars 55C, 55D and 56.

The insulating film 53 extends over the shallow trench isolation 52, and the first, second, third, fourth, fifth and sixth silicon pillars 55A, 55B, 55C, 55D and 56. The hard mask film 54 extends over the insulating film 53 that extends over the shallow trench isolation 52, and the fifth and sixth silicon pillars 56. A first inter-layer insulator 62 covers the gate electrodes 61 and the insulating film 58. The first inter-layer insulator 62 also extends on the side walls of the shallow trench isolation 52, the insulating film 53 and the hard mask film 54. The top portions of the hard mask films 54 are leveled to the top surface of the first inter-layer insulator 62. A second inter-layer insulator 70 extends over the first inter-layer insulator 62 and the hard mask films 54. A stopper nitride film 71 extends over the second inter-layer insulator 70. A third inter-layer insulator 74 extends over the stopper nitride film 71.

The first-level interconnection 76 extends over the second inter-layer insulator 70 in each of the first and second active regions A and B. The first-level interconnection 76 runs through a groove which penetrates the third inter-layer insulator 74 and the stopper nitride film 71. A contact plug 73 is disposed in each of the first and second active regions A and B. The contact plug 73 may be made of a metal. The contact plug 73 penetrates the stopper nitride film 71, the second inter-layer insulator 70 and the first inter-layer insulator 62. The contact plug 73 reaches the gate electrode 61. The contact plug 73 also reaches the first-level interconnection 76. The first-level interconnection 76 is electrically connected through the contact plug 73 to the gate electrode 61 in each of the first and second active regions A and B. The contact plug 73 partially overlaps the first-level interconnection 76.

The insulating film 53 extends over the top portion of each of the first, second, third, fourth, fifth and sixth silicon pillars 55A, 55B, 55C, 55D and 56. The nitride hard mask 54 extends over the insulating film 53. The contact plug 73 is connected to the top portion of the gate electrode 61 that is adjacent to the side wall of the hard mask film 54. The hard mask films 54 perform as additional spacers to the fifth and sixth silicon pillars 56. The hard mask films 54 in combination with the fifth and sixth silicon pillars 56 provide projecting spacers that allow increasing the height of the gate electrode 61. Increasing the height of the gate electrode 61 reduces the distance between the gate electrode 61 and the first level interconnections 76.

The first level interconnections 76 partially and vertically overlap the contact plug 73. The first level interconnections 76 have bottom portions which are buried in shallower portions of the second inter-layer insulator 70. The bottom portion of the first level interconnection 76 covers the side wall of the top portion of the contact plug 73. The first level interconnection 76 extends across over the shallow trench isolation 52. The first level interconnection 76 extends between the contact plugs 73. Adjacent gate electrodes 61 that are separated by the shallow trench isolation 52 are also electrically connected to each other through the first level interconnection 76.

A fourth inter-layer insulator 77 extends over the third inter-layer insulator 74 and the first level interconnections 76. Second-level interconnections 82, 83 and 84 extend over the fourth inter-layer insulator 77. The second-level interconnections 82, 83 and 84 may be made of a metal. The second-level interconnection 83 has the first end which is connected to a contact plug 80C in the second active region B. The contact plug 80C may be made of a metal. The contact plug 80C penetrates the fourth inter-layer insulator 77, the third inter-layer insulator 74, the stopper nitride film 71, the second inter-layer insulator 70. The contact plug 80C reaches a contact plug 69 that is positioned over the third silicon pillar 55C in the second active region B. The second-level interconnection 83 has the second end which is connected to a contact plug 80B in the first active region A. The contact plug 80B may be made of a metal. The contact plug 80B penetrates the fourth inter-layer insulator 77, the third inter-layer insulator 74, the stopper nitride film 71, the second inter-layer insulator 70. The contact plug 80B reaches a contact plug 69 that is positioned over the second silicon pillar 55B in the first active region A. The contact plug 69 is disposed in each of the first and second active regions A and B. The contact plug 69 penetrates the first inter-layer insulator 62 and reaches the second diffusion region 66. The contact plug 69 contacts with the second diffusion region 66. The second-level interconnection 83 is electrically connected through the contact plug 80C and the contact plug 69 to the second diffusion region 66 over the third silicon pillar 55C in the second active region B. The second-level interconnection 83 is also electrically connected through the contact plug 80B and the contact plug 69 to the second diffusion region 66 over the second silicon pillar 55B in the first active region A.

The contact plug 69 may be made of impurity-doped silicon such as As-doped silicon. The contact plug 69 in combination with the second diffusion region 66 constitutes the source of each of the first and second unit transistor 100A and 100B. The contact plug 69 has a side wall which is covered with a side wall nitride film 68. The side wall nitride film 68 extends along the side wall of the contact plug 69. An oxide film 67 extends along the side wall nitride film 68. The side wall nitride film 68 combined with the oxide film 67 electrically separate the contact plug 69 from the gate electrode 61.

The second-level interconnection 84 has the first end which is connected to a contact plug 80A in the first active region A. The contact plug 80A may be made of a metal. The contact plug 80A penetrates the fourth inter-layer insulator 77, the third inter-layer insulator 74, the stopper nitride film 71, the second inter-layer insulator 70. The contact plug 80A reaches a contact plug 69 that is positioned over the first silicon pillar 55A in the first active region A. The contact plug 69 penetrates the first inter-layer insulator 62 and reaches the second diffusion region 66. The contact plug 69 contacts with the second diffusion region 66. The second-level interconnection 84 is electrically connected through the contact plug 80A and the contact plug 69 to the second diffusion region 66 over the first silicon pillar 55A in the first active region A.

The second-level interconnection 82 has the second end which is connected to a contact plug 80D in the second active region B. The contact plug 80D may be made of a metal. The contact plug 80D penetrates the fourth inter-layer insulator 77, the third inter-layer insulator 74, the stopper nitride film 71, the second inter-layer insulator 70. The contact plug 80D reaches a contact plug 69 that is positioned over the fourth silicon pillar 55D in the second active region B. The contact plug 69 penetrates the first inter-layer insulator 62 and reaches the second diffusion region 66. The contact plug 69 contacts with the second diffusion region 66. The second-level interconnection 82 is electrically connected through the contact plug 80D and the contact plug 69 to the second diffusion region 66 over the fourth silicon pillar 55D in the second active region B.

As shown in FIG. 5, the shallow trench isolation 52 defines the first and second active regions A and B. In some cases, the first and second active regions A and B may be rectangle in plan view. In some cases, the first, second, third and fourth silicon pillars 55A, 55B, 55C and 55D may be positioned at the centers of the first and second active regions A and B. The first, second, third and fourth silicon pillars 55A, 55B, 55C and 55D may be, but are not limited to, rectangle in plan view. The first, second, third and fourth silicon pillars 55A, 55B, 55C and 55D provide channels for the first, second, third and fourth unit transistors 100A, 100B, 100C and 100D. The first and second unit transistors 100A and 100B are disposed in the first active region A. The third and fourth unit transistors 100C and 100D are disposed in the second active region B. Each high voltage transistor included in the semiconductor device can be implemented by a set of the first, second, third and fourth unit transistors 100A, 100B, 100C and 100D in the first and second active regions A and B. It is possible as a modification that each of the first and second active regions A and B has a matrix array of silicon pillars 55, each of which provides a channel. In this case, the gate electrode 61 covers the matrix array of silicon pillars 55 in each of the first and second active regions A and B, and the gate electrodes 61 in the first and second active regions A and B are connected through the first-level interconnection 76 to each other. In the matrix array of silicon pillars 55, gaps are defined in X-direction and Y-direction as well as diagonal-directions that has 45 degrees from X-axis or Y-axis between two adjacent silicon pillars. Those gaps may be approximately equal to or smaller than two times the thickness of the gate electrode 61.

The contact plug 69 is positioned over the first silicon pillar 55A. The contact plug 69 vertically overlaps the first silicon pillar 55A. The contact plug 80A is positioned over the contact plug 69. The contact plug 80A vertically overlaps the contact plug 69. The second-level interconnection 84 extends between the first and second active regions A and B and also extends across over the shallow trench isolation 52 between the first and second active regions A and B. The second-level interconnection 83 extends in X-direction in which the first and second active regions A and B are aligned and distanced from each other. The second-level interconnection 83 has the first end which is electrically connected through the contact plugs 80C and 69 to the second diffusion region 66 that is positioned over the third silicon pillar 55C in the second active region B. The second-level interconnection 83 has the second end which is electrically connected through the contact plugs 80B and 69 to the second diffusion region 66 that is positioned over the second silicon pillar 55B in the first active region A. The second-level interconnection 82 has the second end which is electrically connected through the contact plugs 80D and 69 to the second diffusion region 66 that is positioned over the fourth silicon pillar 55D in the first active region A. The contact plug 80A, the contact plug 69, and the first silicon pillar 55A vertically and partially overlap each other. The contact plug 80B, the contact plug 69, and the second silicon pillar 55B vertically and partially overlap each other. The contact plug 80C, the contact plug 69, and the third silicon pillar 55C vertically and partially overlap each other. The contact plug 80D, the contact plug 69, and the fourth silicon pillar 55D vertically and partially overlap each other.

The second-level interconnection 83 extends in X-direction over the first and second active regions A and B. The second-level interconnection 83 is electrically connected through the contact plugs 80B and 69 to the second diffusion region 66 over the second silicon pillar 55B of the second unit transistor 100B in the first active region A. The second-level interconnection 83 is also electrically connected through the contact plugs 80C and 69 to the second diffusion region 66 over the third silicon pillar 55C of the third unit transistor 100C in the second active region B. The second-level interconnection 83 connects in series between the second and third unit transistors 100B and 100C.

The fifth silicon pillar 56 is disposed in the first active region A. The fifth silicon pillar 56 is adjacent to the second silicon pillar 55B in X-direction. The fifth silicon pillar 56 is positioned near the set of the first and second silicon pillars 55A and 55B. It is possible as a modification that the fifth silicon pillar 56 is adjacent to a matrix array of the silicon pillars in the first active region A. The sixth silicon pillar 56 is disposed in the second active region B. The sixth silicon pillar 56 is adjacent to the fourth silicon pillar 55D in X-direction. The sixth silicon pillar 56 is positioned near the set of the third and fourth silicon pillars 55C and 55D. It is possible as a modification that the fifth silicon pillar 56 is adjacent to another matrix array of the silicon pillars in the second active region B. The fifth silicon pillar 56 may be rectangle in plan view. The contact plug 73 is positioned over the fifth silicon pillar 56. The contact plug 73 vertically and at least partially overlaps the fifth silicon pillar 56 as well as vertically and at least partially overlaps a portion of the gate electrode 61, which extends along the side wall of the gate insulating film 60 and the side wall of the hard mask film 54, wherein the gate insulating film 60 extends along the side wall of the fifth silicon pillar 56. The contact plug 73 may be rectangle in plan view.

The first-level interconnection 76 has a portion that vertically and at least partially overlaps the contact plug 73. The first-level interconnection 76 runs in inverse-U shape. Namely, the first-level interconnection 76 has first and second portions which extend in Y-direction and a third portion which extends in X-direction, wherein the third portion communicates between the first and second portions. The first portion of the first-level interconnection 76 partially extends over the first active region A. The second portion of the first-level interconnection 76 partially extends over the second active region B. The third portion of the first-level interconnection 76 extends over the shallow trench isolation 52. The first portion of the first-level interconnection 76 is electrically connected through the contact plug 73A to the gate electrode 61 which surrounds the set of the first, second and firth silicon pillars 55A, 55B and 56 in the first active region A. Namely, the first portion of the first-level interconnection 76 is electrically connected through the contact plug 73A to the gate electrode 61 of the first and second unit transistors 100A and 100B in the first active region A. The second portion of the first-level interconnection 76 is electrically connected through the contact plug 73B to the gate electrode 61 which surrounds the set of the third, fourth and sixth silicon pillars 55BC, 55D and 56 in the second active region B. Namely, the second portion of the first-level interconnection 76 is electrically connected through the contact plug 73B to the gate electrode 61 of the third and fourth unit transistors 100C and 100D in the second active region B. The first-level interconnection 76 electrically interconnects the gate electrode 61 of the first and second unit transistors 100A and 100B in the first active region A and the gate electrode 61 of the third and fourth unit transistors 100C and 100D in the second active region B.

The third portion of the first-level interconnection 76 partially overlaps a common gate line 92 that extends in Y-direction. The third portion of the first-level interconnection 76 may be also electrically connected through a contact plug 91 to the common gate line 92. The common gate line 92 is eclectically connected through the contact plug 91 and the first-level interconnection 76 to the gate electrodes 61 of the first, second, third and forth unit transistors 100A, 100B, 100C and 100D in the first and second active regions A and B. The common gate line 92 is used commonly to both the gate electrodes 61 of the first, second, third and forth unit transistors 100A, 100B, 100C and 100D in the first and second active regions A and B.

In the first active region A, the contact plug 69 is disposed over the first silicon pillar 55A. The contact plug 80A is disposed over the contact plug 69. The second-level interconnection 84 extends across over the contact plug 80A. The silicon pillar 55A, the contact plug 69, and the contact plug 80A vertically and partially overlap each other. The second-level interconnection 84 is electrically connected through the contact plugs 80A and 69 to the second diffusion region 66 that is disposed over the first silicon pillar 55A. Namely, the second-level interconnection 84 is electrically connected through the contact plugs 80A and 69 to the first unit transistor 100A.

In the first active region A, the contact plug 69 is disposed over the second silicon pillar 55B. The contact plug 80B is disposed over the contact plug 69. The second-level interconnection 83 extends across over the contact plug 80B. The silicon pillar 55B, the contact plug 69, and the contact plug 80B vertically and partially overlap each other. The second-level interconnection 83 is electrically connected through the contact plugs 80B and 69 to the second diffusion region 66 that is disposed over the second silicon pillar 55B. Namely, the second-level interconnection 83 is electrically connected through the contact plugs 80B and 69 to the second unit transistor 100B.

In the second active region B, the contact plug 69 is disposed over the third silicon pillar 55C. The contact plug 80C is disposed over the contact plug 69. The second-level interconnection 83 extends across over the contact plug 80C. The silicon pillar 55C, the contact plug 69, and the contact plug 80C vertically and partially overlap each other. The second-level interconnection 83 is electrically connected through the contact plugs 80C and 69 to the second diffusion region 66 that is disposed over the second silicon pillar 55C. Namely, the second-level interconnection 83 is electrically connected through the contact plugs 80C and 69 to the third unit transistor 100C.

In the second active region B, the contact plug 69 is disposed over the fourth silicon pillar 55D. The contact plug 80D is disposed over the contact plug 69. The second-level interconnection 82 extends across over the contact plug 80D. The silicon pillar 55D, the contact plug 69, and the contact plug 80D vertically and partially overlap each other. The second-level interconnection 82 is electrically connected through the contact plugs 80D and 69 to the second diffusion region 66 that is disposed over the second silicon pillar 55D. Namely, the second-level interconnection 82 is electrically connected through the contact plugs 80D and 69 to the fourth unit transistor 100D.

In some cases, the second-level interconnections 82 and 84 perform as common source and drain interconnections for the first, second, third and fourth unit transistors 100A, 100B, 100C and 100D. In other cases, the second-level interconnections 82 and 84 perform as common drain and source interconnections for the first, second, third and fourth unit transistors 100A, 100B, 100C and 100D.

The first, second, third, fourth, fifth and sixth silicon pillars 55A, 55B, 55C, 55D, and 56 are aligned in X-direction. The second-level interconnections 82, 83 and 84 extend in the X-direction so as to across over the alignment of the first, second, third, fourth, fifth and sixth silicon pillars 55A, 55B, 55C, 55D, and 56. It is possible as a modification to change the lay-out of the first, second, third, fourth, fifth and sixth silicon pillars 55A, 55B, 55C, 55D, and 56.

The shapes in plan view of each element included in the semiconductor device can be modified in accordance with the design requests. The shape in plan view of the first, second, third and fourth silicon pillars 55A, 55B, 55C and 55D may be, but not limited to, a circle, rectangles or other polygon. The fifth and sixth silicon pillars 56 are disposed in order to provide the projections which allow the height of the gate electrode to be increased, thereby reducing the distance between the top portion of the gate electrode 61 and the first-level interconnection 76. There is no limitation to the dimension or shape of the fifth and sixth silicon pillars 56.

Even illustration of low voltage transistors is omitted in FIGS. 4 and 5, each low voltage transistor is implemented by a single unit transistor that has the same structure as the unit transistors that configure each high voltage transistor. The low voltage transistor is configured by the single unit transistor only. There is no interconnection that interconnects the unit transistors. An etching process can be used to form the silicon pillars for the high voltage and low voltage transistors. All the silicon pillars for the high voltage and low voltage transistors have substantially the same height. Since the low voltage transistor is configured by the single unit transistor only, the channel length of the low voltage transistor corresponds to the height of the body of the silicon pillar, wherein the body of the silicon pillar is defined between the first and second diffusion regions 59 and 66. The high voltage transistor is configured by a series connection of four unit transistors having the first diffusion regions 59 which are separated by the shallow trench isolation 52. The channel length of the high voltage transistor generally corresponds to four times the height of the body of the silicon pillar, wherein the body of the silicon pillar is defined between the first and second diffusion regions 59 and 66. The high voltage transistors have higher withstand voltages than the low voltage transistors, even the silicon pillar height is uniform between the high voltage and low voltage transistors.

A typical example of a method of forming the semiconductor device that is shown in FIGS. 4 and 5 will be described with reference to FIGS. 6A through 6X, which are fragmentary cross sectional elevation views, taken along X-X line.

Figure 6A:
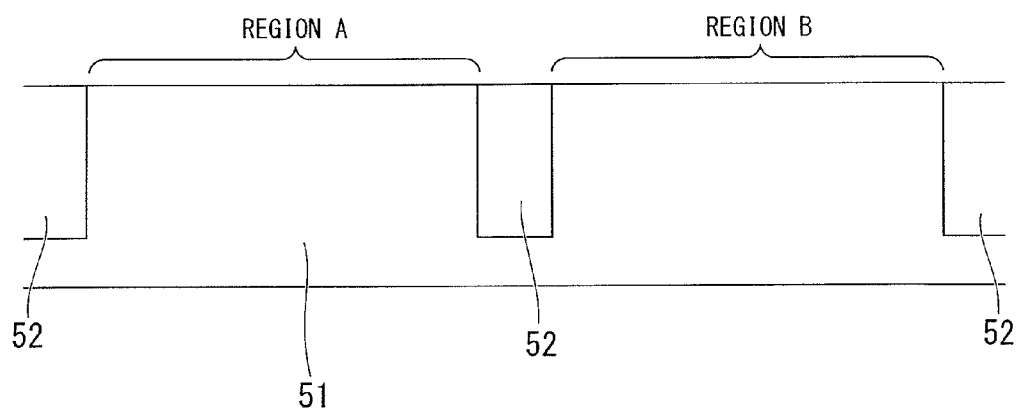
FIGS. 6A through 6X are fragmentary cross sectional elevation views illustrating sequential steps involved in a method of forming the semiconductor device shown in FIG. 4.

With reference to FIG. 6A, a shallow trench isolation 52 is selectively formed in an upper region of a silicon substrate 51. The shallow trench isolation 52 defines first and second active regions A and B. The first and second active regions A and B are separated by the shallow trench isolation 52.

Figure 6B:
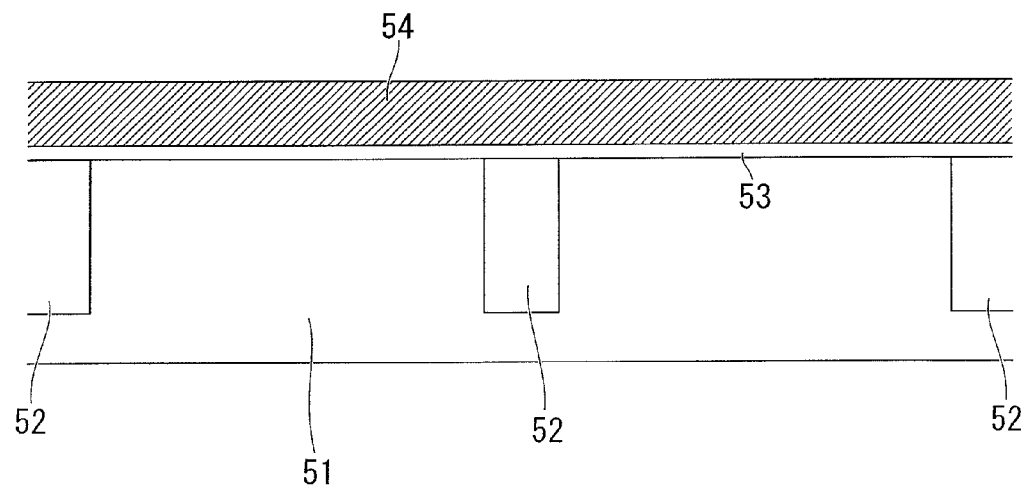

With reference to FIG. 6B, a silicon oxide film 3 is formed over the shallow trench isolation 52, and the first and second active regions A and B. In some cases, the silicon oxide film 53 may have a thickness of 10 nm. A mask nitride film 54 is formed over the silicon oxide film 53. In some cases, the mask nitride film 54 may have a thickness of 120 nm.

Figure 6C:
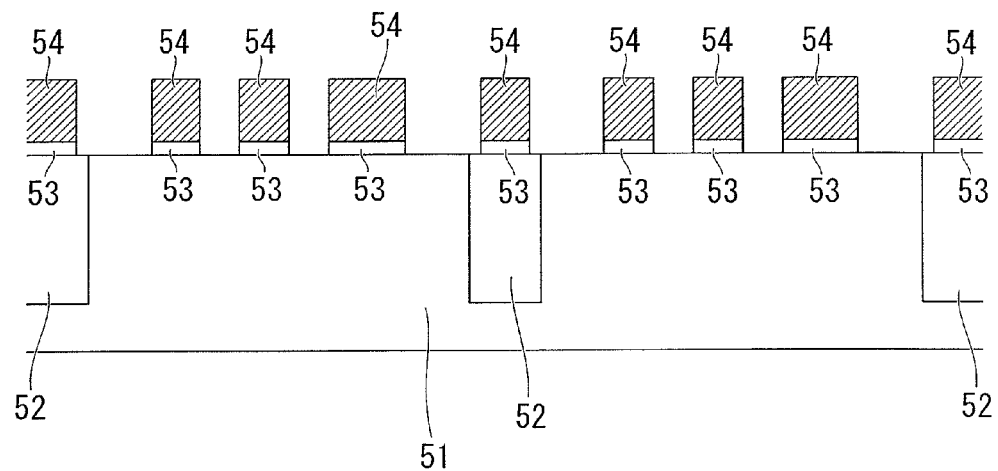

With reference to FIG. 6C, a resist film is applied on the nitride film 54. A lithography process is carried out to form a resist pattern. An anisotropic etching is carried out using the resist pattern as a mask, to selectively etch the nitride film 54 and the oxide film 53, thereby forming the nitride masks 54 and the oxide films 53.

Figure 6D:
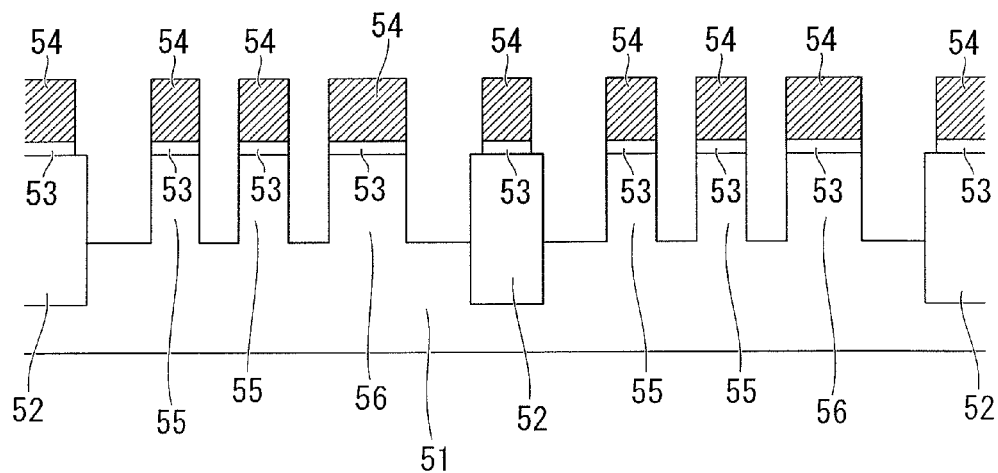

With reference to FIG. 6D, an anisotropic etching process is carried out by using the nitride masks 54 to selectively etch the silicon substrate 51, thereby forming silicon pillars 55 and 56. In some cases, the etching depth may be, but is not limited to, 150 nm. A set of the silicon pillars 55 and 56 is formed in the first active region A. Another set of the silicon pillars 55 and 56 is formed in the second active region B. The silicon pillar 55 provides the channel for the unit transistor. The silicon pillar 56 provides a projecting spacer that increases the height of the gate electrode 61. The layout of the silicon pillars 55 and 56 are as shown in FIG. 5. In each of the first and second active regions A and B, a single set of silicon pillars 55 and 56 is formed, wherein the silicon pillars 55 are distanced from each other by a gap which is approximately equal to or narrower than two times the thickness of a gate electrode that will be formed in later process as well as the silicon pillars 55 and 56 are distanced from each other by a gap which is approximately equal to or narrower than two times the thickness of a gate electrode that will be formed in later process. The horizontal dimension of the silicon pillars 55 is as large as allowing for complete depletion. The dimension of the silicon pillar 56 may be optional, but is not limited to the same dimension as the silicon pillar 55.

Figure 6E:
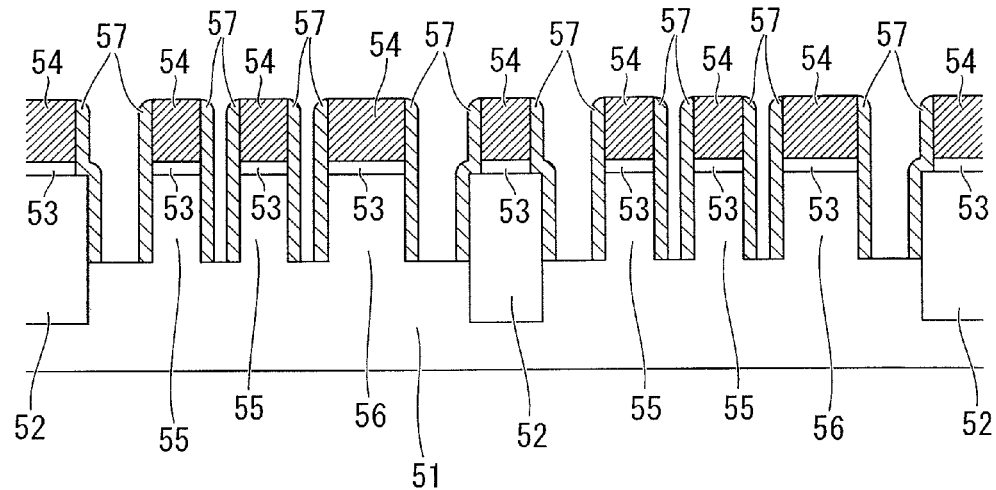

With reference to FIG. 6E, an oxidizing process is carried out to oxidize the surface region of the side wall of each of the silicon pillars 55 and 56, thereby forming an oxide film on the side wall of each of the silicon pillars 55 and 56. The oxide film is not illustrated. The oxidation depth may be, but is not limited to, about 5 nm. A nitride film is entirely formed by a thickness of about 20 nm and then the nitride film is etched back, thereby forming side wall nitride films 57 that extend along the side walls of the silicon pillars 55 and 56, the oxide films 53 and the nitride masks 54 as well as extend along the side walls of the shallow trench isolations 52, the oxide films 53 and the nitride masks 54.

Figure 6F:
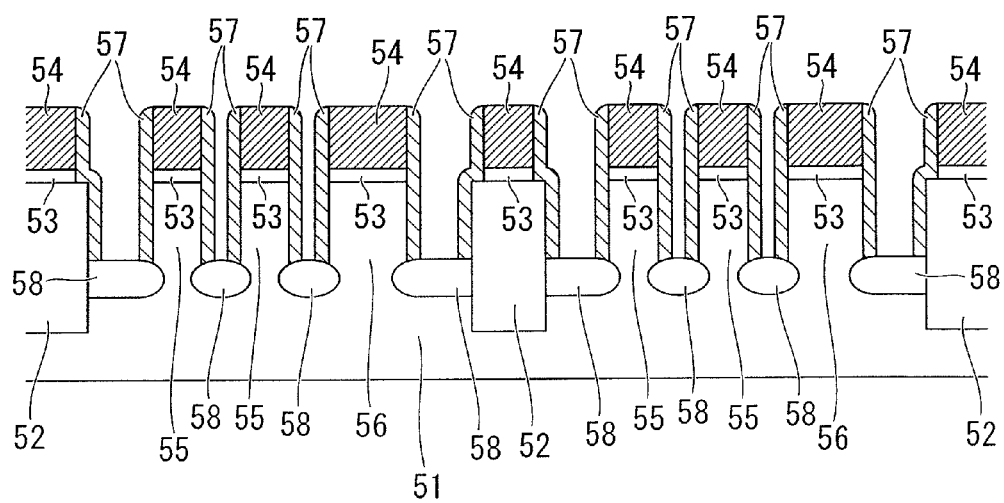

With reference to FIG. 6F, an oxidation process is carried out to oxidize the exposed surfaces of the silicon substrate 51, thereby forming oxide films 58 on the exposed surfaces of the silicon substrate 51. In some cases, the oxide films 58 have a thickness of 30 nm. The silicon pillars 55 and 56 are not oxidized as being covered by the nitride masks 54 and the side wall nitride films 57.

Figure 6G:
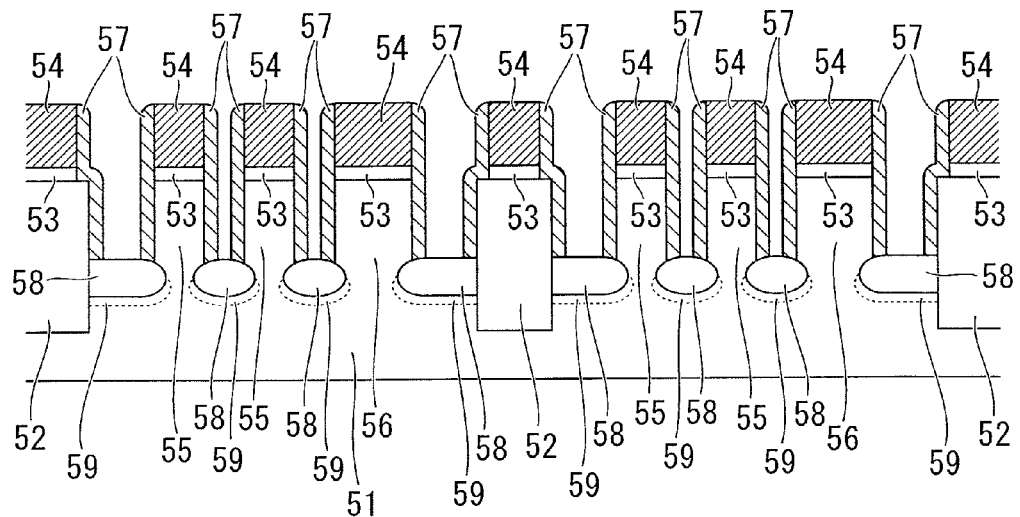

With reference to FIG. 6G, an ion-implantation process is carried out to introduce an impurity into the silicon substrate 51, thereby forming first diffusion regions 59 under the oxide films 58. For forming an n-type transistor, n-type ions such as As-ions are introduced. The nitride masks 54 prevent the ions from being introduced into the silicon pillars 55 and 56 because the nitride masks 54 have a thickness of about 100 nm which is sufficiently thicker than the oxide films 58 having the thickness of 30 nm. No diffusion region is formed in the silicon pillars 55 and 56.

Figure 6H:
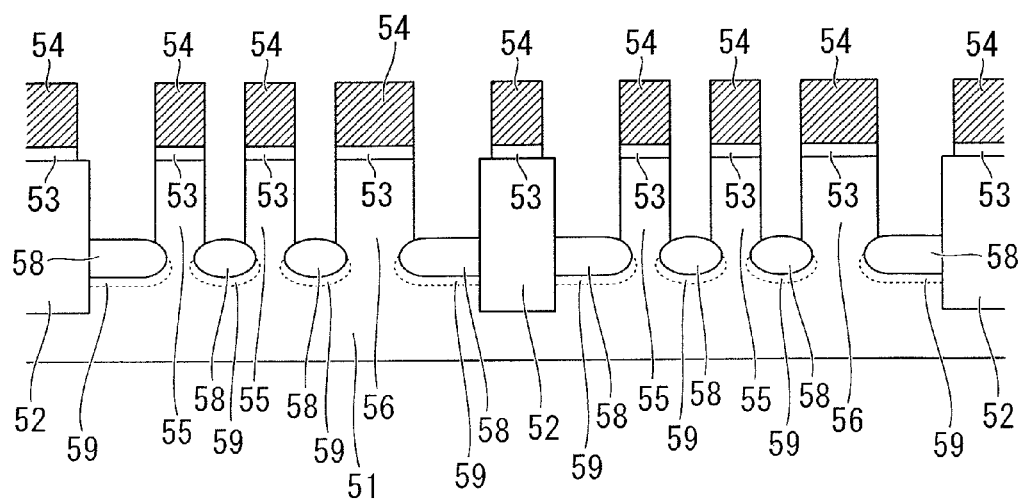

With reference to FIG. 6H, the side wall nitride films 57 and the oxide films are removed from the side walls of the silicon pillars 55 and 56, the oxide films 53 and the nitride masks 54 as well as from the side walls of the shallow trench isolations 52, the oxide films 53 and the nitride masks 54. As a result, there are exposed the side walls of the silicon pillars 55 and 56, the oxide films 53 and the nitride masks 54 as well as there are exposed the side walls of the shallow trench isolations 52, the oxide films 53 and the nitride masks 54.

Figure 6I:
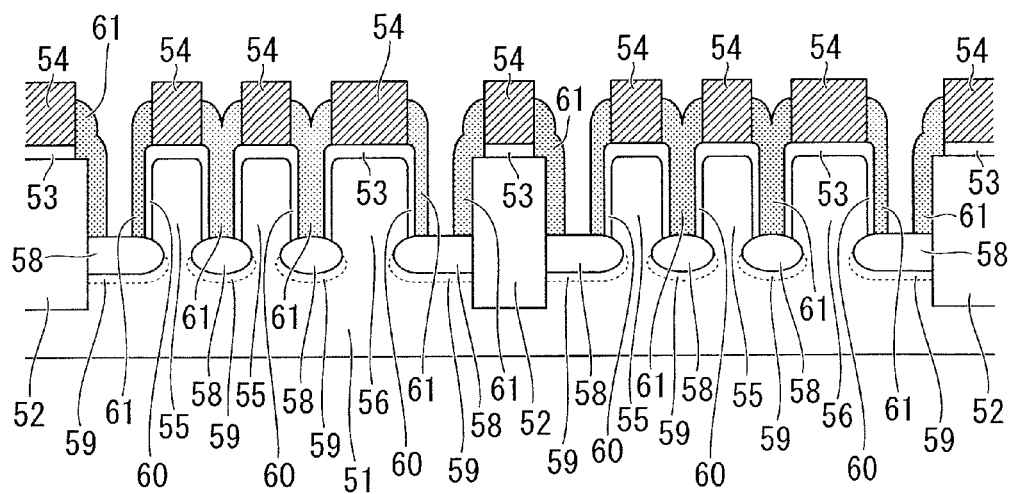

With reference to FIG. 6I, a gate insulating film 60 is formed on the side walls of the silicon pillars 55 and 56. The gate insulating film 60 may be made of silicon oxide. In this case, the gate insulating film 60 may have a thickness of about 3 nm. A polysilicon film having a thickness of about 20 nm is entirely formed over the silicon substrate 51 and then etched back, thereby forming gate electrodes 61. The gate electrodes 61 extend along the gate insulating films on the side walls of the silicon pillars 55 and 56 as well as along the side walls of the oxide film and the nitride masks 54. The gate electrodes 61 also extend along the side walls of the shallow trench isolation 52, the oxide film 53 and the nitride masks 54. Since the gap between the silicon pillars 55 is approximately equal to or narrower than two times the thickness of the gate electrode 61, the gap between the silicon pillars 55 is buried up by the gate electrode 61. Since the gap between the silicon pillars 55 and 56 is approximately equal to or narrower than two times the thickness of the gate electrode 61, the gap between the silicon pillars 55 and 56 is buried up by the gate electrode 61.

Figure 6J:
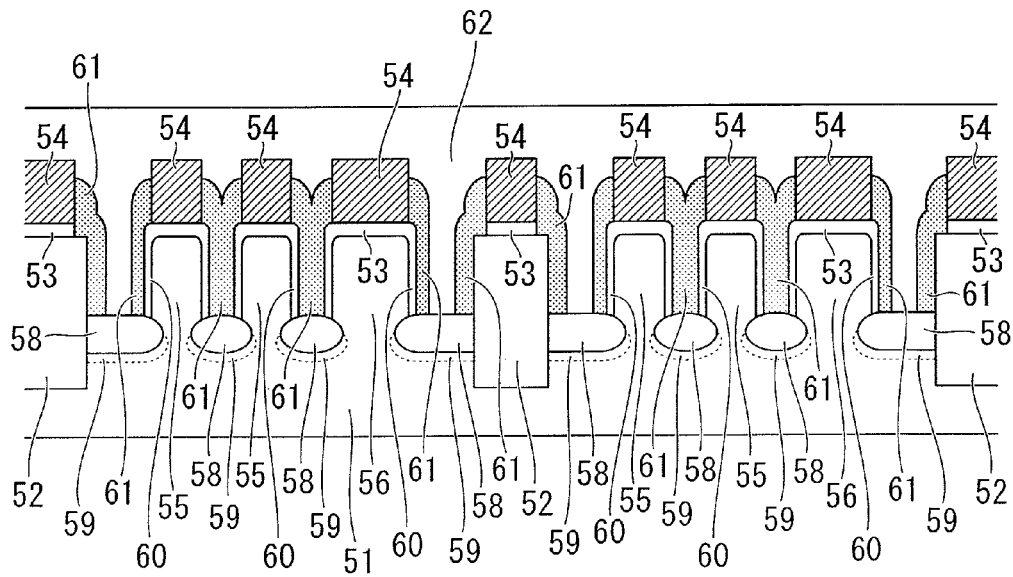

With reference to FIG. 6J, a first inter-layer insulator 62 is formed to bury the gate electrodes 61, the nitride masks 54, the oxide films 58.

Figure 6K:
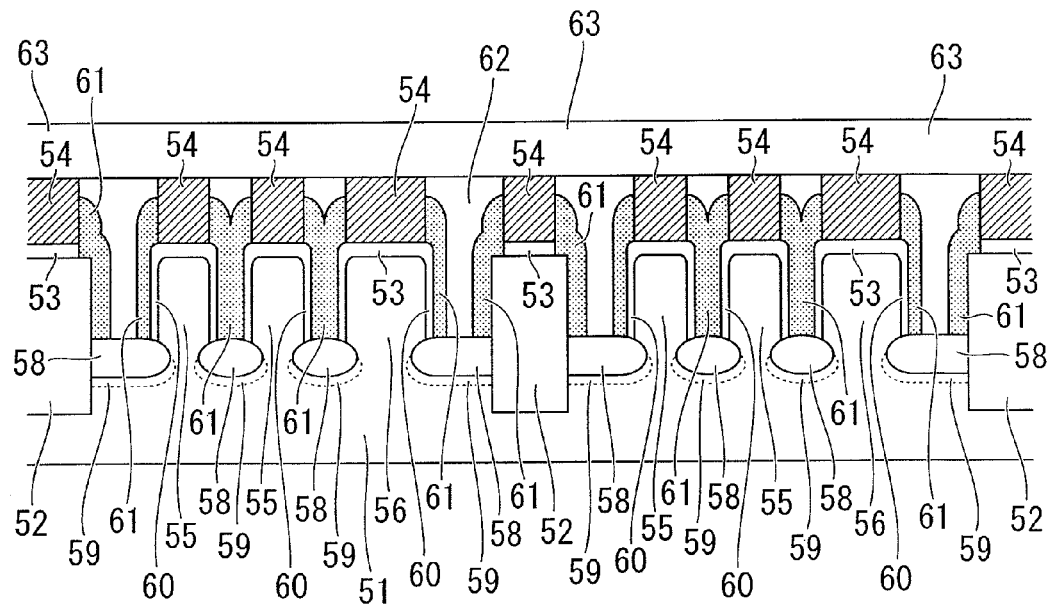

With reference to FIG. 6K, a chemical mechanical polishing process is carried out to planarize the first inter-layer insulator 62, so that the nitride masks 54 are exposed. An oxide film 63 is formed over the first inter-layer insulator 62 and the nitride masks 54. In some cases, the oxide film 63 may have a thickness of about 50 nm.

Figure 6L:
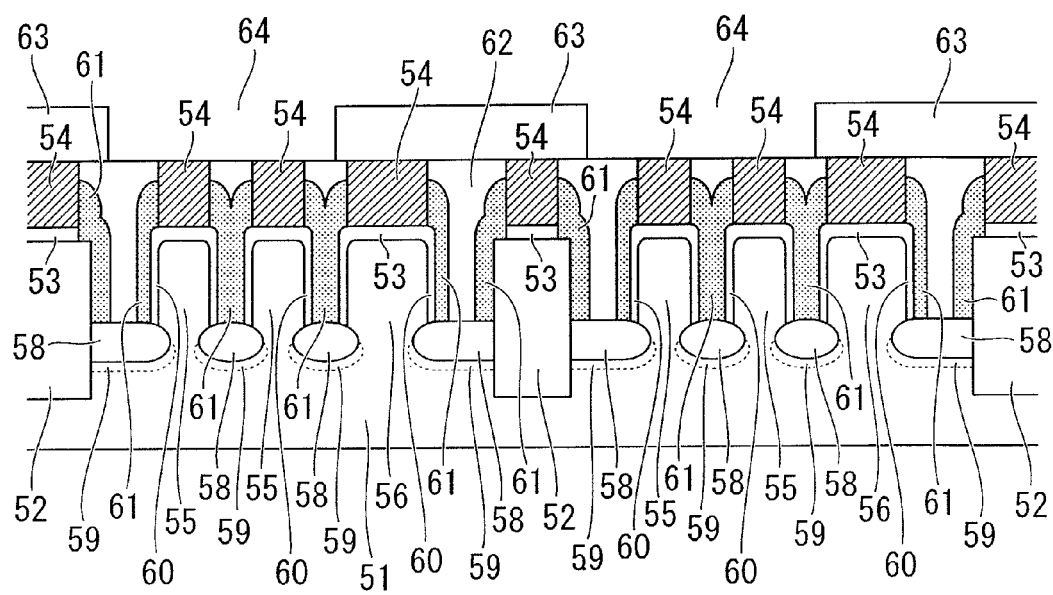

With reference to FIG. 6L, a resist film is applied on the oxide film 63. A lithography process is carried out to form a resist pattern over the oxide film 63. An anisotropic etching process is carried out to selectively remove the oxide film 63, thereby forming oxide masks 63 having patterns 90 as shown in FIG. 5. Empty spaces 14 surround and define the patterns 90 of the oxide masks 13. Under the empty spaces 64, the first inter-layer insulator 62 and the nitride masks 54 over the silicon pillars 55 are exposed.

Figure 6M:
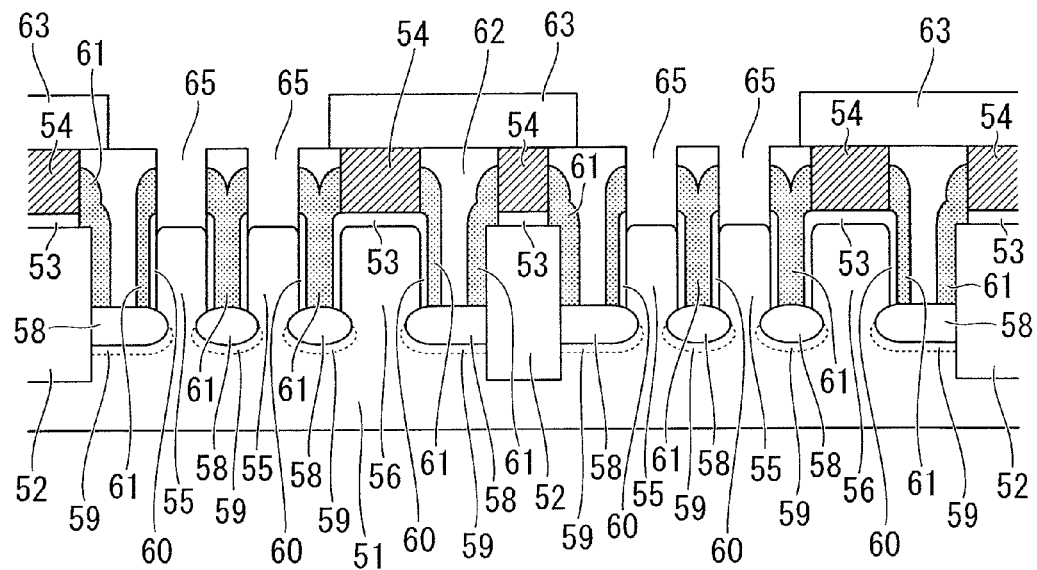

With reference to FIG. 6M, the nitride masks 54 under the empty spaces 64 are removed to form openings 65 over the top portions of the silicon pillars 55, whereby the top portions of the silicon pillars 55 are exposed.

Figure 6N:
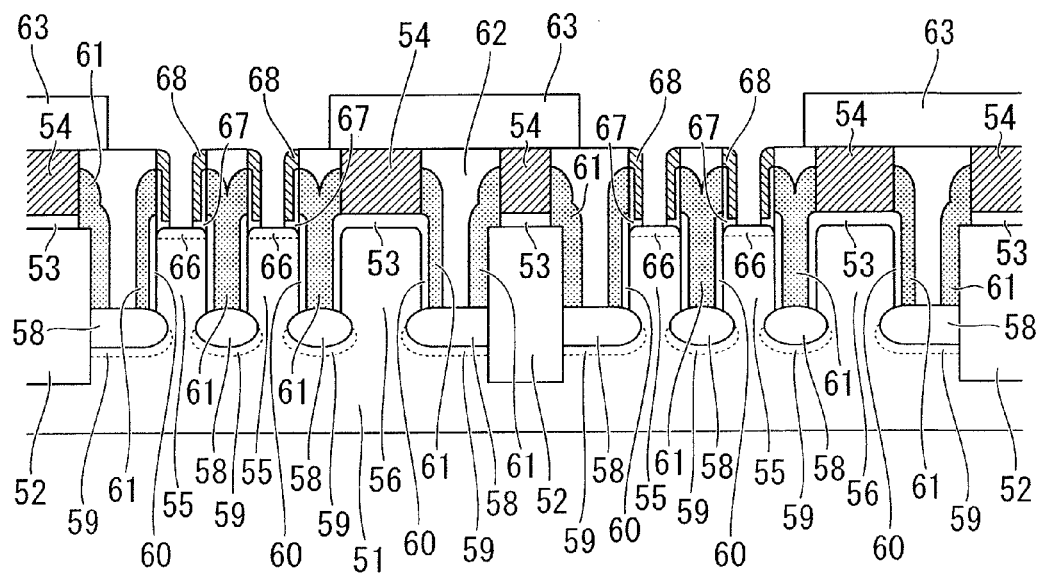

With reference to FIG. 6N, an oxidation process is carried out to form an oxide film 67 in the openings 65. An ion-implantation process is carried out to introduce ions through the openings 65 into the upper portions of the silicon pillars 55, thereby forming second diffusion regions 66 in the upper regions of the silicon pillars 55, thereby redefining the silicon pillars 55. The second diffusion regions 66 are positioned over the top portions of the silicon pillars 55. The ions to be introduced may be an n-type impurity such as phosphorus or arsenic. A nitride film is entirely formed by about 10 nm and etched back, thereby forming side wall nitride films 68 on the side walls of the openings 65. In the etch-back process, the oxide film 67 is removed from the top surfaces of the second diffusion regions 66 over the silicon pillars 55, thereby exposing the top surfaces of the second diffusion regions 66 over the silicon pillars 55. The oxide film 67 is leaved under the side wall nitride films 68 and also on the side walls of the gate electrodes 61. The side wall nitride films 68 are effective to form lightly-doped drain structure in the second diffusion regions 66. The side wall nitride films 68 are effective to isolate plugs from the gate electrodes 61, wherein the plugs will be formed.

Figure 6O:
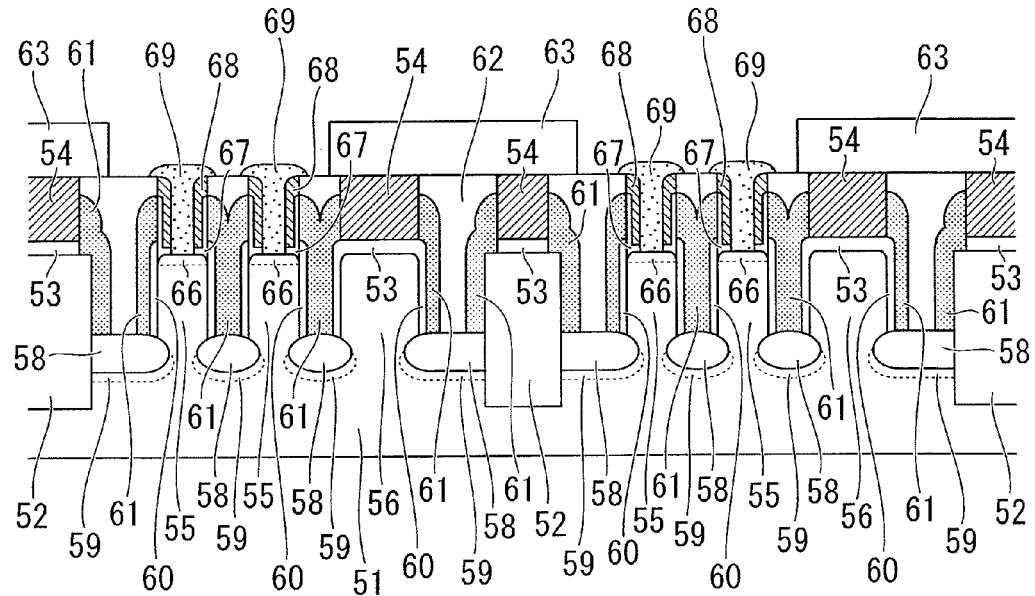

With reference to FIG. 6O, silicon plugs 69 are selectively grown on the exposed surfaces of the silicon pillars 55 by using a selective epitaxial growth. An ion-implantation is carried out to introduce ions into the silicon plugs 69, thereby allowing the silicon plugs 69 to perform as additional diffusion regions combined with the second diffusion regions 66. When the transistor is an n-type transistor, n-type ions such as arsenic are introduced into the silicon plugs 69, so that the silicon plugs 69 perform as additional n-doped diffusion regions combined with the second diffusion regions 66.

Figure 6P:
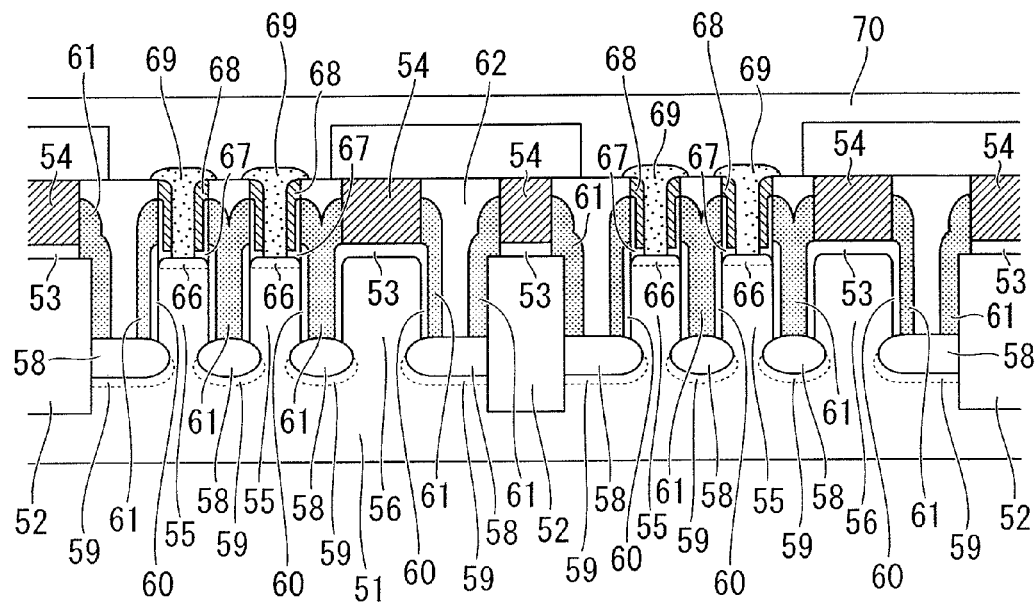

With reference to FIG. 6P, a second inter-layer insulator 70 is formed which extends over the first inter-layer insulator 62, the silicon plugs 69, and the oxide masks 63.

Figure 6Q:
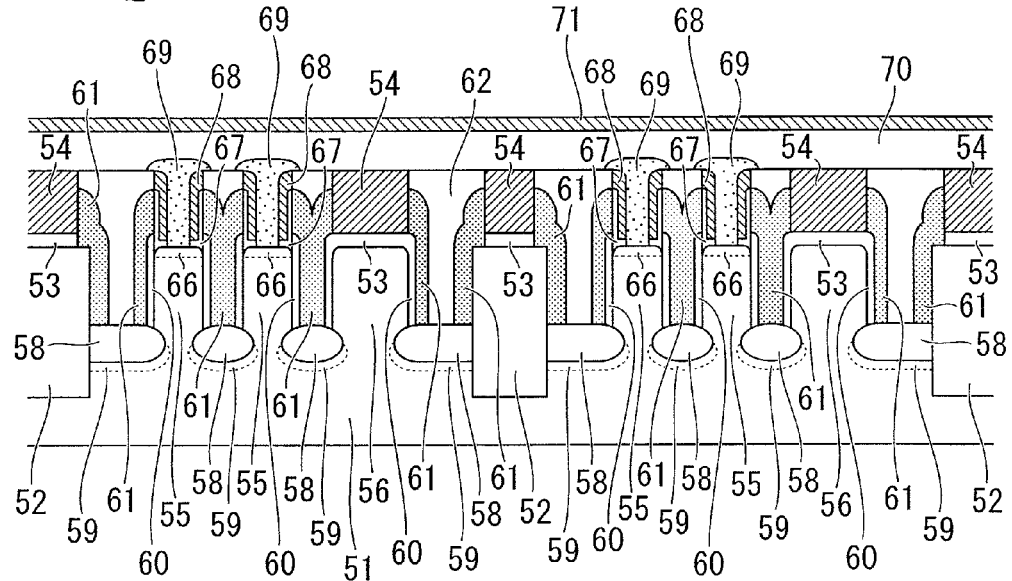

With reference to FIG. 6Q, a stopper nitride film 71 is formed over the second inter-layer insulator 70. In some cases, the stopper nitride film 71 may have a thickness of about 20 nm.

Figure 6R:
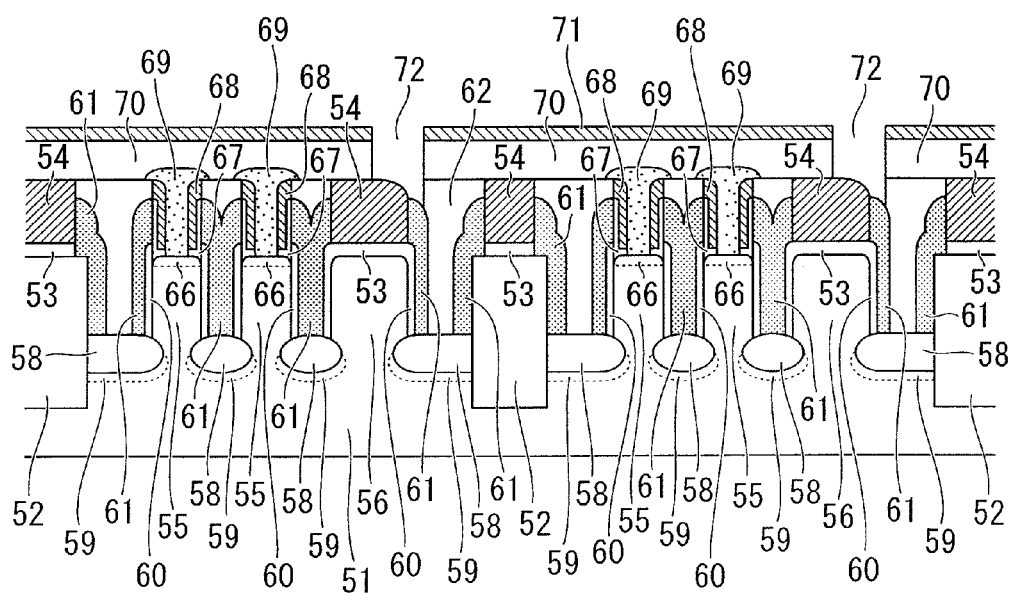

With reference to FIG. 6R, a resist film is applied on the stopper nitride film 71. A lithography process is carried out to form a resist pattern over the stopper nitride film 71. An anisotropic etching process is carried out to selectively remove the stopper nitride film 71, the second inter-layer insulator 70, and the first inter-layer insulator 62, thereby forming contact holes 72 which reach the top portions of the nitride masks 54 and the top portions of the gate electrodes 61, wherein the nitride masks 54 and the gate electrodes 61 are disposed near the silicon pillars 56. The contact holes 72 are positioned over the silicon pillars 56 in the first and second active regions A and B. The contact holes 72 are slightly displaced from the silicon pillars 56, but the contact holes 72 vertically and partially overlap the silicon pillars 56. The process for forming the contact holes 72 also etch slightly the nitride masks 54 and the gate electrodes 61, but does not etch the silicon pillars 56.

Figure 6S:
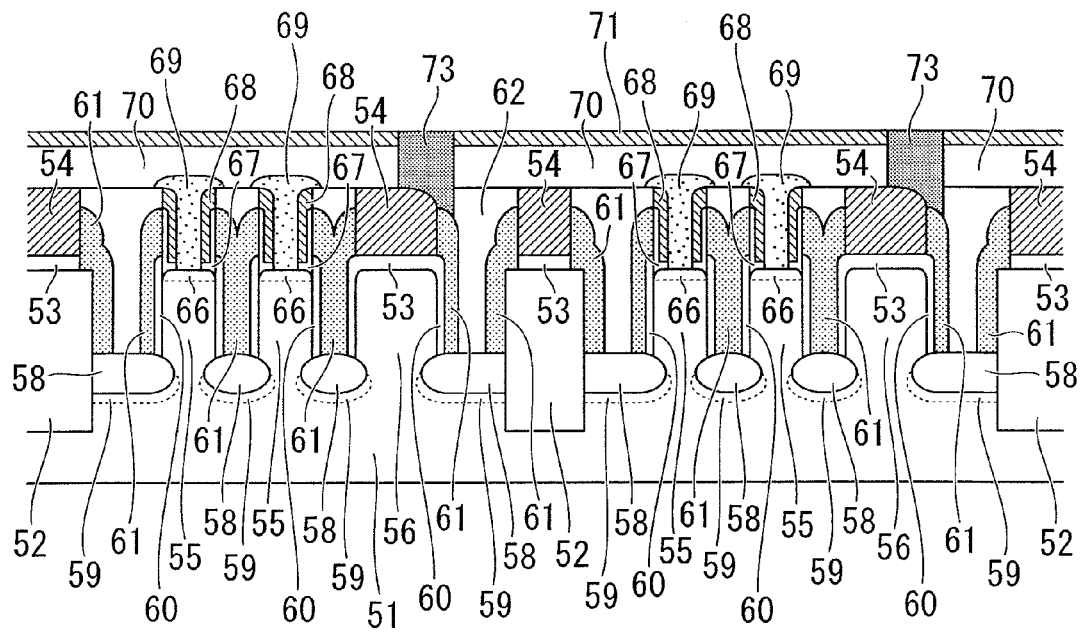

With reference to FIG. 6S, metal contact plugs 73 are formed in the contact holes 72. The metal contact plugs 73 contact the nitride masks 54 and the gate electrodes 61. The metal contact plugs 73 are electrically connected to the gate electrodes 61. In some cases, the metal contact plugs 73 may be implemented by a multi-layered metal structure, for example, a stack of a tungsten film (W), a titanium nitride film (TiN), and a titanium film (Ti).

Figure 6T:
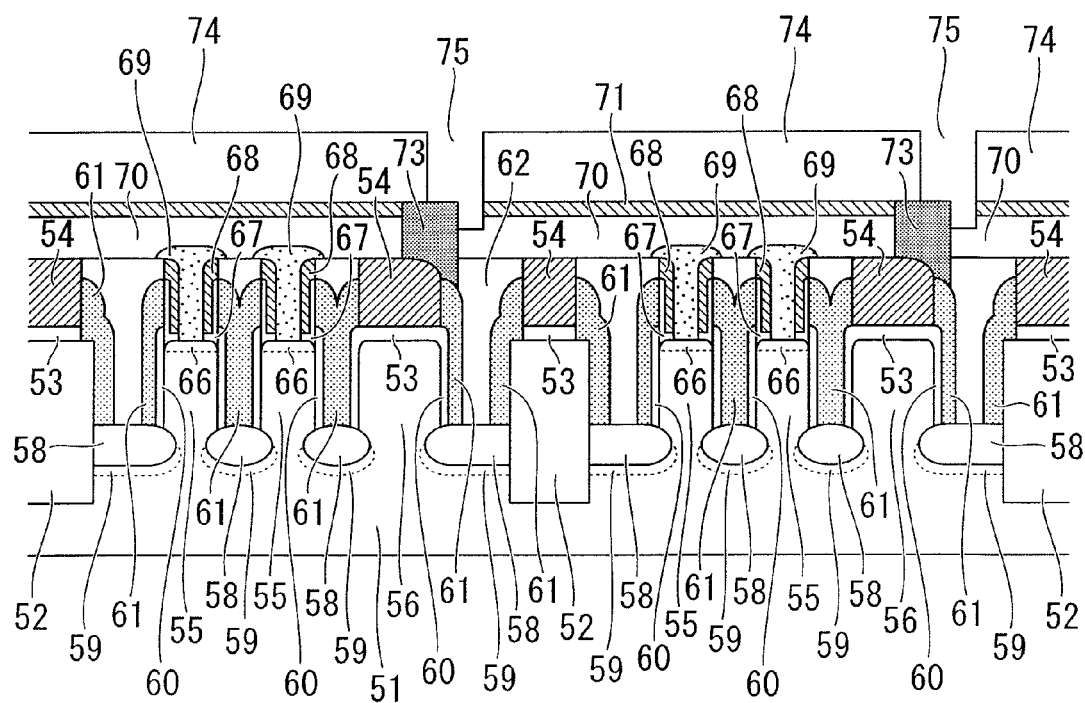

With reference to FIG. 6T, a third inter-layer insulator 74 is formed over the metal contact plugs 73 and the stopper nitride film 71. In some cases, the third inter-layer insulator 74 may have a thickness of about 150 nm. A resist film is applied on the third inter-layer insulator 74. A lithography process is carried out to form a resist pattern over the third inter-layer insulator 74. An anisotropic etching process is carried out to selectively etch the third inter-layer insulator 74, and the stopper nitride film 71, and slightly etch the second inter-layer insulator 70, thereby forming a gate groove 75. The gate groove 75 reaches the top portions of the metal contact plugs 73 that are positioned over the silicon pillars 56. The top portions of the metal contact plugs 73 are exposed. As shown in FIG. 5, the gate groove 75 runs in inverse-U shape. Namely, the gate groove 25 has first and second portions which extend in Y-direction and a third portion which extends in X-direction, wherein the third portion communicates between the first and second portions. The first portion of the gate groove 75 partially extends over the first active region A. The second portion of the gate groove 75 partially extends over the second active region B. The third portion of the gate groove 75 extends over the shallow trench isolation 52. The first portion of the gate groove 25 extends across over the contact plug 73 in the first active region A. The second portion of the gate groove 75 extends across over the contact plug 73 in the second active region B.

Figure 6U:
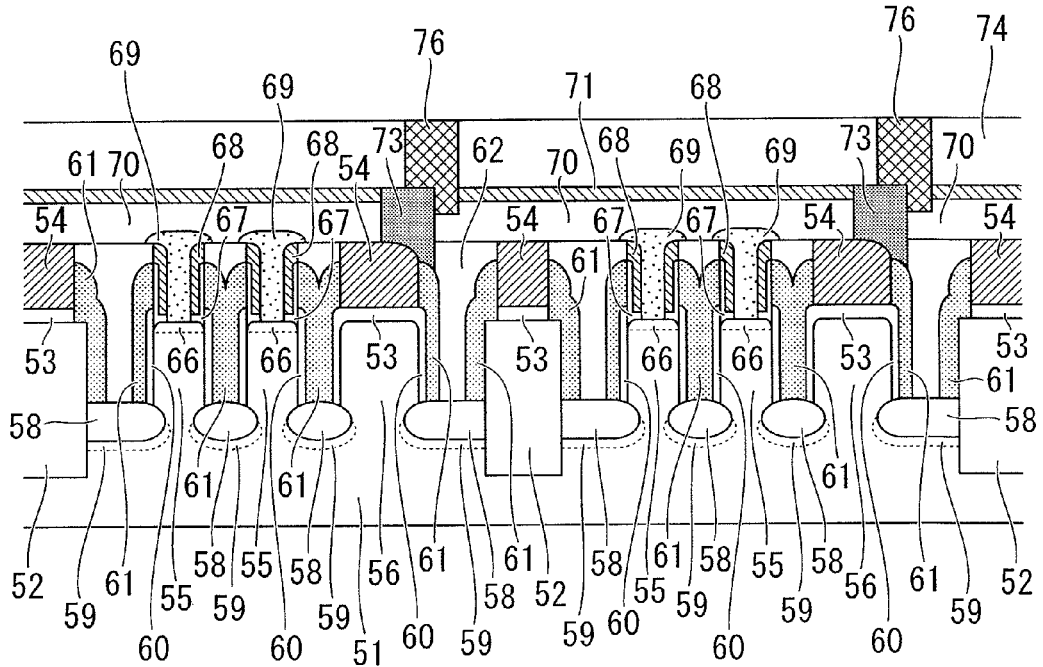

With reference to FIG. 6U, a first-level interconnection 76 is formed in the gate groove 25. The first-level interconnection 76 runs in inverse-U shape. Namely, the first-level interconnection 76 has first and second portions which extend in Y-direction and a third portion which extends in X-direction, wherein the third portion communicates between the first and second portions. The first portion of the first-level interconnection 76 partially extends over the first active region A. The second portion of the first-level interconnection 76 partially extends over the second active region B. The third portion of the first-level interconnection 76 extends over the shallow trench isolation 52. The first portion of the first-level interconnection 76 is electrically connected through the contact plug 73 to the gate electrode 61 which surrounds both the first, second and fifth silicon pillars 55A, 55B and 56 in the first active region A. Namely, the first portion of the first-level interconnection 76 is electrically connected through the contact plug 73 to the gate electrode 61 of the first and second unit transistors 100A and 100B in the first active region A. The second portion of the first-level interconnection 76 is electrically connected through the contact plug 73 to the gate electrode 61 which surrounds both the third, fourth and sixth silicon pillars 55C, 55D and 56 in the second active region B. Namely, the second portion of the first-level interconnection 76 is electrically connected through the contact plug 73 to the gate electrode 61 of the third and fourth unit transistors 100C and 100D in the second active region B. The first-level interconnection 76 electrically interconnects the gate electrodes 61 of the first, second, third and fourth unit transistors 100A, 100B, 100C and 100D in the first and second active regions A and B.

Figure 6V:
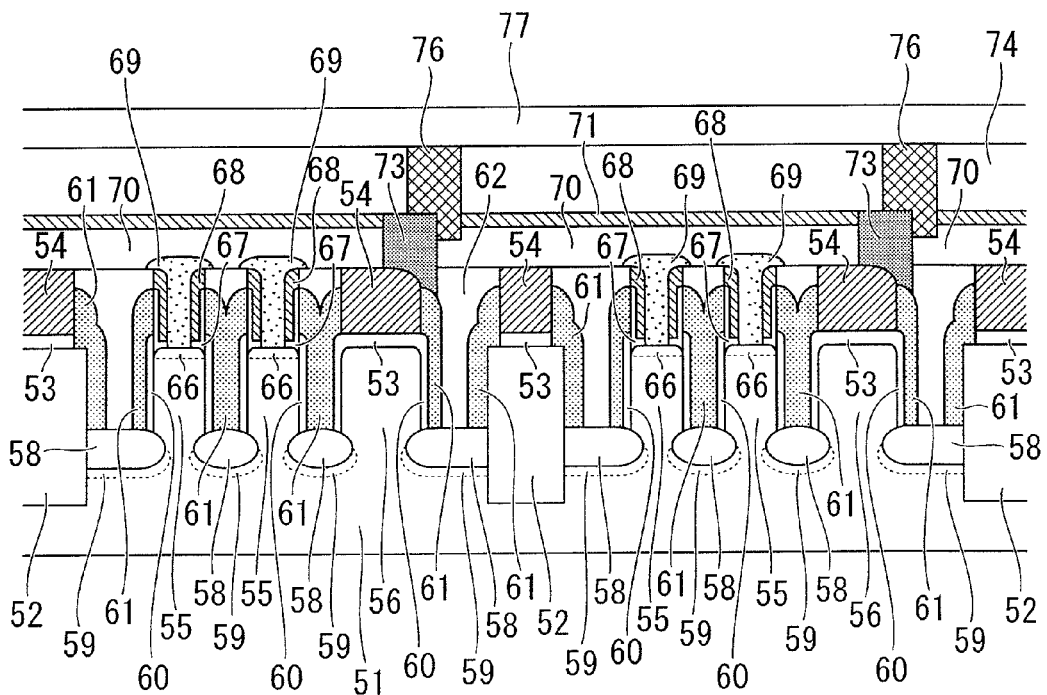

With reference to FIG. 6V, a fourth inter-layer insulator 77 is formed over the first-level interconnection 76 and the third inter-layer insulator 74.

Figure 6W:
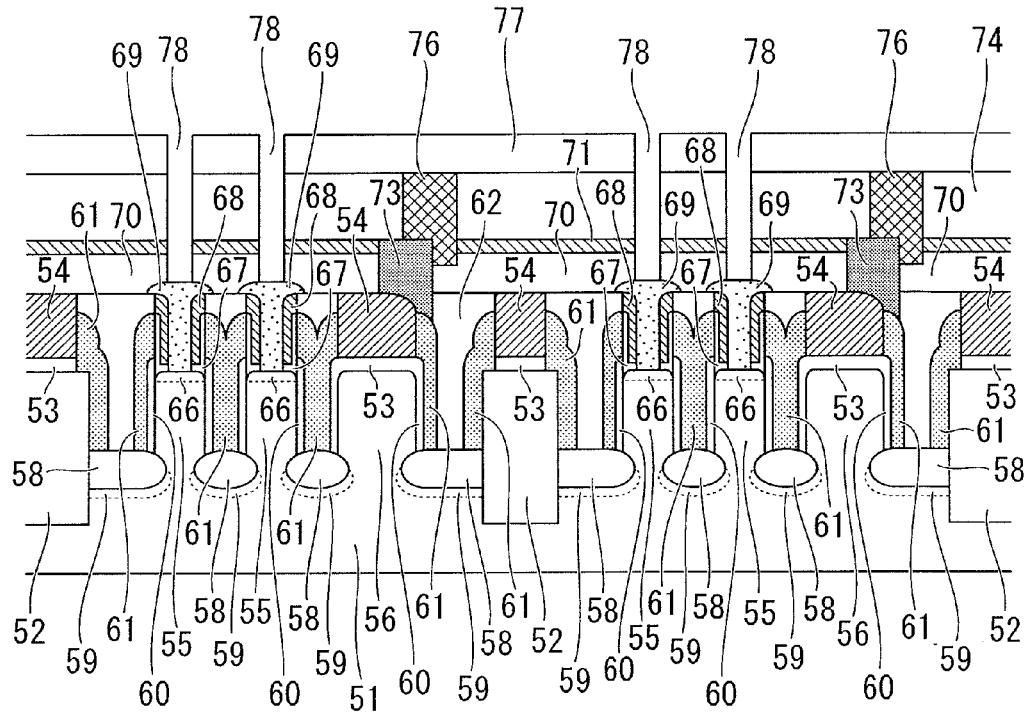

With reference to FIG. 6W, a resist film is applied on the fourth inter-layer insulator 77. A lithography process is carried out to form a resist pattern over the fourth inter-layer insulator 77. An anisotropic etching process is carried out to selectively etch the fourth inter-layer insulator 77, the third inter-layer insulator 74, the stopper nitride film 71, and the second inter-layer insulator 70, thereby forming contact holes 78. The contact holes 78 reach the top portions of the silicon plugs 69 that are positioned over the silicon pillars 55. The top portions of the silicon plugs 69 are exposed. Contact holes 78 are formed, which reach the first diffusion regions 59 under the insulating films 58. The first diffusion regions 59 are partially exposed. As shown in FIG. 5, but not illustrated in FIG. 6W, a contact hole 91 is formed which reaches the first-level interconnection 76. In some cases, the contact holes 78, and 91 may be formed by the same lithography process and subsequent anisotropic etching process. In other cases, the contact holes 78, and the contact hole 91 may be formed by different lithography processes and subsequent anisotropic etching processes.

Figure 6X:
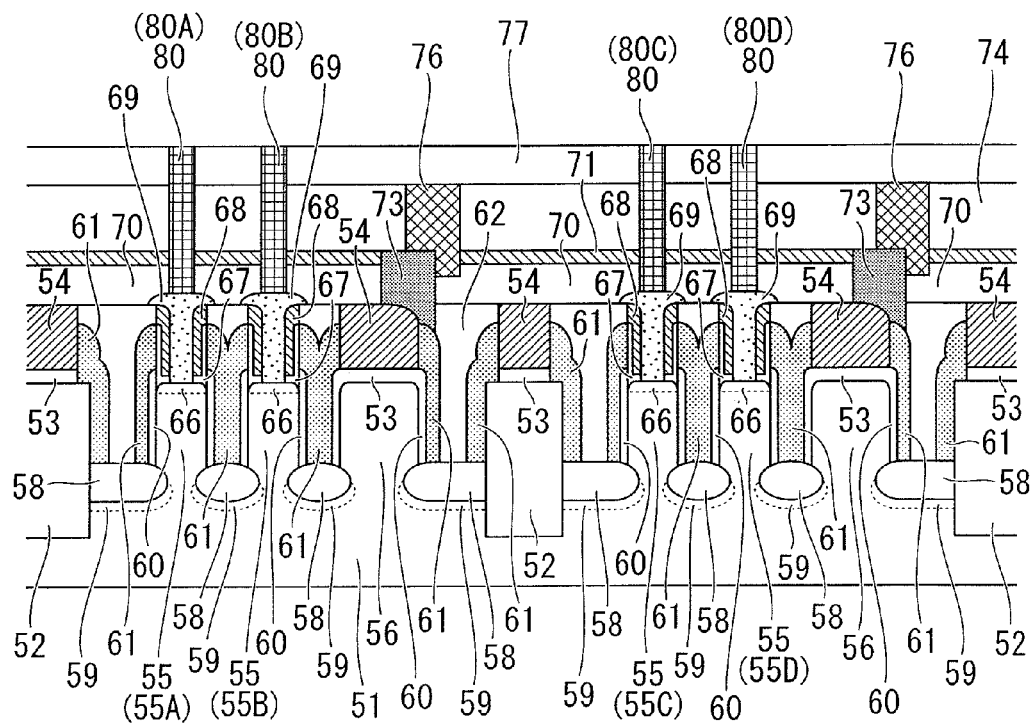

With reference to FIG. 6X, metal contact plugs 80 are formed in the contact holes 78, 79, and 91. The metal contact plug 80A is formed in the contact hole 78 that reaches the top portion of the silicon plug 69 that is positioned over the silicon pillar 55A in the first active region A. The metal contact plug 80B is formed in the contact hole 78 that reaches the top portion of the silicon plug 69 that is positioned over the silicon pillar 55B in the second active region B. The metal contact plug 80C is formed in the contact hole 78 that reaches the top portion of the silicon plug 69 that is positioned over the silicon pillar 55C in the second active region B. The metal contact plug 80D is formed in the contact hole 78 that reaches the top portion of the silicon plug 69 that is positioned over the silicon pillar 55D in the second active region B. In some cases, the metal contact plugs 80 may be implemented by a multi-layered metal structure, for example, a stack of a tungsten film (W), a titanium nitride film (TiN), and a titanium film (Ti).

With reference again to FIGS. 4 and 5, second-level interconnections 82, 83, 84 and 92 are formed over the fourth inter-layer insulator 77. The second-level interconnections 82, 83, 84 and 92 may be made of a multi-layered metal structure, for example, a stack of a tungsten film (W) and a tungsten nitride film (WN). The second-level interconnection 84 is connected to the metal contact plug 80A that is further connected to the contact plug 69 that is positioned over the first silicon pillar 55A of the first unit transistor 100A in the first active region A. The second-level interconnection 83 is connected to the metal contact plug 80B that is further connected to the contact plug 69 that is disposed over the second silicon pillar 55B of the second unit transistor 100B in the first active region A. The second-level interconnection 83 is connected to the metal contact plug 80C that is further connected to the contact plug 69 that is positioned over the third silicon pillar 55C of the third unit transistor 100C in the second active region B. The second-level interconnection 82 is connected to the metal contact plug 80D that is further connected to the contact plug 69 that is positioned over the fourth silicon pillar 55D of the fourth unit transistor 100D in the second active region B.

The first and second silicon pillars 55A and 55B have the common first diffusion region 59. The first and second silicon pillars 55A and 55B are electrically connected to each other through the first diffusion region 59. The third and fourth silicon pillars 55C and 55D have the common first diffusion region 59. The third and fourth silicon pillars 55C and 55D are electrically connected to each other through the first diffusion region 59. A first pair of the first and second silicon pillars 55A and 55B having the common first diffusion region 59 and being electrically connected to each other through the first diffusion region 59 in the first active region A is electrically connected in series to a second pair of the third and fourth silicon pillars 55C and 55D have the common first diffusion region 59 and being electrically connected to each other through the first diffusion region 59 in the second active region B.

The semiconductor device described above will provide the following effects.

First, the channel region of the high voltage transistor is implemented by the set of first, second, third and fourth silicon pillars 55A, 55B, 55C, and 55D that are connected in series to each other. The channel length between the source and drain regions of the high voltage transistor substantially corresponds to four times the height of the silicon pillars 55. The low voltage transistor that is not illustrated has the channel region that is implemented by the single pillar. The channel length between the source and drain regions of the high voltage transistor substantially corresponds to the height of the single pillar. Thus, the high voltage transistor is longer in channel length than the low voltage transistor. The high voltage transistor has the high voltage performances, while the low voltage transistor has the low voltage performances, even both the high and low voltage transistors are implemented by the uniform height silicon pillars with relatively simple manufacturing processes.

Second, the gap between the silicon pillars 55 is approximately equal to or less than two times the thickness of the gate electrode 61 so that the gap is completely filled up with the gate electrode 61. The gap between the silicon pillars 55 and 56 is approximately equal to or less than two times the thickness of the gate electrode 61 so that the gap is completely filled up with the gate electrode 61. Filling the gap completely with the gate electrode film causes no disconnection of the gate electrode 61 at the gap when the gate electrode 61 is patterned by an etch-back process. The single gate electrode 61 extends over the triplet of the silicon pillars 55 and 56. Reduction to the gap between the silicon pillars 55 and to the gap between the silicon pillars 55 and 56 might contribute scaling down in the semiconductor device.

Third, the silicon pillar 56 and the mask nitride film 54 form a projecting spacer that increases the height of the gate electrode 61. Increasing the height of the gate electrode 61 decreases the aspect ratio of the contact plug 73 which connects the gate electrode 61 and the first-level interconnection 76. Decreasing the aspect ratio of the contact plug 73 is suitable for further shrinkage of the semiconductor device.

Fourth, the first, second, third and fourth silicon pillars 55A, 55b, 55C, and 55D are electrically connected to the second-level interconnections 82, 83, and 84 through the contact plugs 69 and 80A, 80B, 80C, and 80D. A pair of the contact plug 69 and the contact plug 80A, 80B, 80C or 80D can allow that each contact plug 69 or 80 has a smaller aspect ratio as compared to when a contact plug is used which extends between the first, second, third and fourth silicon pillars 55A, 55b, 55C, and 55D and the second-level interconnections 82, 83, and 84. This structure is suitable for further shrinkage of the semiconductor device. The distance between each of the first, second, third and fourth unit transistors 100A, 100B, 100C, and 100D and each of the second-level interconnections 82, 83 and 84 is reduced by the height of the first, second, third, and fourth silicon pillars 55A, 55B, 55C, and 55D. This may contribute to further decreasing the aspect ratio of each contact plug 69 or 80.

In this embodiment, the high voltage transistor is implemented by the four unit transistors 100A, 100B, 100C and 100D. There is no limitation to the number of unit transistors that configure the single high voltage transistor. It is possible as a modification that the semiconductor device has the first active region A that has the same structure as described with reference to FIGS. 4 and 5 and the second active region B that has the same structure as described with reference to FIGS. 1 and 2. The second level interconnection 83 has the first end that is electrically connected to the first diffusion region in the second active region A. In this case, the high voltage transistor is implemented by three unit transistors, two of which are disposed in the first active region A, and one being disposed in the second active region B. The channel length between the source and drain regions of the high voltage transistor substantially corresponds to three times the height of the silicon pillars 55.

In the foregoing embodiments, the silicon substrate is used. It is possible as a modification that semiconductor pillars are formed over any other substrate. It is possible that a semiconductor layer is formed over an insulating substrate such as a glass substrate. In this case, semiconductor pillars can be formed by selectively etching the semiconductor layer. The layout of the contact plugs and interconnections can be modified.

Data Processing System:

A semiconductor memory device including the semiconductor device described above will be described. Further, a data processing system including the semiconductor memory device including the semiconductor device described above will be described.

Examples of the semiconductor memory device and the data processing system will be illustrated. The semiconductor device as described above can widely be applied to any other devices than the semiconductor memory devices as well as to any other systems than the data processing systems. A typical example of the data processing system may include, but is not limited to, a computer system.

Figure 7:
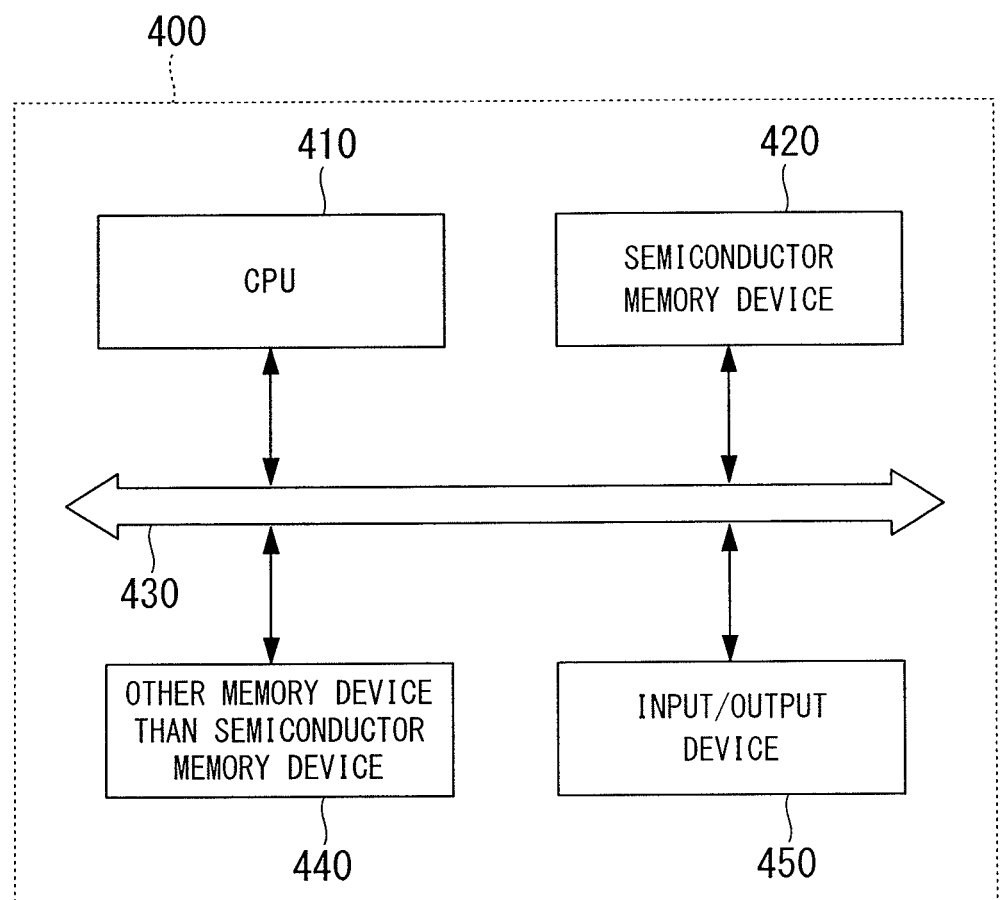
FIG. 7 is a block diagram illustrating a data processing system including the semiconductor device shown in FIG. 1, 2, 4 or 5.

With reference to FIG. 7, a date processing system 400 may include a CPU (Central Processing Unit) 410 and a semiconductor memory device 420. In FIG. 7, the CPU 410 is connected to the semiconductor memory device 420 through a system bus 430. It is also possible that the CPU 410 is connected to the semiconductor memory device 420 through a local bus without using the system bus 430. Even the system bus 430 is illustrated to be a single line in FIG. 7, the system bus 430 can be realized by serial and parallel connections with using connectors if necessary. The date processing system 400 may optionally include, but is limited to, other memory device 440 than the semiconductor memory device 420 and an input/output unit 450. The other memory device 440 is connected to the system bus 430. The input/output unit 450 is connected to the system bus 430.

The input/output unit 450 may also include, but is not limited to, any types of display such as a liquid crystal display. The other memory device 440 may include, but is not limited to, a hard disk or an MO drive. The input/output unit 450 may also include, but is not limited to, an input device or an output device. The semiconductor memory device 420 can be realized by, but not limited to, any types of storage mediums. Typical examples of the storage medium may include, but are not limited to, RAM (Random Access Memory), ROM (Read Only Memory), or flash memories. Typical examples of RAM may include, but are not limited to, SRAM (Static Random Access Memory), DRAM (Dynamic Random Access Memory) such as SDRAM (Synchronous Dynamic Random Access Memory), DDR-SDRAM (Double Data Rate Synchronous Dynamic Random Access Memory), DDR2-SDRAM (Double Data Rate 2 Synchronous Dynamic Random Access Memory), and DDR3-SDRAM (Double Data Rate 3 Synchronous Dynamic Random Access Memory). The number of each element such as the CPU 410, the semiconductor memory device 420, the other memory device 440, and the input/output unit 450 is not limited to one, but may be two or more.

Figure 8:
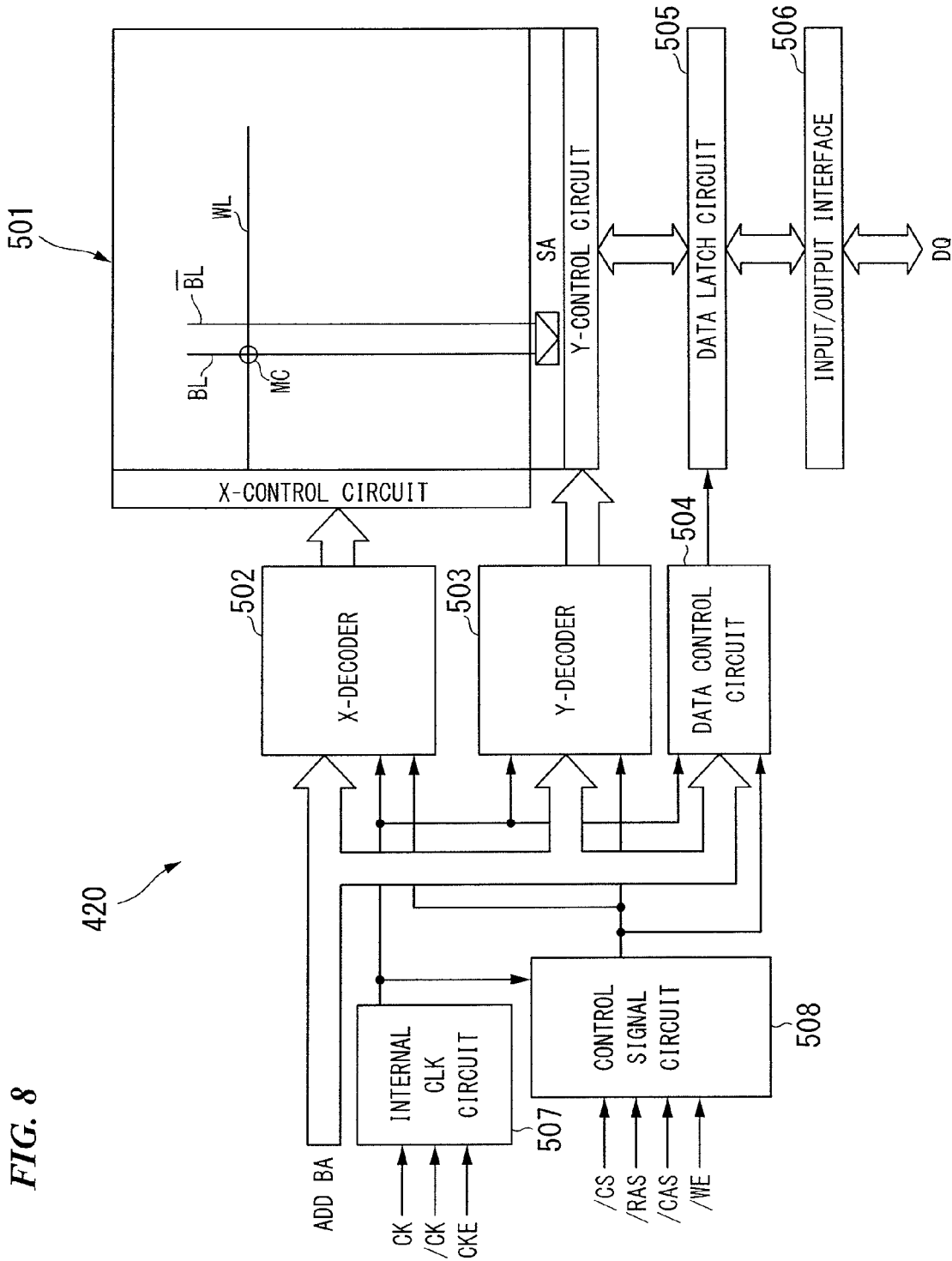
FIG. 8 is a block diagram illustrating the configuration of a semiconductor memory that is included in the data processing system of FIG. 7.

With reference to FIG. 8, the semiconductor memory device 420 may include, but is not limited to, a memory array 501, an X-decoder 502, a Y-decoder 503, a data control circuit 504, a data latch circuit 505, an input/output interface 506, an internal clock circuit 507, and a control signal circuit 508.

The memory array 501 may include, but is not limited to, a plurality of word lines WL, a plurality of bit lines BL, a sense amplifier SA, and a plurality of memory cells MC. Each memory cell MC is arranged at a crossing point of the word line and the bit line.

The memory array 501, the data latch circuit 505 and the input/output interface 506 are connected to each other via data transfer buses. The data control circuit 504 controls data transfer operation of the data latch circuit 505. The X-decoder 502 and the Y-decoder 503 control the writing and reading operations from the memory cells MC in the memory cell array 501. The internal clock circuit 507 receives inputs of CK, /CK, and CKE (Clock Enable). The internal clock circuit 507 generates a clock that is to be used by the X-decoder 502, the Y-decoder 503, and the data control circuit 504. The control signal circuit 508 receives inputs of /CS (Chip Select), /RAS (Row Address Strobe), /CAS (Column Address Strobe), and /WE (Write Enable). The control signal circuit 508 generates a control signal based on the /CS (Chip Select), /RAS (Row Address Strobe), /CAS (Column Address Strobe), and /WE (Write Enable). The control signal controls the X-decoder 502 and the Y-decoder 503. The symbol "I" means that the low level is the active level.

A memory cell MC is arranged at each crossing point between the word line WL and the bit line BL. The memory cell MC stores data. Each memory cell MC may include, but is not limited to, a capacitor that stores data and a switching transistor. The transistor has a gate that is connected to the word line. The transistor has a source and a drain, one of which is connected to the bit line BL, and another being connected to the capacitor.

The sense amplifier SA amplifies the data that has been transferred through the bit line from the data storing capacitor. Detection of data in the memory cell array 501 can be implemented by detection of difference in amplified potential between a pair of bit lines, the potential having been amplified by the sense amplifier SA.

Each of the memory cells MC, the sense amplifier SA, the X-control circuit and the Y-control circuit may include semiconductor devices. Transistors in the memory cell MC and the sense amplifier SA may have a driving voltage in the range of about 1.0V to 1.2V taking into account leakage of current and consumption of a current in the memory cell array 501. Transistors in the Y-control circuit may have a driving voltage that is equal to the power voltage of about 1.8V. Transistors in the X-control circuit may have a driving voltage that is equal to the power voltage of about 3.0V, in order to store charges to the cell capacitor. The memory cells MC, the sense amplifier SA, the X-control circuit, and the Y-control circuit are formed on the same substrate. Transistors for the memory cells MC, the sense amplifier SA, the X-control circuit, and the Y-control circuit are different in channel length from each other by taking into account the difference in driving voltage. The X-control circuit is larger in driving voltage than the memory cells MC and the sense amplifier SA. Thus, transistors for the X-control circuit have longer channel length than those of the transistors for the memory cells MC and the sense amplifier SA.

The channel length of the transistor is defined by the height of each silicon pillar and the number of silicon pillars that are connected in series, or the number of the unit transistors. The channel of the transistor for the memory cells MC and the sense amplifier SA which have lower driving voltage is realized by a single silicon pillar. The channel of the transistor for the X-control circuit which has higher driving voltage is realized by two silicon pillars that are connected in series to each other. Silicon pillars for the memory cells MC, the sense amplifier SA and the X-control circuit are uniform in height. In the X-control circuit, two silicon pillars with the same height as that of the silicon pillar for the memory cells MC and the sense amplifier SA are connected in series to each other, so that the transistor for the X-control circuit have a longer channel length by two times than the channel length of the transistors for the memory cells MC and the sense amplifier SA. The transistor for the X-control circuit has high voltage characteristics, while the transistor for the memory cells MC and the sense amplifier SA has low voltage characteristics. Using the uniform silicon pillars for both the high voltage transistors and the low voltage transistors may simplify the manufacturing process for the semiconductor device and may also reduce the manufacturing cost.

In recent years, the requirement for reduction in power consumption has been on the increase. Technical development for reducing power consumption of a variety of electronic devices including the semiconductor devices has been progressed. Potable electronic devices such as mobile phones and digital players need to be reduced in size or dimension, and in power consumption for longer life of a battery that is used therefore. Data processing systems to be integrated in electronic devices need to be reduced in size or dimension, and in power consumption. The transistors to be used for the data processing system may be realized by a vertical SGT structure, thereby making it possible to reduce the dimension or size and power consumption of the electronic device including the data processing system, as well as allowing the data processing system or the electronic device to exhibit high speed performances with high speed responsibility.

These effects can be available when the semiconductor devices are used for the X-decoder 502, the Y-decoder 503, the data control circuit 504, the data latch circuit 505, and the input/output interface 506. These effects can also be available when the semiconductor devices are used for the CPU 410, the memory device 440 and the input/output device 450. The dimension or size and driving performances of the data processing system 400 may depend upon the dimension and driving performance of each transistor. Using the above-described transistors for the data processing system 400 may allow the data processing system 400 to be reduced in size or dimension and to be improved in high speed performances.

As used herein, the term "pillar" may include any types of a portion of semiconductor which generally extends in a direction vertical to the surface of a semiconductor substrate, but is not limited to the pillar shape as defined in mathematics, so that the semiconductor device may include a channel region which at least partially extends generally in the vertical direction.

The above-described pillars 5A, 5B, 55A, 55B, 55C, and 55D are typical examples, but not limited thereto, which can implement a vertically extending portion of semiconductor over the substrate. The vertically extending portion of semiconductor provides a channel for the unit transistor. The above-described pillars 6 and 56 are typical examples, but not limited thereto, which can implement a vertically projecting spacer of semiconductor over the substrate. The vertically projecting spacer of semiconductor allows increasing the height of the gate electrode to reduce the distance between the gate electrode and the first-level interconnection.

The following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a substrate having first and second active regions that are isolated by a device isolation;
first and second unit transistors disposed in the first active region;
third and fourth unit transistors disposed in the second active region; and
an interconnection layer extending over the first, second, third and fourth unit transistors and crossing over the device isolation,
the first unit transistor comprising a first pillar providing a first channel region, a first gate insulating film formed on a side surface of the first pillar, a first gate electrode formed on the first gate insulating film, a first upper diffusion region disposed near a top part of the first pillar, a first lower diffusion region disposed near a bottom part of the first pillar, a first contact plug provided in contact with the first upper diffusion region, the second unit transistor comprising a second pillar providing a second channel region, a second gate insulating film formed on a side surface of the second pillar, the first gate electrode formed on the second gate insulating film, a second upper diffusion region disposed near a top part of the second pillar, the first lower diffusion region disposed near a bottom part of the second pillar, a second contact plug provided in contact with the second upper diffusion region, the third unit transistor comprising a third pillar providing a third channel region, a third gate insulating film formed on a side surface of the third pillar, a second gate electrode formed on the third gate insulating film, a third upper diffusion region disposed near a top part of the third pillar, a second lower diffusion region disposed near a bottom part of the third pillar, a third contact plug provided in contact with the third upper diffusion region, the fourth unit transistor comprising a fourth pillar providing a fourth channel region, a fourth gate insulating film formed on a side surface of the fourth pillar, the second gate electrode formed on the fourth gate insulating film, a fourth upper diffusion region disposed near a top part of the fourth pillar, the second lower diffusion region disposed near a bottom part of the fourth pillar, a fourth contact plug provided in contact with the fourth upper diffusion region, the first lower diffusion region performing as a common lower diffusion region for the first and second unit transistors in the first active region, the second lower diffusion region performing as a common lower diffusion region for the third and fourth unit transistors, the interconnection layer having a first end and a second end, the first end being in contact with the second contact plug and the second end being in contact with the third contact plug so that the second upper diffusion region and the third upper diffusion region are electrically connected to each other.

2. The device as claimed in claim 1, further comprising:
a fifth pillar disposed in the first active region, the first gate electrode being elongated to provide a first extended portion that covers at least a part of a side surface of the fifth pillar; and
a sixth pillar disposed in the second active region, the second gate electrode being elongated to provide a second extended portion that covers at least a part of a side surface of the sixth pillar.

3. The device as claimed in claim 2, further comprising: a first gate contact formed in contact with the first extended portion of the first gate electrode; a second gate contact formed in contact with the second extended portion of the second gate electrode; and an interconnection line formed in contact with each of the first and second gate contacts to electrically connect the first and second gate electrodes to each other.

4. The device as claimed in claim 2, wherein each of the fifth and sixth pillars comprises a semiconductor, and the first and second extended portions cover the parts of the side surfaces of the fifth and sixth pillars with an intervention of an insulating film, respectively.

5. A semiconductor device comprising: a substrate including an active region defined by an isolation region; first and second transistors formed in the active region; the first transistor comprising a first pillar protruding from the active region and including an upper portion, a lower portion and an intermediate portion between the upper and lower portions, a first diffusion region formed in the upper portion, a second diffusion region formed in the lower portion, and a first gate electrode covering the intermediate portion with an intervention of a gate insulating film therebetween; the second transistor comprising a second pillar protruding from the active region and including an upper portion, a lower portion and an intermediate portion between the upper and lower portions, a third diffusion region formed in the upper portion, a fourth diffusion region formed in the lower portion, and a second gate electrode covering the intermediate portion with an intervention of a gate insulating film therebetween, the fourth diffusion region being in contact with the second diffusion region, the second gate electrode being in contact with the first gate electrode; an interlayer insulating film covering the first and second transistors; a first plug selectively formed in the interlayer insulating film in contact with the first diffusion region; a second plug selectively formed in the interlayer insulating film in contact with the third diffusion region; a first interconnection line formed over the interlayer insulating film in contact with the first plug; and a second interconnection line formed over the interlayer insulating film in contact with the second plug, wherein the substrate further includes an additional active region isolated from the active region by the isolation region;

wherein the device further comprises:
a third transistor formed in the additional active region, the third transistor comprising a third pillar protruding from the additional active region and including an upper portion, a lower portion and an intermediate portion between the upper and lower portions, a fifth diffusion region formed in the upper portion, a sixth diffusion region formed in the lower portion, and a third gate electrode covering the intermediate portion with an intervention of a gate insulating film therebetween, and a fourth transistor formed in the additional active region, the fourth transistor comprising a fourth pillar protruding from the additional active region and including an upper portion, a lower portion and an intermediate portion between the upper and lower portions, a seventh diffusion region formed in the upper portion, an eighth diffusion region formed in the lower portion, and a fourth gate electrode covering the intermediate portion with an intervention of a gate insulating film therebetween, the eighth diffusion region being in contact with the sixth diffusion region, the fourth gate electrode being in contact with the third gate electrode;

wherein the interlayer insulating film extends to cover the third and fourth transistors; and wherein the device further comprises:
a third plug selectively formed in the interlayer insulating film in contact with the fifth diffusion region,
a fourth plug selectively formed in the interlayer insulating film in contact with the seventh diffusion region,
the second interconnection line formed over the interlayer insulating film in contact with the third plug, and
a third interconnection line formed over the interlayer insulating film in contact with the fourth plug.

6. The device as claimed in claim 5, wherein the first and second gate electrodes substantially fill a gap between the first and second pillars.

7. The device as claimed in claim 6, wherein the first gate electrode substantially completely surrounds the intermediate portion of the first pillar, and the second gate electrode substantially completely surrounds the intermediate portion of the second pillar.

8. The device as claimed in claim 5, further comprising a fifth pillar protruding from the active region, and a fifth gate electrode formed along at least a part of a side surface of the fifth pillar with an intervention of an insulating film therebetween, the fifth gate electrode being in contact with at least one of the first and second gate electrodes.

9. The device as claimed in claim 8, further comprising a fifth plug formed in the interlayer insulating film in contact with the fifth gate electrode.

10. The device as claimed in claim 9, wherein the fifth plug is embedded into the interlayer insulating film, and the device further comprises a conductive line embedded into the interlayer insulating film, the conductive line being elongated from the fifth pillar and isolated from each of the first and second interconnection lines by a part of the interlayer insulating film.

11. The device as claimed in claim 5, wherein the device further comprises a fourth interconnection line formed over the interlayer insulating film, a fifth plug selectively formed in the interlayer insulating film to form a conductive path between the first gate electrode and the fourth interconnection line, and a sixth plug selectively formed in the interlayer insulating film to form a conductive path between the third gate electrode and the fourth interconnection line.

12. The device as claimed in claim 5, wherein the first and second gate electrodes substantially fill a gap between the first and second pillars, and the third and fourth gate electrodes substantially fill a gap between the third and fourth pillars.

13. The device as claimed in claim 5, wherein each of the first, second, third and fourth electrodes substantially completely surrounds the intermediate portion of an associated one of the first, second, third and fourth pillars.

14. The device as claimed in claim 5, further comprising a fifth pillar protruding from the active region, a sixth pillar protruding from the additional active region, a fifth gate electrode formed along at least a part of a side surface of the fifth pillar with an intervention of an insulating film therebetween and in contact with at least one of the first and second gate electrodes, and a sixth gate electrode formed along at least a part of a side surface of the sixth pillar with an intervention of an insulating film therebetween and in contact with at least one of the third and fourth gate electrodes.

15. The device as claimed in claim 5, further comprising a fifth pillar protruding from the active region, a sixth pillar protruding from the additional active region, a fifth gate electrode formed along at least a part of a side surface of the fifth pillar with an intervention of an insulating film therebetween and in contact with at least one of the first and second gate electrodes, and a sixth gate electrode formed along at least a part of a side surface of the sixth pillar with an intervention of an insulating film therebetween and in contact with at least one of the third and fourth gate electrodes, a fifth plug being in contact with the fifth gate electrode, and a sixth plug being in contact with the sixth gate electrode.

16. The device as claimed in claim 5, wherein the isolation region comprises a trench selectively formed in the substrate and an insulating film filling the trench.

* * * * *